(12) United States Patent
Ota

(10) Patent No.: US 12,581,708 B2
(45) Date of Patent: Mar. 17, 2026

(54) SiC SEMICONDUCTOR DEVICE, AND MANUFACTURING METHOD THEREFOR

(71) Applicant: ROHM CO., LTD., Kyoto (JP)

(72) Inventor: Shingo Ota, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 926 days.

(21) Appl. No.: 17/424,100

(22) PCT Filed: Jun. 16, 2020

(86) PCT No.: PCT/JP2020/023529
§ 371 (c)(1),
(2) Date: Jul. 19, 2021

(87) PCT Pub. No.: WO2020/255944
PCT Pub. Date: Dec. 24, 2020

(65) Prior Publication Data
US 2022/0102502 A1 Mar. 31, 2022

(30) Foreign Application Priority Data

Jun. 17, 2019 (JP) ................................. 2019-112287

(51) Int. Cl.
*H01L 29/16* (2006.01)
*H01L 21/02* (2006.01)
(Continued)

(52) U.S. Cl.
CPC ... *H10D 62/8325* (2025.01); *H01L 21/02008* (2013.01); *H01L 21/6836* (2013.01);
(Continued)

(58) Field of Classification Search
CPC ........... H01L 29/1608; H01L 21/02008; H01L 21/6836; H01L 29/045; H01L 29/66053;
(Continued)

(56) References Cited

U.S. PATENT DOCUMENTS 5,869,386 A 2/1999 Hamajima et al.
6,555,925 B1 4/2003 Higashi et al.
(Continued)

FOREIGN PATENT DOCUMENTS

CN 105702626 A * 6/2016 ........... H01L 21/268
JP S5290275 7/1977
(Continued)

OTHER PUBLICATIONS

Chinese Office Action issued Nov. 9, 2023, in corresponding Chinese patent application No. 202080028353.6, 9 pages.
(Continued)

*Primary Examiner* — Ermias T Woldegeorgis
(74) *Attorney, Agent, or Firm* — XSENSUS LLP

(57) ABSTRACT

A method for manufacturing an SiC semiconductor device includes a step of setting, on a main surface of an SiC wafer, a scheduled cutting line that demarcates a plurality of chip regions including a first chip region in which a functional device is formed and a second chip region in which a monitor pattern for performing process control of the first chip region is formed, a step of forming, on the main surface, a plurality of main surface electrodes respectively covering the chip regions such as to expose the scheduled cutting line and respectively forming a portion of the functional device and a portion of the monitor pattern, a step of irradiating laser light to the scheduled cutting line and forming a modified region, and a step of cleaving the SiC wafer with the modified region as a starting point.

24 Claims, 44 Drawing Sheets

(51) Int. Cl.

| | |
|---|---|
| *H01L 21/683* | (2006.01) |
| *H10D 48/01* | (2025.01) |
| *H10D 62/40* | (2025.01) |
| *H10D 62/832* | (2025.01) |

(52) U.S. Cl.
CPC .......... *H10D 48/01* (2025.01); *H10D 62/405* (2025.01); *H01L 2223/54426* (2013.01)

(58) Field of Classification Search
CPC .......... H01L 2223/54426; H01L 22/30; H01L 2221/68327; H01L 23/544; H01L 29/0696; H01L 29/1095; H01L 29/0878; H01L 29/7397; H01L 21/78; H01L 22/34; H01L 29/0619; H01L 29/402; H01L 29/7813; H01L 29/872; H01L 29/41766; H01L 29/42368; H01L 29/6606; H01L 21/0475; H01L 21/268; H01L 21/3043; B23K 2101/42; B23K 2103/172; B23K 2103/56; B23K 26/0622; B23K 26/0006; B23K 26/53; B23K 26/50; B23K 26/70; H10D 62/8325; H10D 48/01; H10D 62/405; H10D 12/481; H10D 8/051; H10D 8/60; H10D 30/668; H10D 62/106; H10D 62/127; H10D 62/393; H10D 64/111; H10D 64/256; H10D 62/157; H10D 64/516
See application file for complete search history.

(56) References Cited

U.S. PATENT DOCUMENTS

| | | | |
|---|---|---|---|
| 2009/0121337 A1 | 5/2009 | Abe et al. | |
| 2011/0124180 A1* | 5/2011 | Abe .................. | H01L 21/67092<br>257/E21.599 |
| 2013/0221439 A1* | 8/2013 | Shimizu .............. | B81C 1/00603<br>438/479 |
| 2014/0131876 A1* | 5/2014 | Hua .................. | H01L 21/76898<br>257/762 |
| 2020/0058742 A1 | 2/2020 | Nakata | |

FOREIGN PATENT DOCUMENTS

| | | | | | |
|---|---|---|---|---|---|
| JP | S59150442 | | 8/1984 | | |
| JP | H09153603 | | 6/1997 | | |
| JP | 2000252236 | | 9/2000 | | |
| JP | 2000252236 A | * | 9/2000 | ........... | H01L 23/544 |
| JP | 2005322847 A | | 11/2005 | | |
| JP | 2006318966 A | | 11/2006 | | |
| JP | 2010192817 A | | 9/2010 | | |
| JP | 2011023503 | | 2/2011 | | |
| JP | 2011222607 | | 11/2011 | | |
| JP | 2011222607 A | * | 11/2011 | | |
| JP | 2012146876 | | 8/2012 | | |
| JP | 2012146892 A | | 8/2012 | | |
| JP | 2013000748 A | | 1/2013 | | |
| JP | 2013157343 A | | 8/2013 | | |
| JP | 2013172124 | | 9/2013 | | |
| JP | 2013172124 A | * | 9/2013 | ......... | B81C 1/00603 |
| JP | 2015106693 | | 6/2015 | | |
| JP | 2015106693 A | * | 6/2015 | | |
| JP | 2016134427 | | 7/2016 | | |
| WO | 2007055010 | | 5/2007 | | |
| WO | WO-2012096092 A1 | * | 7/2012 | ......... | B23K 26/0057 |
| WO | 2018190271 | | 10/2018 | | |

OTHER PUBLICATIONS

International Preliminary Report on Patentability issued for International Patent Application No. PCT/JP2020/023529, Date of mailing: Dec. 30, 2021, 15 pages including English translation.

Notice of Reasons for Refusal issued in corresponding Japanese Patent Application No. 2021-528248, Nov. 10, 2022, 3 pages w/translation.

Japanese Office Action issued Apr. 11, 2024 in corresponding Japanese Patent Application No. 2023-018942, 3 pages.

Office Action issued on Jun. 8, 2023, in corresponding Chinese patent Application No. 202080028353.6, 16 pages.

International Search Report and Written Opinion issued for International Patent Application No. PCT/JP2020/023529, Date of mailing: Aug. 18, 2020, 13 pages including English translation of Search Report.

Notice of Reasons for Refusal issued for Japanese Patent Application No. 2021-528248, Dispatch Date: May 12, 2022, 10 pages including English translation.

Notice of Reasons for Refusal issued for Japanese Patent Application No. 2021-528248, Dispatch Date: Sep. 29, 2022, 9 pages including English translation.

Office Action issued for German Patent Application No. 11 2020 000 275.6, dated Feb. 25, 2023, 12 pages including informal English translation.

Office Action dated Sep. 17, 2025 in corresponding German Patent Application No. 112020007911.2 (6 pages; with English translation).

Notice of Reasons for Refusal dated Oct. 2, 2025 in corresponding Japanese Patent Application No. 2024-108028 (7 pages; with English machine translation).

* cited by examiner

X (m axis direction)

Y (a axis direction)

Z

98

X (m axis direction)

Y (a axis direction)

Z (a axis direction)

SiC SEMICONDUCTOR DEVICE, AND MANUFACTURING METHOD THEREFOR

TECHNICAL FIELD

The present invention relates to an SiC semiconductor device and a method for manufacturing the same.

BACKGROUND ART

A method for manufacturing an SiC semiconductor device using a laser irradiation cleaving method has come to be noted in recent years. With the laser irradiation cleaving method, laser light is irradiated to an SiC wafer and the SiC wafer is cleaved along the portion irradiated by the laser light thereafter. With this method, the SiC wafer can be cut easily and therefore, manufacturing time can be shortened.

On the other hand, with a method for manufacturing an SiC semiconductor device, a monitor pattern called a PCM (process control monitor) is formed in an arbitrary region of an SiC wafer. By the monitor pattern, a suitability of each step performed on the SiC wafer can be evaluated indirectly based on physical characteristics and electrical characteristics of the monitor pattern. The physical characteristics are, for example, dimensions of a structure formed in the monitor pattern. The electrical characteristics are, for example, a resistance value and a capacitance value of a semiconductor region, etc., formed in the monitor pattern.

Patent Literature 1 discloses a method for manufacturing an SiC semiconductor device using an SiC wafer including accessory patterns (monitor patterns) that are concentratedly arranged at positions overlapping laser irradiation regions (scheduled cutting lines).

CITATION LIST

Patent Literature

Patent Literature 1: Japanese Patent Application Publication No. 2016-134427

SUMMARY OF INVENTION

Technical Problem

With the SiC wafer according to Patent Literature 1, laser light is blocked by the monitor patterns and thus, unmodified portions in which modified regions are not present are formed in regions hidden by the monitor patterns. In a step of cleaving the SiC wafer, a force that maintains anatomic arrangement (a crystal structure of SiC) acts at the unmodified portions directly below the monitor patterns. Consequently, meanderings with the monitor patterns as starting points are formed in cleaved portions of the SiC wafer.

A preferred embodiment of the present invention provides a method for manufacturing an SiC semiconductor device with which shape defects due to a monitor pattern can be suppressed. A preferred embodiment of the present invention provides an SiC semiconductor device having a structure with which shape defects due to an accessory pattern are suppressed.

Solution to Problem

A preferred embodiment of the present invention provides a method for manufacturing an SiC semiconductor device including a step of preparing an SiC wafer having a main surface and constituted of an SiC monocrystal, a step of setting, on the main surface, a scheduled cutting line that demarcates a plurality of chip regions including a first chip region in which a functional device is formed and a second chip region in which a monitor pattern for performing process control of the first chip region is formed, a step of forming, on the main surface, a plurality of main surface electrodes respectively covering the chip regions such as to expose the scheduled cutting line and respectively forming a portion of the functional device and a portion of the monitor pattern, a step of irradiating laser light to the scheduled cutting line exposed from the main surface electrodes and forming a modified region that is modified to be of a property differing from the SiC monocrystal, and a step of cleaving the SiC wafer with the modified region as a starting point.

According to this method for manufacturing the SiC semiconductor device, shape defects due to the monitor pattern can be suppressed. Also, according to this method for manufacturing the SiC semiconductor device, an SiC semiconductor device having a structure with which shape defects due to the monitor pattern are suppressed can be manufactured and provided.

A preferred embodiment of the present invention provides an SiC semiconductor device including an SiC chip having a first main surface and a second main surface respectively formed in quadrilateral shapes in plan view and four side surfaces respectively connecting the first main surface and the second main surface and respectively constituted of cleavage surfaces, a modified region formed in the respective side surfaces and modified to be of a property differing from an SiC monocrystal, an alignment pattern as an accessory pattern formed in a peripheral edge portion of the first main surface at intervals inward from the respective side surfaces in plan view, a main surface electrode formed on the first main surface at intervals inward from the respective side surfaces and exposing the alignment pattern in plan view, and an insulating layer formed on the first main surface at intervals inward from the respective side surfaces, partially covering the main surface electrode, and demarcating a dicing street that, with the side surfaces, exposes the alignment pattern in plan view, and where an accessory pattern other than the alignment pattern is not formed in the peripheral edge portion of the first main surface positioned within the dicing street in plan view.

According to this structure, the SiC semiconductor device having a structure with which shape defects due to the accessory pattern are suppressed can be provided.

The aforementioned as well as yet other objects, features, and effects of the present invention will be made clear by the following description of the preferred embodiments with reference to the accompanying drawings.

DESCRIPTION OF EMBODIMENTS

Figure 1:
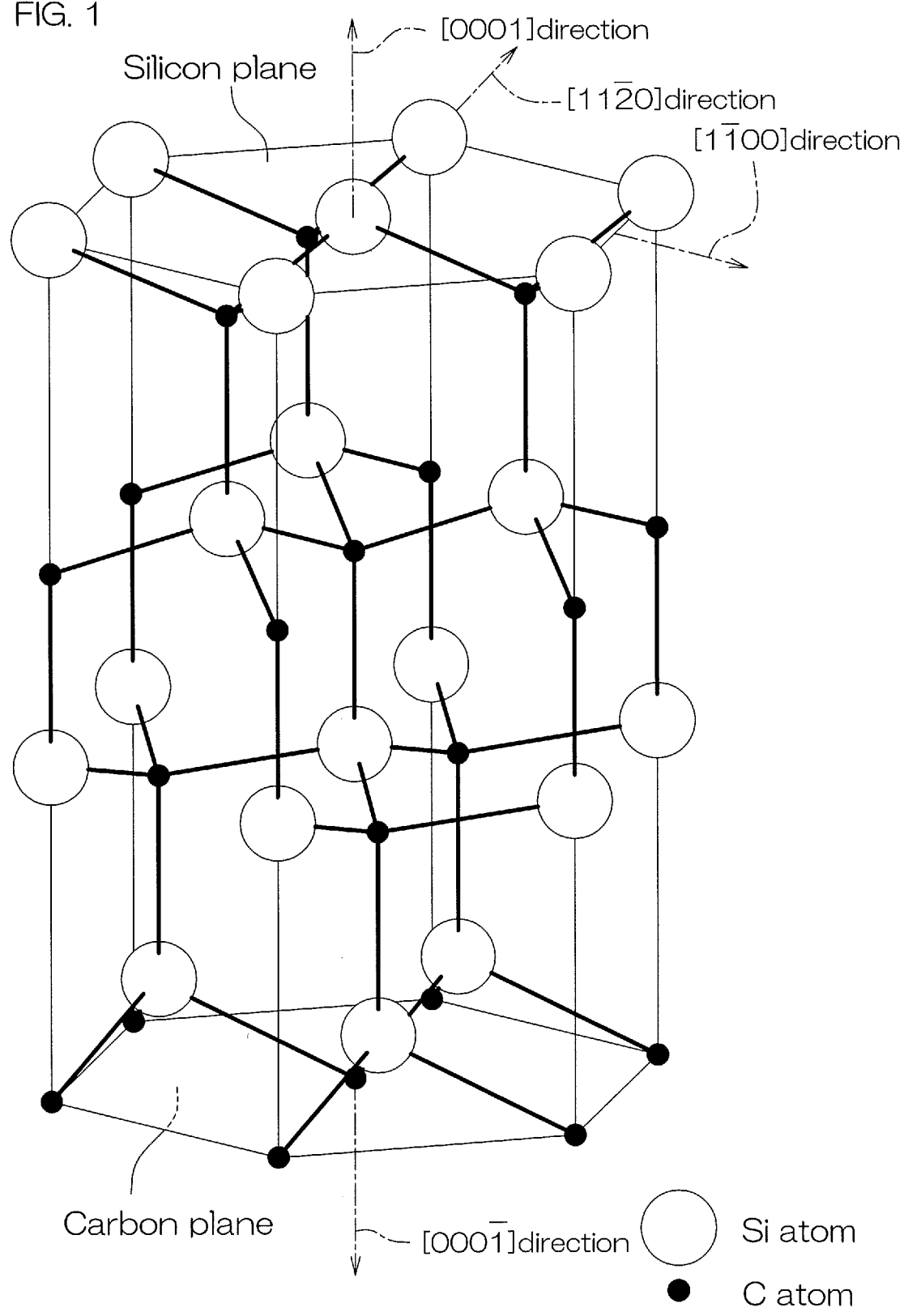
FIG. 1 is a diagram of a unit cell of a 4H-SiC monocrystal.
Figure 2:
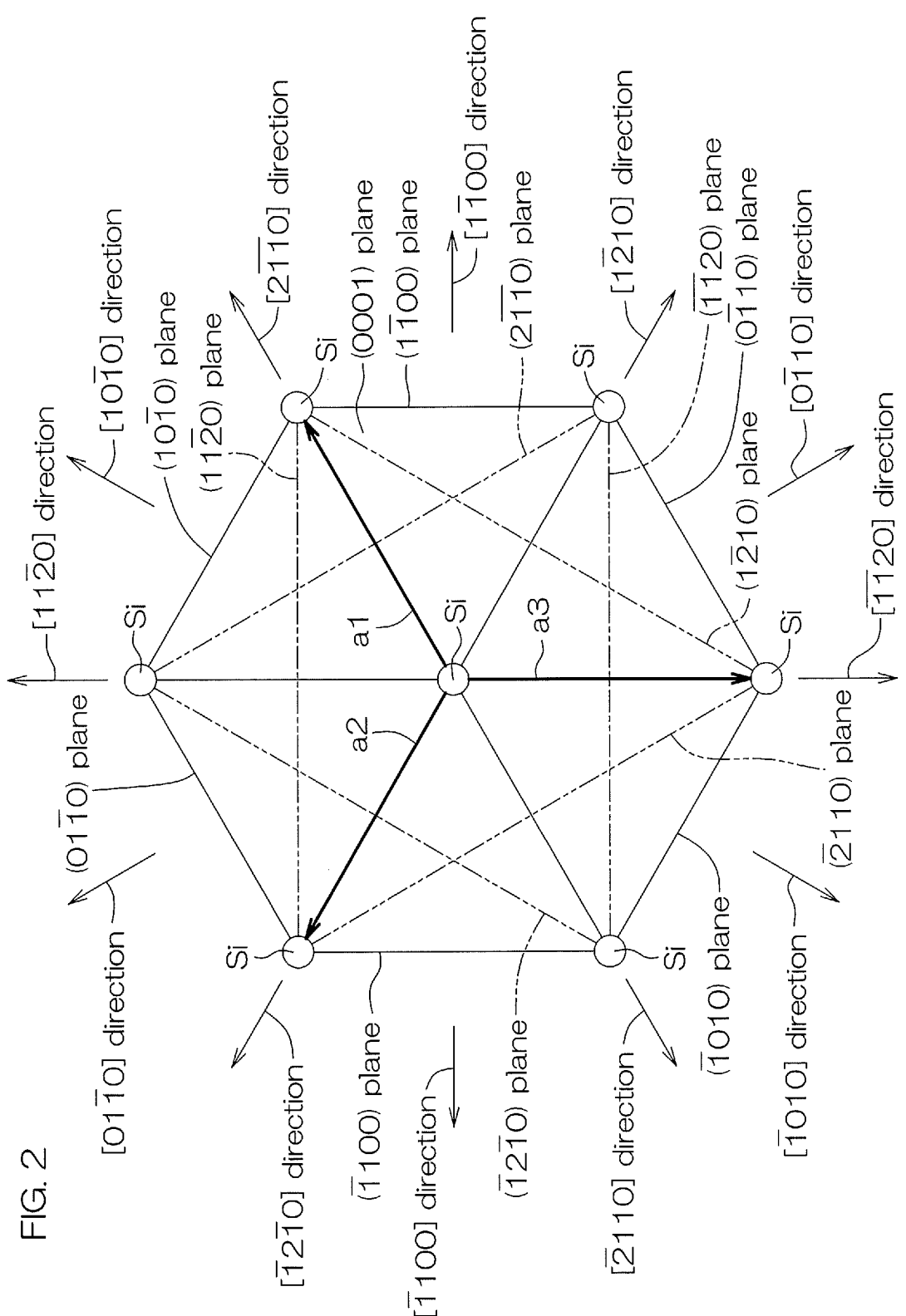
FIG. 2 is a plan view of a silicon plane of the unit cell shown in FIG. 1.

FIG. 1 is a diagram of a unit cell of a 4H-SiC monocrystal (hereinafter referred to simply as the "unit cell"). FIG. 2 is a plan view of a silicon plane of the unit cell shown in FIG. 1.

With the preferred embodiments of the present invention, examples in which a 4H-SiC monocrystal is applied as an example of an SiC monocrystal constituted of a hexagonal crystal shall be described. The SiC monocrystal constituted of the hexagonal crystal has a plurality of polytypes including a 2H (hexagonal)-SiC monocrystal, the 4H-SiC monocrystal, and a 6H-SiC monocrystal in accordance with cycle of atomic arrangement. The preferred embodiments of the present invention are not intended to exclude polytypes other than the 4H-SiC monocrystal.

Referring to FIG. 1 and FIG. 2, the unit cell includes tetrahedral structures in each of which four C-atoms are bonded to a single Si-atom in a relationship of a tetrahedral arrangement. The unit cell has an atomic arrangement in which the tetrahedral structures are stacked in a four-period. The unit cell has a hexagonal prism structure having a hexagonal silicon plane, a hexagonal carbon plane, and six side planes connecting the silicon plane and the carbon plane.

The silicon plane is an end plane terminated by Si-atoms. At the silicon plane, a single Si-atom is positioned at each of the six vertices of a hexagon and a single Si-atom is positioned at a center of the hexagon. The carbon plane is an end plane terminated by C-atoms. At the carbon plane, a single C-atom is positioned at each of the six vertices of a hexagon and a single C-atom is positioned at a center of the hexagon.

The crystal planes of the unit cell are defined by four coordinate axes (a1, a2, a3, and c) including an a1-axis, an a2-axis, an a3-axis, and a c-axis. Of the four coordinate axes, a value of a3 takes on a value of $-(a1+a2)$. The structure of the 4H-SiC monocrystal shall be described below based on the silicon plane.

In a plan view of viewing the silicon plane from the c-axis, the a1-axis, the a2-axis, and the a3-axis are respectively set along directions of arrangement of the nearest neighboring Si-atoms (hereinafter referred to simply as the "nearest neighbor directions") based on the Si-atoms positioned at the center. The a1-axis, the a2-axis, and the a3-axis are set to be shifted by 120° each in conformance to the arrangement of the Si-atoms.

The c-axis is set in a normal direction to the silicon plane based on the Si-atoms positioned at the center. The silicon plane is a (0001) plane. The carbon plane is a (000-1) plane. The side planes of the hexagonal prism include six crystal planes oriented along the nearest neighbor directions in the plan view of viewing the silicon plane from the c-axis. Specifically, the side planes of the hexagonal prism include the six crystal planes each having a plurality of nearest neighboring Si-atoms.

In the plan view of viewing the silicon plane from the c-axis, the side planes of the unit cell include a (1-100) plane, a (0-110) plane, a (−1010) plane, a (−1100) plane, a (01-10) plane, and a (10-10) plane in clockwise order from a tip of the a1-axis.

Diagonal planes of the unit cell not passing through the center include six crystal planes oriented along intersecting directions intersecting the nearest neighbor directions in the plan view of viewing the silicon plane from the c-axis. When viewed on a basis of the Si-atoms positioned at the center, the nearest neighbor direction intersecting directions are orthogonal directions to the nearest neighbor directions. Specifically, the diagonal planes of the hexagonal prism not passing through the center include the six crystal planes each having a plurality of Si-atoms that are not nearest neighbors.

In the plan view of viewing the silicon plane from the c-axis, the diagonal planes of the unit cell not passing through the center include a (11-20) plane, a (1-210) plane, a (−2110) plane, a (−1-120) plane, a (−12-10) plane, and a (2-1-10) plane.

The crystal directions of the unit cell are defined by directions normal to the crystal planes. A normal direction to the (1-100) plane is a [1-100] direction. A normal direction to the (0-110) plane is a [0-110] direction. A normal direction to the (−1010) plane is a [−1010] direction. A normal direction to the (−1100) plane is a [−1100] direction. A normal direction to the (01-10) plane is a [01-10] direction. A normal direction to the (10-10) plane is a [10-10] direction. A normal direction to the (11-20) plane is a [11-20] direction. A normal direction to the (1-210) plane is a [1-210] direction. A normal direction to the (−2110) plane is a [−2110] direction. A normal direction to the (−1-120) plane is a [−1-120] direction. A normal direction to the (−12-10) plane is a [−12-10] direction. A normal direction to the (2-1-10) plane is a [2-1-10] direction.

The hexagonal crystal is six-fold symmetrical and has equivalent crystal planes and equivalent crystal directions every 60°. For example, the (1-100) plane, the (0-110) plane, the (−1010) plane, the (−1100) plane, the (01-10) plane, and the (10-10) plane form equivalent crystal planes. Also, the (11-20) plane, the (1-210) plane, the (−2110) plane, the (−1-120) plane, the (−12-10) plane, and the (2-1-10) plane form equivalent crystal planes.

Also, the [1-100] direction, the [0-110] direction, the [−1010] direction, the [−1100] direction, the [01-10] direction, and the [10-10] direction form equivalent crystal directions. Also, the [11-20] direction, the [1-210] direction, the [−2110] direction, the [−1-120] direction, the [−12-10] direction, and the [2-1-10] direction form equivalent crystal directions.

The [0001] direction and the [000-1] direction are referred to as the c-axis. The (0001) plane and the (000-1) plane are referred to as c-planes. The [11-20] direction and the [−1-120] direction are referred to as an a-axis. The (11-20) plane and the (−1-120) plane are referred to as a-planes. The [1-100] direction and the [−1100] direction are referred to as an m-axis. The (1-100) plane and the (−1100) plane are referred to as m-planes.

Figure 3:
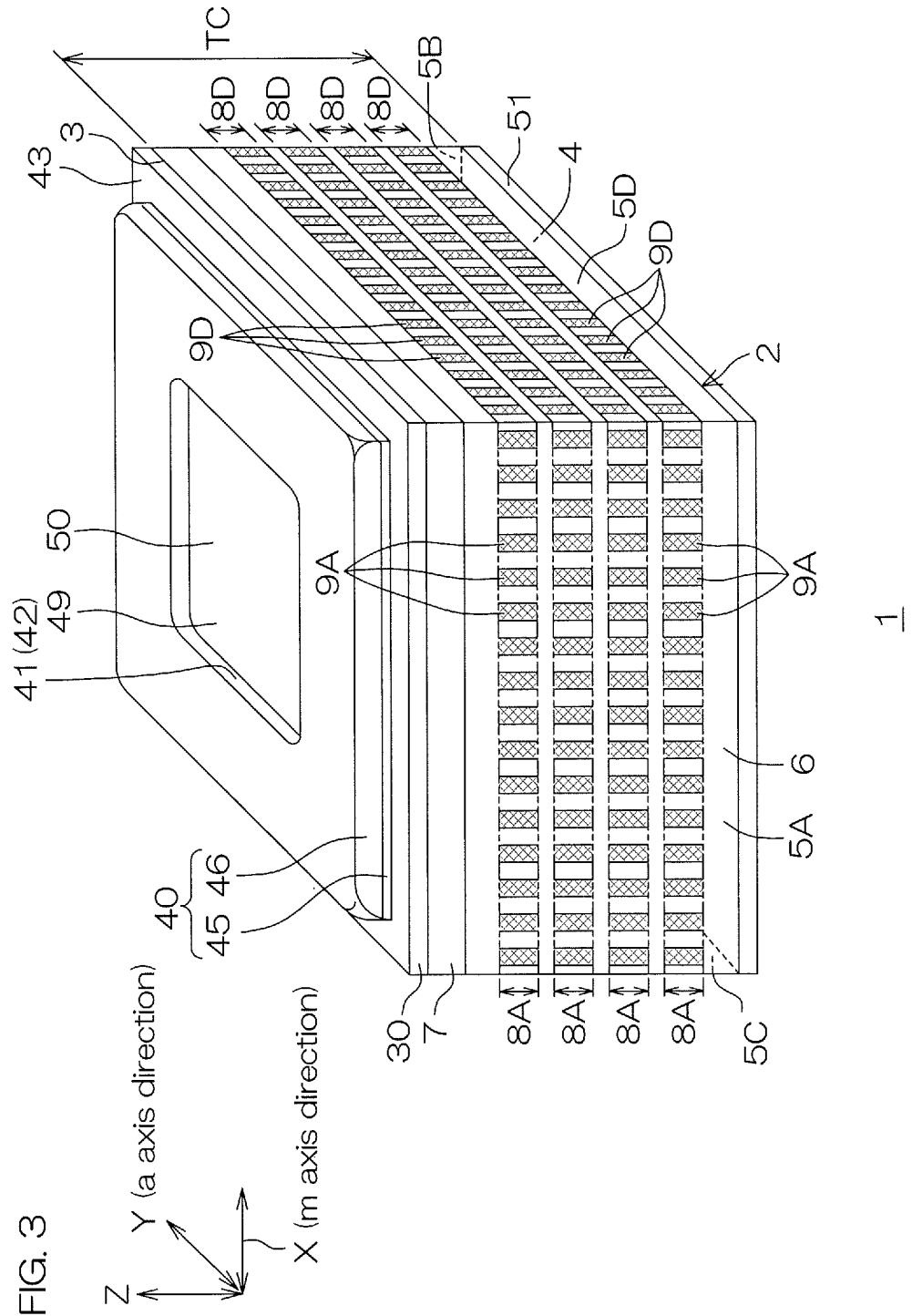
FIG. 3 is a perspective view of an SiC semiconductor device according to a first preferred embodiment of the present invention.
Figure 4:
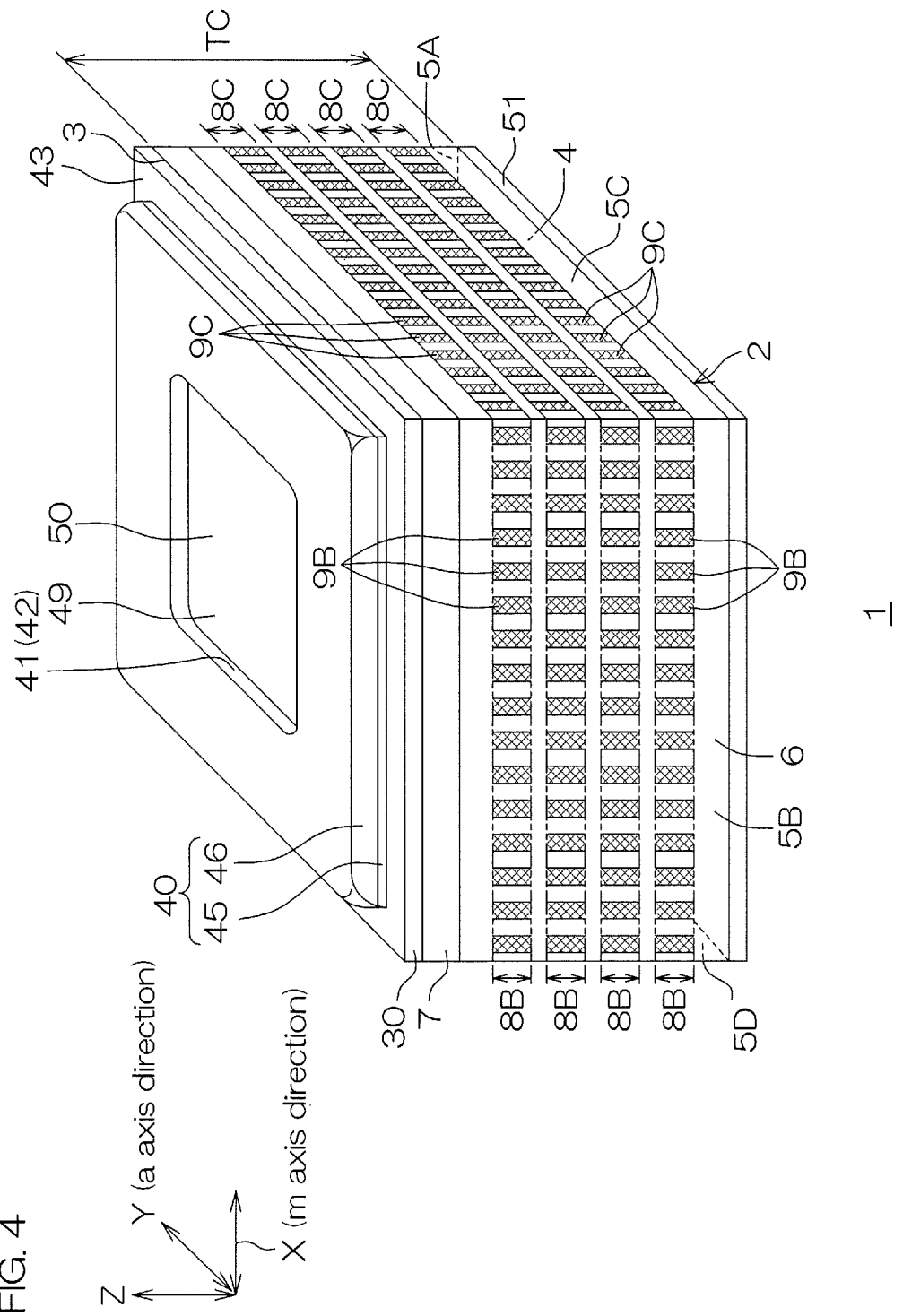
FIG. 4 is a perspective view as viewed from another direction of the SiC semiconductor device shown in FIG. 3.
Figure 5:
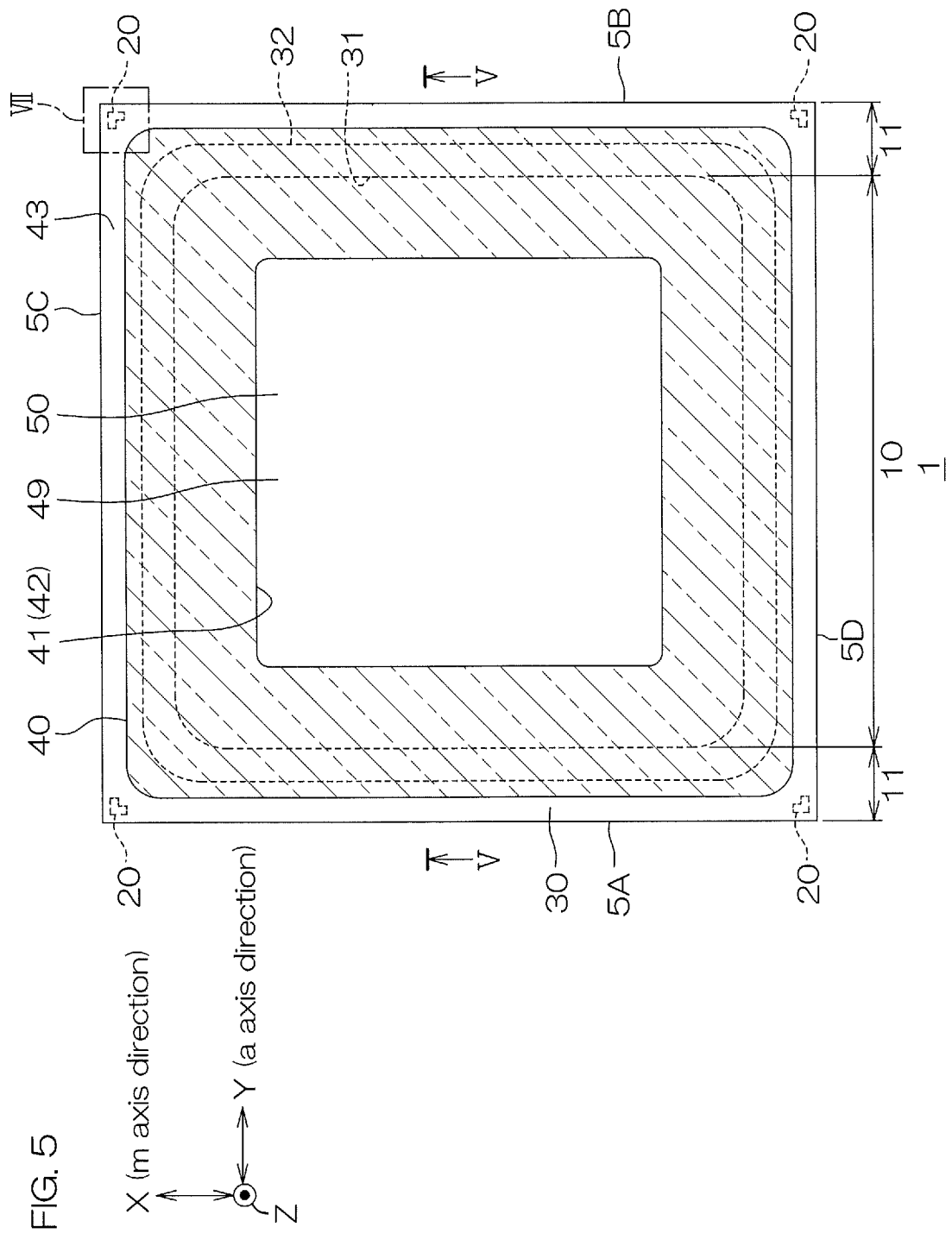
FIG. 5 is a plan view of the SiC semiconductor device shown in FIG. 3.
Figure 6:
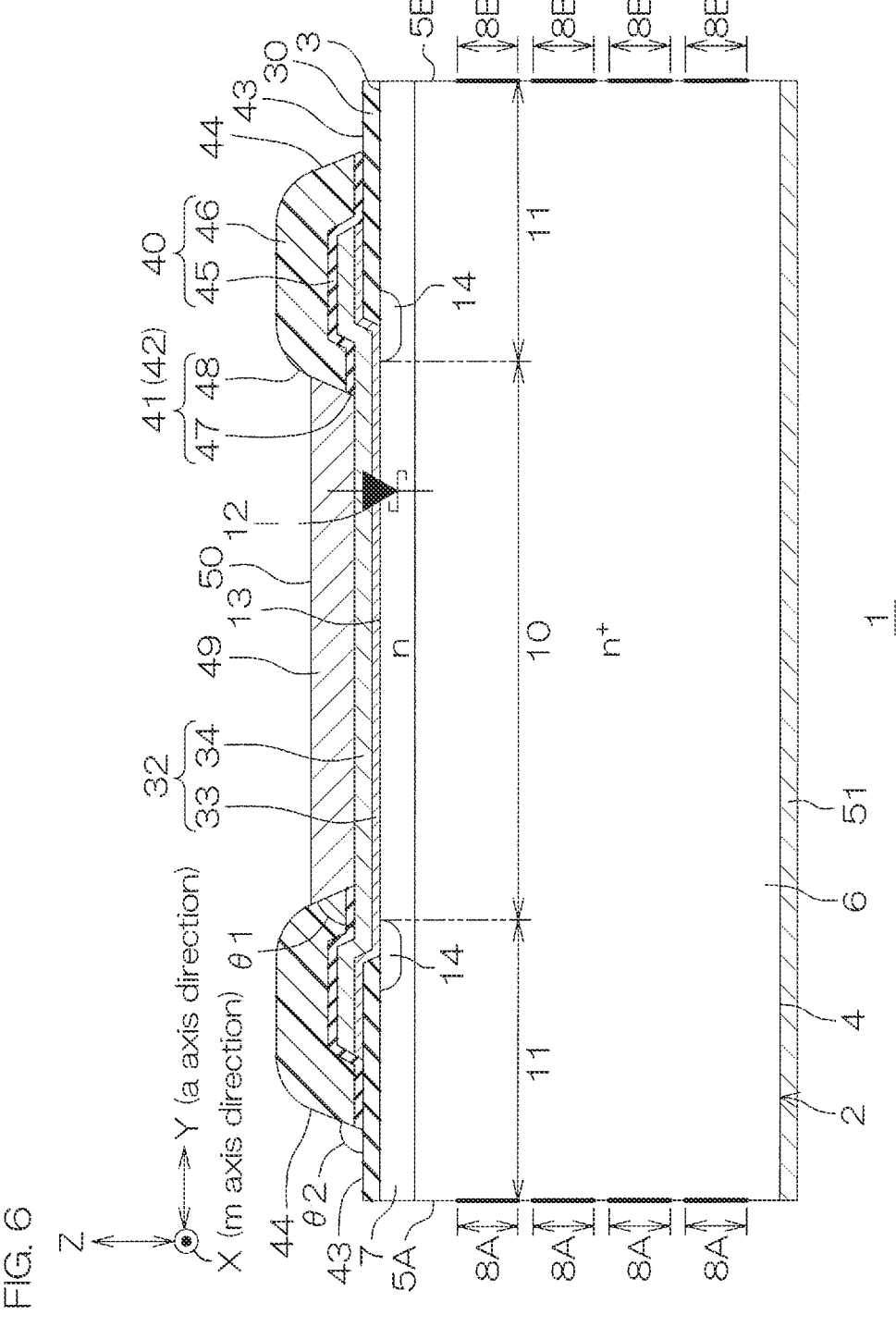
FIG. 6 is a sectional view taken along line VI-VI shown in FIG. 3.
Figure 7:
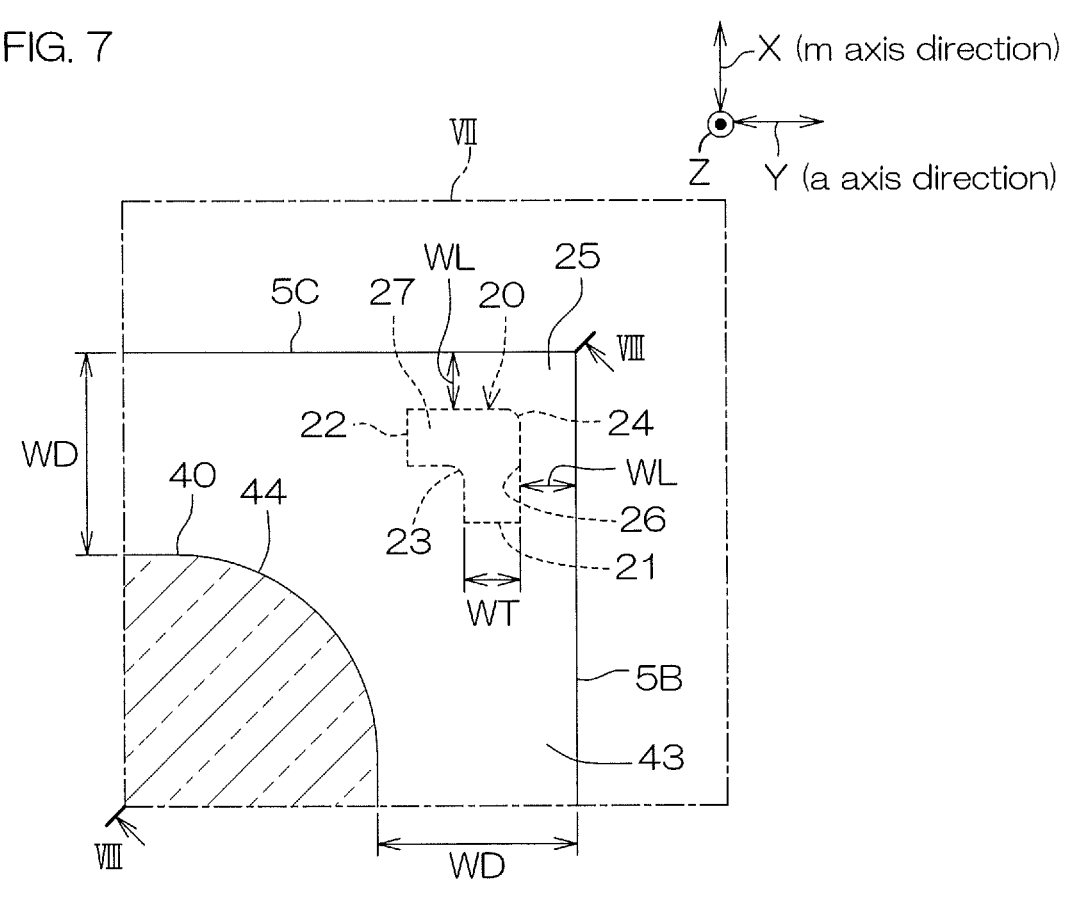
FIG. 7 is an enlarged view of a region VII shown in FIG. 3.
Figure 8:
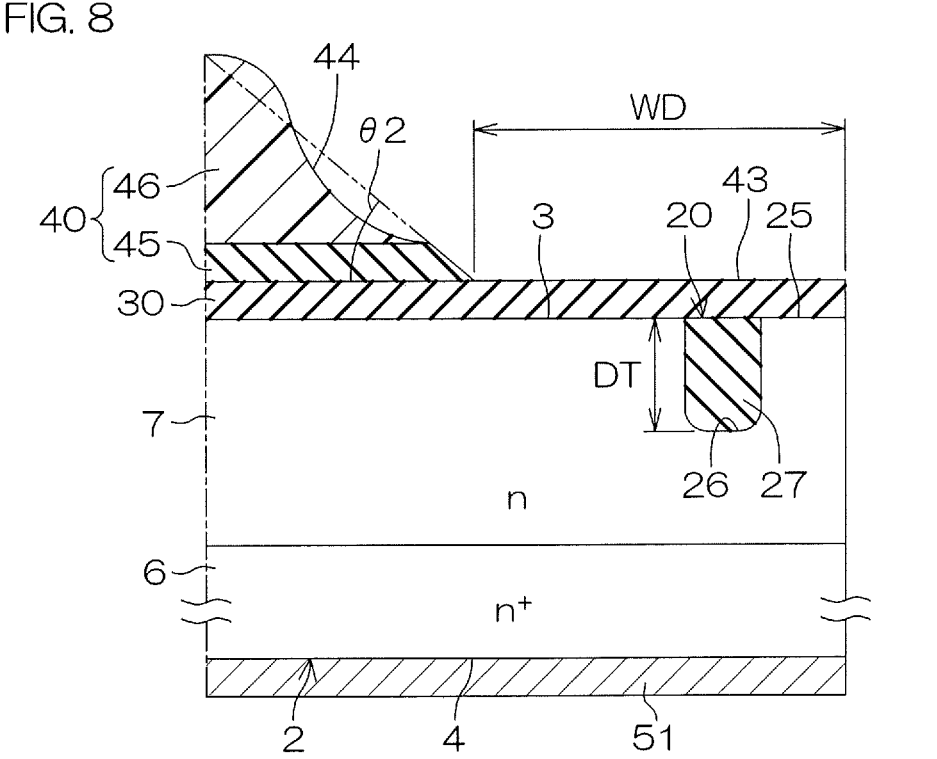
FIG. 8 is a sectional view taken along line VIII-VIII shown in FIG. 7.

FIG. 3 is a perspective view of an SiC semiconductor device 1 according to a first preferred embodiment of the present invention. FIG. 4 is a perspective view as viewed from another direction of the SiC semiconductor device 1 shown in FIG. 3. FIG. 5 is a plan view of the SiC semiconductor device 1 shown in FIG. 3. FIG. 6 is a sectional view taken along line VI-VI shown in FIG. 3. FIG. 7 is an enlarged view of a region VII shown in FIG. 3. FIG. 8 is a sectional view taken along line VIII-VIII shown in FIG. 7.

Referring to FIG. 3 to FIG. 8, the SiC semiconductor device 1 includes an SiC chip 2 constituted of the 4H-SiC monocrystal. The SiC chip 2 is formed in a rectangular parallelepiped shape. The SiC chip 2 may have a thickness TC of not less than 40 μm and not more than 300 μm. The thickness TC may be not less than 40 μm and not more than 100 μm, not less than 100 μm and not more than 150 μm, not less than 150 μm and not more than 200 μm, not less than 200 μm and not more than 250 μm, or not less than 250 μm and not more than 300 μm. The thickness TC is preferably not less than 60 μm and not more than 150 μm.

The SiC chip 2 has a first main surface 3 at one side, a second main surface 4 at another side, and four side surfaces 5A, 5B, 5C, and 5D connecting the first main surface 3 and the second main surface 4. The side surfaces 5A to 5D include a first side surface 5A, a second side surface 5B, a third side surface 5C, and a fourth side surface 5D. The first main surface 3 and the second main surface 4 are respectively formed in quadrilateral shapes in a plan view as viewed in a normal direction Z to the surfaces (hereinafter referred to simply as "plan view"). The first main surface 3 and the second main surface 4 may be formed in rectangular shapes in plan view.

The first main surface 3 and the second main surface 4 face c-planes of the SiC monocrystal. The first main surface 3 faces the silicon plane of the SiC monocrystal. The second main surface 4 faces the carbon plane of the SiC monocrystal. The first main surface 3 and the second main surface 4 may have an off angle inclined at a predetermined angle in an off direction with respect to the c-planes. The off direction is preferably the a-axis direction of the SiC monocrystal. If there is an off angle, the c-axis of the SiC monocrystal is inclined by just the off angle with respect to the normal direction Z. The off angle may exceed 0° and be not more than 10°.

The off angle may be not less than 0° and not more than 6°. The off angle may be not less than 0° and not more than 2°, not less than 2° and not more than 4°, or not less than 4° and not more than 6°. The off angle preferably exceeds 0° and is not more than 4.5°. The off angle may be not less than 3° and not more than 4.5°. In this case, the off angle is preferably not less than 3° and not more than 3.5° or not less than 3.5° and not more than 4°. The off angle may be not less than 1.5° and not more than 3°. In this case, the off angle is preferably not less than 1.5° and not more than 2° or not less than 2° and not more than 2.5°.

The second main surface 4 may be constituted of a rough surface having one of either or both of grinding marks and annealing marks (specifically, laser irradiation marks). The annealing marks may contain amorphized SiC and/or SiC (specifically, Si) silicided (alloyed) with a metal. The second main surface 4 is preferably constituted of an ohmic surface having at least annealing marks.

The side surfaces 5A to 5D are each constituted of a cleavage surface. The first side surface 5A and the second side surface 5B extend in a first direction X and oppose each other in a second direction Y intersecting the first direction X. The third side surface 5C and the fourth side surface 5D extend in the second direction Y and oppose each other in the first direction X. Specifically, the second direction Y is orthogonal to the first direction X. The first direction X is the m-axis direction. The second direction Y is the a-axis direction. Therefore, the first side surface 5A and the second side surface 5B are formed by the a-planes of the SiC monocrystal. Also, the third side surface 5C and the fourth side surface 5D are formed by the m-planes of the SiC monocrystal.

The first side surface 5A and the second side surface 5B may form inclined surfaces that, on basis of the normal direction Z, are inclined toward the c-axis direction of the SiC monocrystal with respect to the normal direction Z. The first side surface 5A and the second side surface 5B may be inclined at an angle in accordance with the off angle with respect to the normal direction Z when the normal direction Z is set to 0°. The angle in accordance with the off angle may be equal to the off angle or may be an angle that exceeds 0° and is less than the off angle. On the other hand, the third side surface 5C and the fourth side surface 5D extend as planes in the second direction Y (a-axis direction) and the normal direction Z. Specifically, the third side surface 5C and the fourth side surface 5D are formed substantially perpendicular to the first main surface 3 and the second main surface 4.

A length of each of the side surfaces 5A to 5D may be not less than 0.1 mm and not more than 15 mm. The length of each of the side surfaces 5A to 5D may be not less than 0.1 mm and not more than 1 mm, not less than 1 mm and not more than 5 mm, not less than 5 mm and not more than 10 mm, or not less than 10 mm and not more than 15 mm. A maximum meandering width (absolute value) of each of the side surfaces 5A to 5D is not more than 10 μm. Specifically, the maximum meandering width of each of the side surfaces 5A to 5D is not more than 5 μm. The maximum meandering width of each of the side surfaces 5A to 5D is defined as a distance in a normal direction to each of the side surfaces 5A to 5D between a location that is most raised toward an outer side of the SiC chip 2 and a location that is most depressed toward an inner side of the SiC chip 2 in plan view.

In this embodiment, the SiC chip 2 has a laminated structure including an $n^+$-type SiC substrate 6 and an n-type SiC epitaxial layer 7 that are laminated in that order from the second main surface 4 side to the first main surface 3 side. The SiC substrate 6 forms the second main surface 4 and portions of the side surfaces 5A to 5D. The SiC epitaxial layer 7 forms the first main surface 3 and portions of the side surfaces 5A to 5D.

An n-type impurity concentration of the SiC substrate 6 may be not less than $1.0 \times 10^{18}$ cm$^{-3}$ and not more than $1.0 \times 10^{21}$ cm$^{-3}$. The SiC substrate 6 may have a thickness of not less than 40 μm and not more than 250 μm. The thickness of the SiC substrate 6 may be not less than 40 μm and not more than 100 μm, not less than 100 μm and not more than 150 μm, not less than 150 μm and not more than 200 μm, or not less than 200 μm and not more than 250 μm. The thickness of the SiC substrate 6 is preferably not less than 40 μm and not more than 150 μm. By thinning the SiC substrate 6, a resistance value of the SiC substrate 6 can be reduced.

The SiC epitaxial layer 7 has an n-type impurity concentration less than the n-type impurity concentration of the SiC substrate 6. The n-type impurity concentration of the SiC epitaxial layer 7 may be not less than $1.0 \times 10^{15}$ cm$^{-3}$ and not more than $1.0 \times 10^{18}$ cm$^{-3}$. The SiC epitaxial layer 7 may have a thickness less than the thickness of the SiC substrate 6. The thickness of the SiC epitaxial layer 7 may be not less than 1 μm and not more than 50 μm. The thickness of the SiC epitaxial layer 7 may be not less than 1 μm and not more than 5 μm, not less than 5 μm and not more than 10 μm, not less than 10 μm and not more than 15 μm, not less than 15 μm and not more than 20 μm, not less than 20 μm and not more than 30 μm, not less than 30 μm and not more than 40 μm, or not less than 40 μm and not more than 50 μm. The thickness of the SiC epitaxial layer 7 is preferably not less than 5 μm and not more than 15 μm.

Referring to FIG. 3 and FIG. 4, the SiC semiconductor device 1 includes a pluralities of modified regions 8A, 8B, 8C, and 8D respectively formed at the side surfaces 5A to 5D. The pluralities of modified regions 8A to 8D include first modified regions 8A, second modified regions 8B, third modified regions 8C, and fourth modified regions 8D.

The modified regions 8A to 8D are regions with which portions of the SiC monocrystal forming the side surfaces 5A to 5D are modified to be of a property differing from the SiC monocrystal. The modified regions 8A to 8D are the regions that are modified to be of the property differing in density, refractive index, mechanical strength (crystal strength), or other physical characteristic from the SiC monocrystal.

The modified regions 8A to 8D may include at least one layer among a melted-and-rehardened layer, a defect layer, a dielectric breakdown layer, and a refractive index change layer. The melted-and-rehardened layer is a layer with which a portion of the SiC monocrystal is melted and thereafter hardened again. The defect layer is a layer that includes a hole, fissure, etc., formed in the SiC monocrystal. The dielectric breakdown layer is a layer with which a portion of the SiC monocrystal has undergone dielectric breakdown. The refractive index change layer is a layer with which a portion of the SiC monocrystal is changed to a refractive index differing from the SiC monocrystal.

The pluralities of modified regions 8A to 8D are formed at intervals from the first main surface 3 to the second main surface 4 side at the side surfaces 5A to 5D, respectively. The pluralities of modified regions 8A to 8D are formed at intervals from the second main surface 4 to the first main surface 3 side at the side surfaces 5A to 5D, respectively. The pluralities of modified regions 8A to 8D are preferably formed in the SiC substrate 6. The pluralities of modified regions 8A to 8D are even more preferably formed in the SiC substrate 6 at intervals toward the second main surface 4 side from the SiC epitaxial layer 7. Variations in physical properties and electrical properties of the SiC epitaxial layer 7 due to the pluralities of modified regions 8A to 8D can thereby be suppressed. That is, a functional device can be formed appropriately in the SiC epitaxial layer 7.

In this embodiment, the first to fourth modified regions 8A to 8D are each formed in a plurality of levels (four levels in this embodiment) at the side surfaces 5A to 5D. The number of levels of the first to fourth modified regions 8A to 8D is the number of first to fourth modified regions 8A to 8D present in the normal direction Z at the side surfaces 5A to 5D.

The number of levels of the first to fourth modified regions 8A to 8D is adjusted in accordance with the thickness TC of the SiC chip 2. In particular, with the SiC chip 2 having the thickness TC of not more than 150 μm, a cleavage thickness of the SiC chip 2 can be reduced and therefore, the number of levels of the first to fourth modified regions 8A to 8D can be lessened. In this case, workload can be reduced and therefore, productivity can be improved. Decreasing the thickness TC of the SiC chip 2 is also effective for reducing a resistance value of the SiC chip 2.

The first modified regions 8A are formed at intervals in the normal direction Z and respectively formed as bands extending in the first direction X (m-axis direction) at the first side surface 5A. The first modified regions 8A respectively extend from a corner portion at the third side surface 5C side to a corner portion at the fourth side surface 5D side.

Each first modified region 8A includes a plurality of first modified portions 9A. Each first modified portion 9A is a laser irradiation mark formed by irradiation of laser light. The first modified portions 9A are respectively formed as lines extending in the normal direction Z and are formed at intervals in the first direction X (m-axis direction). The first modified portions 9A may be respectively formed as dots instead. The single first modified region 8A is formed by a band-shaped region connecting the first modified portions 9A in the first direction X (m-axis direction). In this embodiment, the first modified portions 9A are formed in a matrix at intervals in the first direction X (m-axis direction) and the normal direction Z and oppose each other in the first direction X (m-axis direction) and the normal direction Z.

The second modified regions 8B are formed at intervals in the normal direction Z and respectively formed as bands extending in the first direction X (m-axis direction) at the second side surface 5B. The second modified regions 8B respectively extend from a corner portion at the third side surface 5C side to a corner portion at the fourth side surface 5D side.

Each second modified region 8B includes a plurality of second modified portions 9B. Each second modified portion 9B is a laser irradiation mark formed by irradiation of laser light. The second modified portions 9B are respectively formed as lines extending in the normal direction Z and are formed at intervals in the first direction X (m-axis direction). The second modified portions 9B may be respectively formed as dots instead. The single second modified region 8B is formed by a band-shaped region connecting the second modified portions 9B in the first direction X (m-axis direction). In this embodiment, the second modified portions 9B are formed in a matrix at intervals in the first direction X (m-axis direction) and the normal direction Z and oppose each other in the first direction X (m-axis direction) and the normal direction Z.

The third modified regions 8C are formed at intervals in the normal direction Z and respectively formed as bands extending in the second direction Y (a-axis direction) at the third side surface 5C. The third modified regions 8C respectively extend from a corner portion at the first side surface 5A side to a corner portion at the second side surface 5B side.

The respective third modified regions 8C may be continuous to the respective first modified regions 8A at the corner portion connecting the first side surface 5A and the third side surface 5C. The respective third modified regions 8C may be formed at intervals from the respective first modified regions 8A at the corner portion connecting the first side surface 5A and the third side surface 5C. The respective third modified regions 8C may be continuous to the respective second modified regions 8B at the corner portion connecting the second side surface 5B and the third side surface 5C. The respective third modified regions 8C may be formed at intervals from the respective second modified regions 8B at the corner portion connecting the second side surface 5B and the third side surface 5C.

Each third modified region 8C includes a plurality of third modified portions 9C. Each third modified portion 9C is a laser irradiation mark formed by irradiation of laser light. The third modified portions 9C are respectively formed as lines extending in the normal direction Z and are formed at intervals in the second direction Y (a-axis direction). The third modified portions 9C may be respectively formed as dots instead. The single third modified region 8C is formed by a band-shaped region connecting the third modified portions 9C in the second direction Y (a-axis direction). In this embodiment, the third modified portions 9C are formed in a matrix at intervals in the second direction Y (a-axis direction) and the normal direction Z and oppose each other in the second direction Y (a-axis direction) and the normal direction Z.

The fourth modified regions 8D are formed at intervals in the normal direction Z and respectively formed as bands extending in the second direction Y (a-axis direction) at the fourth side surface 5D. The fourth modified regions 8D respectively extend from a corner portion at the first side surface 5A side to a corner portion at the second side surface 5B side.

The respective fourth modified regions 8D may be continuous to the respective first modified regions 8A at the corner portion connecting the first side surface 5A and the fourth side surface 5D. The respective fourth modified regions 8D may be formed at intervals from the respective first modified regions 8A at the corner portion connecting the first side surface 5A and the fourth side surface 5D. The respective fourth modified regions 8D may be continuous to the respective second modified regions 8B at the corner portion connecting the second side surface 5B and the fourth side surface 5D. The respective fourth modified regions 8D may be formed at intervals from the respective second modified regions 8B at the corner portion connecting the second side surface 5B and the fourth side surface 5D.

Each fourth modified region 8D includes a plurality of fourth modified portions 9D. Each fourth modified portion 9D is a laser irradiation mark formed by irradiation of laser light. The fourth modified portions 9D are respectively formed as lines extending in the normal direction Z and are formed at intervals in the second direction Y (a-axis direction). The fourth modified portions 9D may be respectively formed as dots instead. The single fourth modified region 8D is formed by a band-shaped region connecting the fourth modified portions 9D in the second direction Y (a-axis direction). In this embodiment, the fourth modified portions 9D are formed in a matrix at intervals in the second direction Y (a-axis direction) and the normal direction Z and oppose each other in the second direction Y (a-axis direction) and the normal direction Z.

The first to fourth modified regions 8A to 8D may be formed at mutually equal depth positions or may be formed at mutually different depth positions. The first to fourth modified regions 8A to 8D may be formed as a single ring extending continuously along the side surfaces 5A to 5D by being continuous at the corner portions of the SiC chip 2.

Modification ratios of the side surfaces 5A to 5D do not necessarily have to be matched. The modification ratios of the side surfaces 5A to 5D may be mutually equal or may be mutually different. The modification ratios of the side surfaces 5A to 5D can be adjusted by total numbers, total areas, etc., of the first to fourth modified regions 8A to 8D (first to fourth modified portions 9A to 9D).

The third side surface 5C (fourth side surface 5D) that is constituted of the m-plane of the SiC monocrystal extends along a nearest neighbor direction of Si and thus has property of cleaving more easily than the first side surface 5A (second side surface 5B) that is constituted of the a-plane of the Si monocrystal. The modification ratio of the third side surface 5C (fourth side surface 5D) may thus be less than the modification ratio of the first side surface 5A (second side surface 5B).

An interval between adjacent ones of the third modified regions 8C (fourth modified regions 8D) at the third side surface 5C (fourth side surface 5D) may be less than an interval between adjacent ones of the first modified regions 8A (second modified regions 8B) at the first side surface 5A (second side surface 5B). The number of levels of the third modified regions 8C (fourth modified regions 8D) of the third side surface 5C (fourth side surface 5D) may be less than the number of levels of the first modified regions 8A (second modified regions 8B) of the first side surface 5A (second side surface 5B). A thickness (width) of the third modified regions 8C (fourth modified regions 8D) of the third side surface 5C (fourth side surface 5D) may be less than the thickness (width) of first modified regions 8A (second modified regions 8B) of the first side surface 5A (second side surface 5B).

The SiC chip 2 includes an active region 10 and an outer region 11. The active region 10 is a region that includes an SBD (Schottky barrier diode) 12 as an example of the functional device. In plan view, the active region 10 is formed in a central portion of the SiC chip 2 at intervals inward from the side surfaces 5A to 5D. In plan view, the active region 10 is formed in a quadrilateral shape having four sides parallel to the side surfaces 5A to 5D.

The outer region 11 is a region at an outer side of the active region 10. The outer region 11 is formed in a region between the side surfaces 5A to 5D and the active region 10. The outer region 11 is formed in an annular shape (specifically, an endless shape) surrounding the active region 10 in plan view.

Referring to FIG. 6, the SiC semiconductor device 1 includes an n-type diode region 13 formed in a surface layer portion of the first main surface 3 in the active region 10. The diode region 13 is formed in a central portion of the first main surface 3. A planar shape of the diode region 13 is arbitrary. The diode region 13 may be formed in a quadrilateral shape having four sides parallel to the side surfaces 5A to 5D in plan view.

In this embodiment, the diode region 13 is formed using a portion of the SiC epitaxial layer 7. An n-type impurity concentration of the diode region 13 is equal to the n-type impurity concentration of the SiC epitaxial layer 7. The n-type impurity concentration of the diode region 13 may exceed the n-type impurity concentration of the SiC epitaxial layer 7. In this case, the diode region 13 is formed by introduction of an n-type impurity into a surface layer portion of the SiC epitaxial layer 7.

A guard region 14 including a p-type impurity is formed in a surface layer portion of the first main surface 3 in the outer region 11. The p-type impurity of the guard region 14 does not have to be activated or may be activated. The guard region 14 is formed as a band extending along the diode region 13 in plan view. Specifically, the guard region 14 is formed in an annular shape (specifically, an endless shape) surrounding the diode region 13 in plan view. The guard region 14 is thereby formed as a guard ring region.

The active region 10 (diode region 13) is defined by the guard region 14. A planar shape of the active region 10 (diode region 13) is adjusted by a planar shape of the guard region 14. The guard region 14 may be formed in a polygonal annular shape or a circular annular shape in plan view.

Referring to FIG. 5, FIG. 7, and FIG. 8, the SiC semiconductor device 1 includes a plurality of alignment patterns 20 as accessory patterns formed in a peripheral edge portion of the first main surface 3 at intervals inward from the side surfaces 5A to 5D in plan view. An accessory pattern refers to an ornamental structure that is present electrically independently of the functional device (the SBD 12 in this embodiment) and includes a metal material (metal pattern)

and/or an insulating material (insulating pattern) not contributing to electrical characteristics of the SiC semiconductor device 1.

The alignment patterns 20 are respectively formed in the first main surface 3 at the outer region 11. The alignment patterns 20 are formed one each at each of four corners of the first main surface 3 in plan view. The alignment patterns 20 are respectively formed on diagonals of the first main surface 3 at the four corners of the first main surface 3. The alignment patterns 20 are not formed in regions other than the four corners of the first main surface 3.

Each alignment pattern 20 is formed in a shape other than a circular shape in plan view. Each alignment pattern includes a first portion 21 and a second portion 22 respectively extending in different directions. In this embodiment, each alignment pattern 20 is formed in an L shape that includes the first portion 21 and the second portion 22. The first portion 21 extends along the m-axis direction of the SiC monocrystal. The second portion 22 extends along the a-axis direction of the SiC monocrystal. Each alignment pattern 20 is also an orientation mark that indicates a crystal orientation of the SiC monocrystal.

An inner corner portion 23 of each alignment pattern 20 opposes the active region 10 in plan view. An outer corner portion 24 of each alignment pattern 20 opposes a corner portion of the first main surface 3 in plan view. Each alignment pattern 20 demarcates an L-shaped passage 25 at the corner portion of the first main surface 3 in plan view.

The alignment patterns 20 are respectively formed at the four corners of the first main surface 3 such that the first portions 21 are positioned on the same straight line and the second portions 22 are positioned on the same straight line. An accessory pattern other than the alignment patterns 20 are not formed on extension lines of the first portions 21 of the alignment patterns 20 at the outer region 11. An accessory pattern other than the alignment patterns 20 is not formed on extension lines of the second portions 22 of the alignment patterns 20 at the outer region 11.

Each alignment pattern 20 is formed of a material other than a metal material. Specifically, each alignment pattern 20 has an alignment trench structure that includes an alignment trench 26 and an insulator 27. The alignment trench 26 is formed by digging into the first main surface 3 toward the second main surface 4. The alignment trench 26 has side walls and a bottom wall. The side walls and the bottom wall of the alignment trench 26 are positioned within the SiC epitaxial layer 7.

The side walls of the alignment trench 26 may extend in the normal direction Z. An angle that the side walls of the alignment trench 26 forms with the first main surface 3 within the SiC epitaxial layer 7 may be not less than 90° and not more than 95° (for example, not less than 91° and not more than 93°). The side walls of the alignment trench 26 may be formed substantially perpendicular to the first main surface 3. The alignment trench 26 may be formed in a convergent shape that narrows in opening width from the first main surface 3 toward the bottom wall.

The bottom wall of the alignment trench 26 faces the c-plane of the SiC monocrystal. The bottom wall of the alignment trench 26 has the off angle inclined in the a-axis direction with respect to the c-plane of the SiC monocrystal. The bottom wall of the alignment trench 26 may be formed in parallel to the first main surface 3. The bottom wall of the alignment trench 26 may be formed in a shape curved toward the second main surface 4.

A depth DT of the alignment trench 26 may be not less than 0.01 μm and not more than 10 μm. The depth DT may be not less than 0.01 μm and not more than 1 μm, not less than 1 μm and not more than 2 μm, not less than 2 μm and not more than 4 μm, not less than 4 μm and not more than 6 μm, not less than 6 μm and not more than 8 μm, or not less than 8 μm and not more than 10 μm.

A width WT of the alignment trench 26 may be not less than 1 μm and not more than 100 μm. The width WT is a width in a direction orthogonal to a direction in which the alignment trench 26 extends. The width WT may be not less than 1 μm and not more than 20 μm, not less than 20 μm and not more than 40 μm, not less than 40 μm and not more than 60 μm, not less than 60 μm and not more than 80 μm, or not less than 80 μm and not more than 100 μm.

A width WL of the L-shaped passage 25 may exceed 0 μm and be not more than 200 μm. The width WL is a width in a direction orthogonal to a direction in which the L-shaped passage 25 extends. The width WL may exceed 0 μm and be not more than 10 μm, be not less than 10 μm and not more than 20 μm, be not less than 20 μm and not more than 50 μm, be not less than 50 μm and not more than 100 μm, be not less than 100 μm and not more than 150 μm, or be not less than 150 μm and not more than 200 μm.

The insulator 27 is embedded as an integral object in the alignment trench 26. The insulator 27 is constituted of a transparent insulating material. The insulator 27 includes at least one among silicon oxide, silicon nitride, aluminum oxide, zirconium oxide, and tantalum oxide. In this embodiment, the insulator 27 is constituted of silicon oxide.

The SiC semiconductor device 1 includes an interlayer insulating layer 30 formed on the first main surface 3. The interlayer insulating layer 30 is constituted of a transparent insulating material. The interlayer insulating layer 30 may have a laminated structure that includes a silicon oxide layer and a silicon nitride layer. The interlayer insulating layer 30 may have a single layer structure constituted of a silicon oxide layer or a silicon nitride layer. In this embodiment, the interlayer insulating layer 30 is constituted of a silicon oxide layer.

The interlayer insulating layer 30 includes a contact opening 31 exposing the diode region 13 in the active region 10. The contact opening 31 also exposes inner peripheral edges of the guard region 14. A planar shape of the contact opening 31 is arbitrary. The contact opening 31 may be formed in a quadrilateral shape having four sides parallel to the side surfaces 5A to 5D in plan view.

The interlayer insulating layer 30 covers the alignment patterns 20 at the outer region 11. Peripheral edges of the interlayer insulating layer 30 are exposed from the side surfaces 5A to 5D. In this embodiment, the peripheral edges of the interlayer insulating layer 30 are continuous to the side surfaces 5A to 5D. The peripheral edges of the interlayer insulating layer 30 may be formed at intervals inward from the side surfaces 5A to 5D. In this case, the peripheral edges of the interlayer insulating layer 30 may expose alignment patterns 20 at the first main surface 3.

A thickness of the interlayer insulating layer 30 may be not less than 0.1 μm and not more than 10 μm. The thickness of the interlayer insulating layer 30 may be not less than 0.1 μm and not more than 1 μm, not less than 1 μm and not more than 2 μm, not less than 2 μm and not more than 4 μm, not less than 4 μm and not more than 6 μm, not less than 6 μm and not more than 8 μm, or not less than 8 μm and not more than 10 μm. The thickness of the interlayer insulating layer 30 is preferably not less than 0.5 μm and not more than 5 μm.

The SiC semiconductor device 1 includes a first main surface electrode 32 formed on the first main surface 3. The first main surface electrode 32 is connected to the diode region 13 and the guard region 14 within the contact opening 31. The first main surface electrode 32 is led out from the contact opening 31 onto the interlayer insulating layer 30.

Peripheral edges of the first main surface electrode 32 are formed on the interlayer insulating layer 30 at intervals inward from the side surfaces 5A to 5D. The peripheral edges of the first main surface electrode 32 expose the alignment patterns 20 in plan view. In this embodiment, the peripheral edges of the first main surface electrode 32 expose the alignment patterns 20 via the interlayer insulating layer 30.

The first main surface electrode 32 has a laminated structure including a barrier layer 33 and a main body layer 34 that are laminated in that order from the first main surface 3 side. The barrier layer 33 is formed as a film along the first main surface 3 and the interlayer insulating layer 30. The barrier layer 33 forms a Schottky junction with the diode region 13. The SBD 12 having the first main surface electrode 32 as an anode and the diode region 13 as a cathode is thereby formed. That is, the first main surface electrode 32 is an anode electrode of the SBD 12.

The barrier layer 33 may include at least one among a Ti layer, a Pd layer, a Cr layer, a V layer, a Mo layer, a W layer, a Pt layer, and an Ni layer. A thickness of the barrier layer 33 may be not less than 0.01 μm and not more than 5 μm. The thickness of the barrier layer 33 may be not less than 0.01 μm and not more than 0.1 μm, not less than 0.1 μm and not more than 1 μm, not less than 1 μm and not more than 2 μm, not less than 2 μm and not more than 3 μm, not less than 3 μm and not more than 4 μm, or not less than 4 μm and not more than 5 μm.

The main body layer 34 is formed on the barrier layer 33. The main body layer 34 is formed as a film along the barrier layer 33. The main body layer 34 covers an entire area of a main surface of the barrier layer 33. The peripheral edges of the first main surface electrode 32 are formed by barrier layer 33 and the main body layer 34. The main body layer 34 includes at least one among a pure Al layer (refers to an Al layer constituted of Al of a purity of not less than 99%), an AlSi alloy layer, an AlCu alloy layer, and an AlSiCu alloy layer.

A thickness of the main body layer 34 exceeds the thickness of the barrier layer 33. The thickness of the main body layer 34 may be not less than 0.05 μm and not more than 10 μm. The thickness of the main body layer 34 may be not less than 0.05 μm and not more than 0.1 μm, not less than 0.1 μm and not more than 1 μm, not less than 1 μm and not more than 2 μm, not less than 2 μm and not more than 4 μm, not less than 4 μm and not more than 6 μm, not less than 6 μm and not more than 8 μm, or not less than 8 μm and not more than 10 μm. The thickness of the main body layer 34 is preferably not less than 1 μm and not more than 8 μm.

The SiC semiconductor device 1 includes an insulating layer 40 that covers the first main surface electrode 32 above the first main surface 3. In FIG. 5, the insulating layer 40 is shown with hatching. Specifically, the insulating layer 40 is formed on the interlayer insulating layer 30.

The insulating layer 40 has a pad opening 41 that exposes the first main surface electrode 32. In this embodiment, the pad opening 41 exposes the first main surface electrode 32 within a region surrounded by the contact opening 31 in plan view. The pad opening 41 may instead surround the contact opening 31 in a region outside the contact opening 31 in plan view. A planar shape of the pad opening 41 is arbitrary. The pad opening 41 may be formed in a quadrilateral shape having four sides parallel to the side surfaces 5A to 5D in plan view.

Inner walls of the pad opening 41 have inclined surfaces 42 that are inclined downward from a main surface of the insulating layer 40 toward the interlayer insulating layer 30. The inclined surfaces 42 may be formed in curved shapes recessed toward the first main surface 3 side.

An angle $\theta1$ of each inclined surface 42 may be not less than 30° and not more than 60°. The angle $\theta1$ is an acute angle that a straight line joining a start point and an end point of the inclined surface 42 forms with the first main surface 3. The angle $\theta1$ may be not less than 30° and not more than 35°, not less than 35° and not more than 40°, not less than 40° and not more than 45°, not less than 45° and not more than 50°, not less than 50° and not more than 55°, or not less than 55° and not more than 60°. The angle $\theta1$ is preferably not less than 40° and not more than 50°.

Peripheral edges of the insulating layer 40 are formed at intervals inward from the side surfaces 5A to 5D. The peripheral edges of the insulating layer 40 expose the alignment patterns 20 in plan view. In this embodiment, the insulating layer 40 exposes the alignment patterns 20 via the interlayer insulating layer 30 in plan view.

The peripheral edges of the insulating layer 40 demarcate dicing streets 43 with the side surfaces 5A to 5D. The first portion 21 and the second portion 22 of each alignment pattern 20 are also street marks indicating directions in which the dicing streets 43 extend. An accessory pattern other than the alignment patterns 20 is not formed in portions exposed from the dicing streets 43. That is, an accessory pattern is not formed in portions on the interlayer insulating layer 30 exposed from the dicing streets 43.

A width WD of each dicing street 43 may be not less than 1 μm and not more than 50 μm. The width WD is a width in a direction orthogonal to a direction in which the dicing street 43 extends. The width WD may be not less than 1 μm and not more than 10 μm, not less than 10 μm and not more than 20 μm, not less than 20 μm and not more than 30 μm, not less than 30 μm and not more than 40 μm, or not less than 40 μm and not more than 50 μm.

The width WD is preferably not less than 5% and not more than 25% of the thickness TC of the SiC chip 2. The width WD may be not less than 5% and not more than 7.5%, not less than 7.5% and not more than 10%, not less than 10% and not more than 12.5%, not less than 12.5% and not more than 15%, not less than 15% and not more than 17.5%, not less than 17.5% and not more than 20%, not less than 20% and not more than 22.5%, or not less than 22.5% and not more than 25% of the thickness TC. The width WD is preferably not less than 5% and not more than 15% of the thickness TC.

The peripheral edges of the insulating layer 40 have inclined surfaces 44 that are inclined downward from the main surface of the insulating layer 40 toward the interlayer insulating layer 30. The inclined surfaces 44 may be formed in curved shapes recessed toward the first main surface 3 side.

An angle $\theta2$ of each inclined surface 44 may be not less than 30° and not more than 60°. The angle $\theta2$ is an acute angle that a straight line joining a start point and an end point of the inclined surface 44 forms with the first main surface 3. The angle $\theta2$ may be not less than 30° and not more than 35°, not less than 35° and not more than 40°, not less than 40° and not more than 45°, not less than 45° and not more than 50°, not less than 50° and not more than 55°, or not less than 55° and not more than 60°. The angle $\theta2$ is preferably not less than 40° and not more than 50°.

The angle $\theta2$ of the inclined surfaces 44 may exceed the angle $\theta1$ of the inclined surfaces 42 or may be less than the angle $\theta1$ of the inclined surfaces 42. The angle $\theta2$ of the inclined surfaces 44 may be equal to the angle $\theta1$ of the inclined surfaces 42. That the angle $\theta2$ is equal to the angle $\theta1$ means that the angle $\theta2$ is lies within a range of ±1° of the angle $\theta1$.

With the insulating layer 40 having the inclined surfaces 44, interference of laser light by the insulating layer 40 can be suppressed when irradiating the laser light to an interior of the SiC chip 2 (specifically, an SiC wafer 62 to be described below). In particular, by making the angle $\theta2$ not less than 30° and not more than 60°, the interference of laser light by the insulating layer 40 can be suppressed appropriately. Thereby, undesired refraction of the laser light due to a difference in refractive indices of the insulating layer 40 and air can be suppressed and the laser light can be focused on an appropriate region in the SiC chip 2 (SiC wafer 62). Consequently, the SiC chip 2 having the first to fourth modified regions 8A to 8D that are formed appropriately at the side surfaces 5A to 5D can be formed.

The width WD of the dicing streets 43 extending in the a-axis direction may be equal to or may differ from the width WD of dicing streets 43 extending in the m-axis direction. For example, the width WD of the dicing streets 43 extending in the a-axis direction may be less than the width WD of dicing streets 43 extending in the m-axis direction. In this case, the modification ratio of the third side surface 5C (fourth side surface 5D) extending in the a-axis direction may be less than the modification ratio of the first side surface 5A (second side surface 5B) extending in the m-axis direction.

The first to fourth modified regions 8A to 8D (first to fourth modified portions 9A to 9D) are formed by laser irradiation marks as mentioned above. The width WD is set in consideration of refractive indices of laser light made incident on the SiC chip 2 and the interlayer insulating layer 30. If the first to fourth modified regions 8A to 8D (first to fourth modified portions 9A to 9D) are formed at equal depth positions, the dicing streets 43 are preferably formed to be of uniform width WD.

If the third modified regions 8C (fourth modified regions 8D) are not to be formed at positions that are deep in comparison to the first modified regions 8A (second modified regions 8B), the width WD of the dicing streets 43 extending in the a-axis direction can be made narrower than the width WD of dicing streets 43 extending in the m-axis direction.

In this embodiment, the insulating layer 40 has a laminated structure including a passivation layer 45 and a resin layer 46 that are laminated in that order from the first main surface 3 side. The passivation layer 45 may include at least one among a silicon oxide layer and a silicon nitride layer. The passivation layer 45 may have a laminated structure that includes a silicon oxide layer and a silicon nitride layer. The passivation layer 45 may have a single layer structure constituted of a silicon oxide layer or a silicon nitride layer.

The passivation layer 45 preferably includes an insulating material differing from the interlayer insulating layer 30. In this embodiment, the passivation layer 45 is constituted of a silicon nitride layer. The passivation layer 45 is formed as a film along the interlayer insulating layer 30 and the first main surface electrode 32. The passivation layer 45 has a first opening 47 that exposes a portion of the first main surface electrode 32. A planar shape of the first opening 47 is arbitrary. The first opening 47 may be formed in a quadrilateral shape having four sides parallel to the side surfaces 5A to 5D in plan view.

A thickness of the passivation layer 45 may be not less than 0.1 μm and not more than 20 μm. The thickness of the passivation layer 45 may be not less than 0.1 μm and not more than 1 μm, not less than 1 μm and not more than 5 μm, not less than 5 μm and not more than 10 μm, not less than 10 μm and not more than 15 μm, or not less than 15 μm and not more than 20 μm.

The resin layer 46 is formed as a film along a main surface of the passivation layer 45. The resin layer 46 may contain a photosensitive resin. The photosensitive resin may be of a negative type or a positive type. The resin layer 46 may contain at least one among a polyimide, a polyamide, and a polybenzoxazole. In this embodiment, the resin layer 46 includes polybenzoxazole.

In this embodiment, peripheral edges of the resin layer 46 expose peripheral edges of the passivation layer 45. The peripheral edges of the insulating layer 40 are formed by the resin layer 46 and the passivation layer 45. The resin layer 46 may cover the peripheral edges of the passivation layer 45. In this case, the peripheral edges of the insulating layer 40 are formed by the resin layer 46.

The resin layer 46 has a second opening 48 that exposes a portion of the first main surface electrode 32. A planar shape of the second opening 48 is arbitrary. The second opening 48 may be formed in a quadrilateral shape having four sides parallel to the side surfaces 5A to 5D in plan view. The second opening 48 is in communication with the first opening 47 of the passivation layer 45 and forms a single pad opening 41 with the first opening 47.

Inner walls of the second opening 48 may be formed flush with inner walls of the first opening 47. The inner walls of the second opening 48 may be positioned at the side surface 5A to 5D sides with respect to the inner walls of the first opening 47. The inner walls of the second opening 48 may be positioned at inner sides of the SiC chip 2 with respect to the inner walls of the first opening 47. That is, the resin layer 46 may cover the inner walls of the first opening 47. In this case, the pad opening 41 is formed by the resin layer 46 (second opening 48).

A thickness of the resin layer 46 may be not less than 1 μm and not more than 50 μm. The thickness of the resin layer 46 may be not less than 1 μm and not more than 10 μm, not less than 10 μm and not more than 20 μm, not less than 20 μm and not more than 30 μm, not less than 30 μm and not more than 40 μm, or not less than 40 μm and not more than 50 μm.

The SiC semiconductor device 1 includes a pad electrode 49 formed on the first main surface electrode 32. The pad electrode 49 is formed on the first main surface electrode 32 within the pad opening 41. The pad electrode 49 is electrically connected to the first main surface electrode 32. The pad electrode 49 covers the inclined surfaces 42 of the pad opening 41. The pad electrode 49 has a terminal surface 50 that is externally connected to a lead wire (for example, a bonding wire).

The terminal surface 50 is positioned at the first main surface electrode 32 side with respect to the main surface of the insulating layer 40 (resin layer 46). The terminal surface 50 may project higher than the main surface of the insulating layer 40 (resin layer 46). The terminal surface 50 may have an overlap portion covering the inclined surfaces 42 of the pad opening 41 and covering the main surface of the insulating layer 40 (resin layer 46).

The pad electrode 49 includes a metal material differing from the first main surface electrode 32. The pad electrode 49 includes at least one among an Ni layer, a Pd layer, and an Au layer. The pad electrode 49 may have a laminated structure in which at least two among an Ni layer, a Pd layer, and an Au layer are laminated in any order. The pad electrode 49 may have a single layer structure constituted of an Ni layer, a Pd layer, or an Au layer.

The pad electrode 49 preferably has the terminal surface 50 that is formed by an Au layer. The pad electrode 49 may have a laminated structure that includes an Ni layer, a Pd layer, and an Au layer that are laminated in that order from the first main surface electrode 32 side. In this embodiment, the pad electrode 49 has a laminated structure that includes an Ni layer and an Au layer that are laminated in that order from the first main surface electrode 32 side.

The SiC semiconductor device 1 includes a second main surface electrode 51 formed on the second main surface 4. The second main surface electrode 51 is formed as a cathode electrode of the SBD 12. The second main surface electrode 51 forms an ohmic contact with the second main surface 4. The second main surface electrode 51 includes at least one among a Ti layer, an Ni layer, a Pd layer, an Au layer, and an Ag layer.

The second main surface electrode 51 may have a laminated structure in which at least two among a Ti layer, an Ni layer, a Pd layer, an Au layer, and an Ag layer are laminated in any order. The second main surface electrode 51 may have a single layer structure constituted of a Ti layer, an Ni layer, a Pd layer, an Au layer, or an Ag layer. The second main surface electrode 51 preferably includes a Ti layer as an ohmic electrode. In this embodiment, the second main surface electrode 51 has a laminated structure including a Ti layer, an Ni layer, a Pd layer, an Au layer, and an Ag layer that are laminated in that order from the second main surface 4 side.

As described above, the SiC semiconductor device 1 includes the SiC chip 2, the first to fourth modified regions 8A to 8D, the alignment patterns 20, the first main surface electrode 32, and the insulating layer 40. The SiC chip 2 has the first main surface 3 and the second main surface 4 that are respectively formed in quadrilateral shapes in plan view and the side surfaces 5A to 5D that are constituted of cleavage surfaces.

The first to fourth modified regions 8A to 8D are respectively formed at the side surfaces 5A to 5D. The alignment patterns 20 are formed in the peripheral edge portion (outer region 11) of the first main surface 3 at intervals inward from the side surfaces 5A to 5D in plan view. The first main surface electrode 32 is formed on the first main surface 3 at intervals inward from the side surfaces 5A to 5D in plan view and exposes the alignment patterns 20.

The insulating layer 40 partially covers the first main surface electrode 32 in plan view. The insulating layer 40 demarcates the dicing streets 43 that are formed on the first main surface electrode 32 at intervals inward from the side surfaces 5A to 5D in plan view and expose the alignment patterns 20 with the side surfaces 5A to 5D. An accessory pattern other than the alignment patterns 20 is not formed in the peripheral edge portion of the first main surface 3 positioned within the dicing streets 43 in plan view.

With such a structure, flatness of the side surfaces 5A to 5D can be prevented from decreasing due to an accessory pattern. The SiC semiconductor device 1 having a structure with which shape defects due to an accessory pattern is suppressed can thus be provided.

Also, with the dicing streets 43, it is made unnecessary to physically cut the insulating layer 40 when cutting out the SiC semiconductor device 1 from the SiC wafer 62. The SiC semiconductor device 1 can thereby be cut out smoothly from the SiC wafer 62. Also, cracking of the SiC chip 2 due to peeling and degradation of the insulating layer 40 can be suppressed. Shape defects of the SiC chip 2 due to the insulating layer 40 can thus be suppressed.

Figure 9:
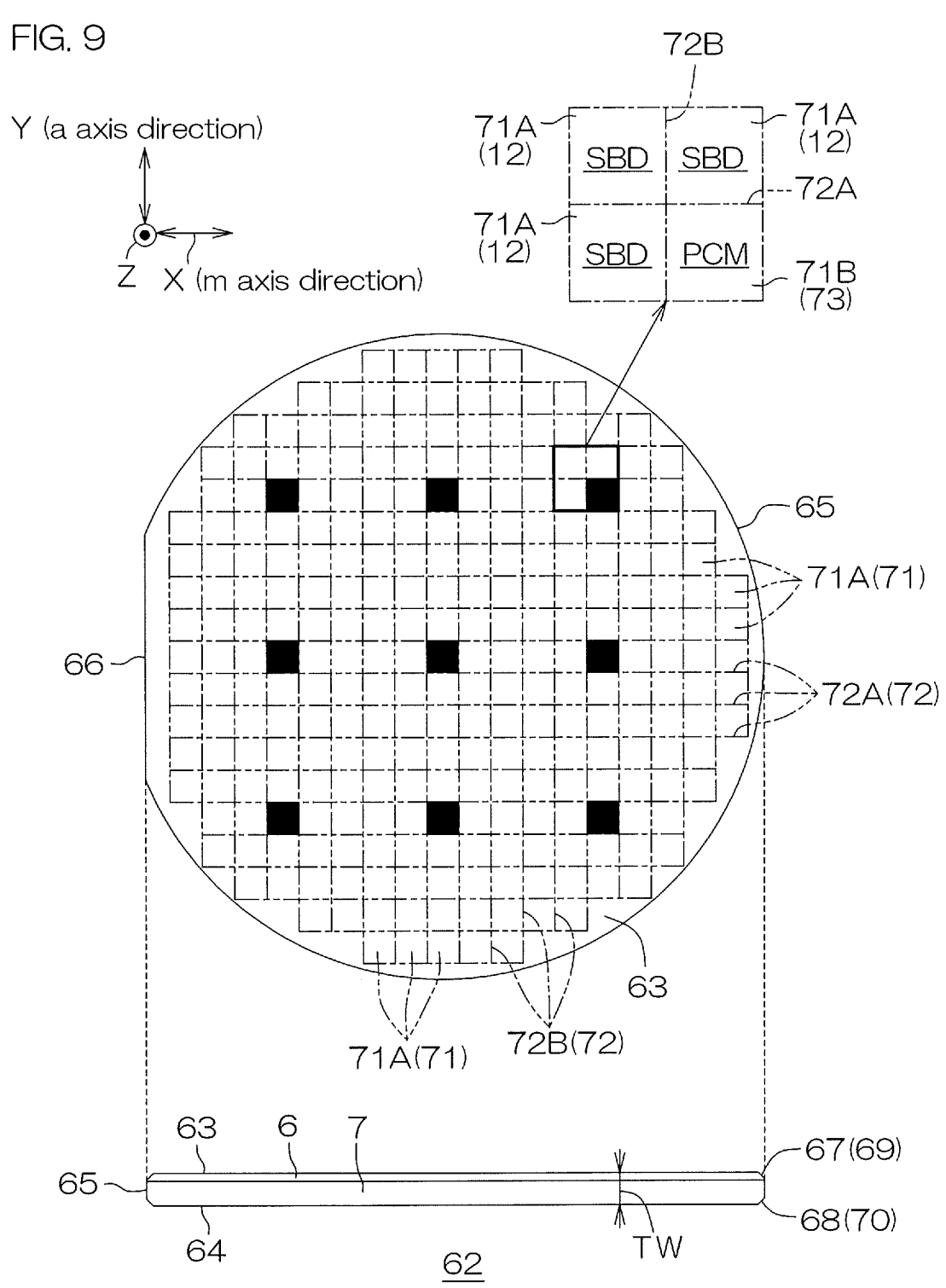
FIG. 9 is a diagram of an SiC wafer used to manufacture the SiC semiconductor device shown in FIG. 3.

FIG. 9 is a diagram of the SiC wafer 62 used to manufacture the SiC semiconductor device 1 shown in FIG. 3.

Referring to FIG. 9, in a method for manufacturing the SiC semiconductor device 1, the SiC wafer 62 of plate shape (disk shape in this embodiment) that is constituted of the 4H-SiC monocrystal is used. The SiC wafer 62 becomes a base of the SiC chip 2. The SiC wafer 62 has a laminated structure that includes the SiC substrate 6 and the SiC epitaxial layer 7. The SiC epitaxial layer 7 is formed by epitaxially growing SiC from the SiC substrate 6.

The SiC wafer 62 has a first wafer main surface 63 at one side, a second wafer main surface 64 at another side, and a wafer side surface 65 connecting the first wafer main surface 63 and the second wafer main surface 64. The first wafer main surface 63 and the second wafer main surface 64 have an off angle corresponding to the off angle of the SiC chip 2.

An orientation flat 66, as an example of a marker indicating the crystal orientation, is formed in the wafer side surface 65. The orientation flat 66 is a notched portion formed in the wafer side surface 65. In this embodiment, the orientation flat 66 extends rectilinearly along the a-axis direction of the SiC monocrystal.

An orientation flat 66 that extends in the m-axis direction of the SiC monocrystal and an orientation flat 66 that extends in the a-axis direction of the SiC monocrystal may be formed in the wafer side surface 65 instead. An orientation notch constituted of a notched portion recessed toward a central portion of the SiC wafer 62 may be formed in the wafer side surface 65 in place of the orientation flat 66.

The SiC wafer 62 includes a first wafer corner portion 67 and a second wafer corner portion 68. The first wafer corner portion 67 connects the first wafer main surface 63 and the wafer side surface 65. The second wafer corner portion 68 connects the second wafer main surface 64 and the wafer side surface 65.

The first wafer corner portion 67 has a first chamfered portion 69 that is inclined downwardly from the first wafer main surface 63 toward the wafer side surface 65. The first chamfered portion 69 may be formed in a curved shape. The second wafer corner portion 68 has a second chamfered portion 70 that is inclined downwardly from the second wafer main surface 64 toward the wafer side surface 65. The second chamfered portion 70 may be formed in a curved shape.

The SiC wafer 62 has a thickness TW that exceeds the thickness TC of the SiC chip 2. The thickness TW may be not less than 100 μm and not more than 1000 μm. The thickness TW may be not less than 100 μm and not more than 200 μm, not less than 200 μm and not more than 400 μm, not less than 400 μm and not more than 600 μm, not less than 600 μm and not more than 800 μm, or not less than 800 μm and not more than 1000 μm.

Scheduled cutting lines 72 that demarcate a plurality of chip regions 71 in a subsequent step are set on the first wafer main surface 63. The scheduled cutting lines 72 are set in a lattice extending along the m-axis direction and the a-axis direction of the SiC monocrystal.

Specifically, the scheduled cutting lines 72 include a plurality of first scheduled cutting lines 72A and a plurality of second scheduled cutting lines 72B. The first scheduled cutting lines 72A respectively extend along the m-axis direction of the SiC monocrystal. The second scheduled cutting lines 72B respectively extend along the a-axis direction of the SiC monocrystal.

The chip regions 71 are set in a matrix along the m-axis direction and the a-axis direction of the SiC monocrystal by the scheduled cutting lines 72. The chip regions 71 each have a side oriented along the m-axis direction and a side oriented along the a-axis direction of the SiC monocrystal. The chip regions 71 include a plurality of first chip regions 71A and one or a plurality of second chip regions 71B. In FIG. 9, the second chip regions 71B are shown with solid hatching.

The first chip regions 71A are regions in each of which the functional device (the SBD 12 in this embodiment) is formed. The second chip regions 71B are dummy chip regions and are regions in each of which a monitor pattern 73 for performing process control of the first chip regions 71A is formed. The monitor pattern 73 is also called a PCM (process control monitor). The monitor patterns 73 are formed only in the second chip regions 71B. The monitor pattern 73 is not formed in the first chip region 71A or on the scheduled cutting line 72.

Each monitor pattern 73 includes various structures necessary for performing process control of the first chip regions 71A and is not restricted to a specific mode. The monitor pattern 73 may include at least one among a bipolar transistor, a MISFET (metal insulator semiconductor field effect transistor), a pn junction diode, an SBD, a MIS capacitor, an insulating film, a wiring film, a trench, and a via electrode.

A suitability of each step performed at the first chip regions 71A is evaluated at an arbitrary timing and indirectly from physical characteristics and electrical characteristics of the structures formed in the monitor patterns 73. The physical characteristics are, for example, dimensions of the structure formed in each monitor pattern 73. The electrical characteristics are, for example, a resistance value and a capacitance value of a semiconductor region, etc., formed in each monitor pattern 73. By performing each step while keeping the physical characteristics and the electrical characteristics of the monitor patters 73 at certain levels, the functional devices can be formed appropriately in the first chip regions 71A.

The number of the first chip regions 71A may be not less than 100 regions and not more than 10000 regions. The number of the first chip regions 71A may be not less than 100 regions and not more than 1000 regions, not less than 1000 regions and not more than 2500 regions, not less than 2500 regions and not more than 5000 regions, not less than 5000 regions and not more than 7500 regions, or not less than 7500 regions and not more than 10000 regions.

The number of the second chip regions 71B is less than the number of the first chip regions 71A. The number of the second chip regions 71B may be not less than 1 region and not more than 20 regions. The number of the second chip regions 71B may be not less than 1 region and not more than 5 regions, not less than 5 regions and not more than 10 regions, not less than 10 regions and not more than 15 regions, or not less than 15 regions and not more than 20 regions.

A region ratio of the number of the second chip regions 71B to the number of the first chip regions 71A may be not less than 0.001 and not more than 0.01. The region ratio may be not less than 0.001 and not more than 0.002, not less than 0.002 and not more than 0.004, not less than 0.004 and not more than 0.006, not less than 0.006 and not more than 0.008, or not less than 0.008 and not more than 0.01.

A planar area of each second chip region 71B is equal to a planar area of each first chip region 71A. That the planar area of each second chip region 71B is equal to the planar area of each first chip region 71A means that the planar area of each second chip region 71B is lies within a range of ±1% of the planar area of each first chip region 71A.

The chip regions 71 preferably include a plurality of the second chip regions 71B. Each step performed at the first chip regions 71A can thereby be evaluated appropriately. The chip regions 71 preferably include a single second chip region 71B set at the central portion of the SiC wafer 62. The chip regions 71 preferably includes one or a plurality of second chip regions 71B set at intervals to peripheral edge (wafer side surface 65) sides of the SiC wafer 62 from a second chip region 71B at a center. Process errors at the central portion and peripheral edge portions of a single SiC wafer 62 can thereby be evaluated appropriately.

The chip regions 71 preferably include an odd number of second chip regions 71B. In this embodiment, the chip regions 71 include nine second chip regions 71B. Obviously, the chip regions 71 may include an even number of second chip regions 71B instead.

The second chip regions 71B oppose each other in the a-axis direction of the SiC monocrystal across one or a plurality (a plurality in this embodiment) of the first chip regions 71A. The second chip regions 71B oppose each other in the m-axis direction of the SiC monocrystal across one or a plurality (a plurality in this embodiment) of the first chip regions 71A. In this embodiment, the second chip regions 71B are laid out in a matrix at intervals in the a-axis direction and the m-axis direction of the SiC monocrystal.

After predetermined structures are formed in the chip regions 71, the SiC wafer 62 is cut along the scheduled cutting lines 72. Thereby, the first chip regions 71A are cut out as the SiC semiconductor devices 1 and the second chip regions 71B are cut out as dummy SiC semiconductor devices. The dummy SiC semiconductor devices may be disposed of.

Figure 10A:
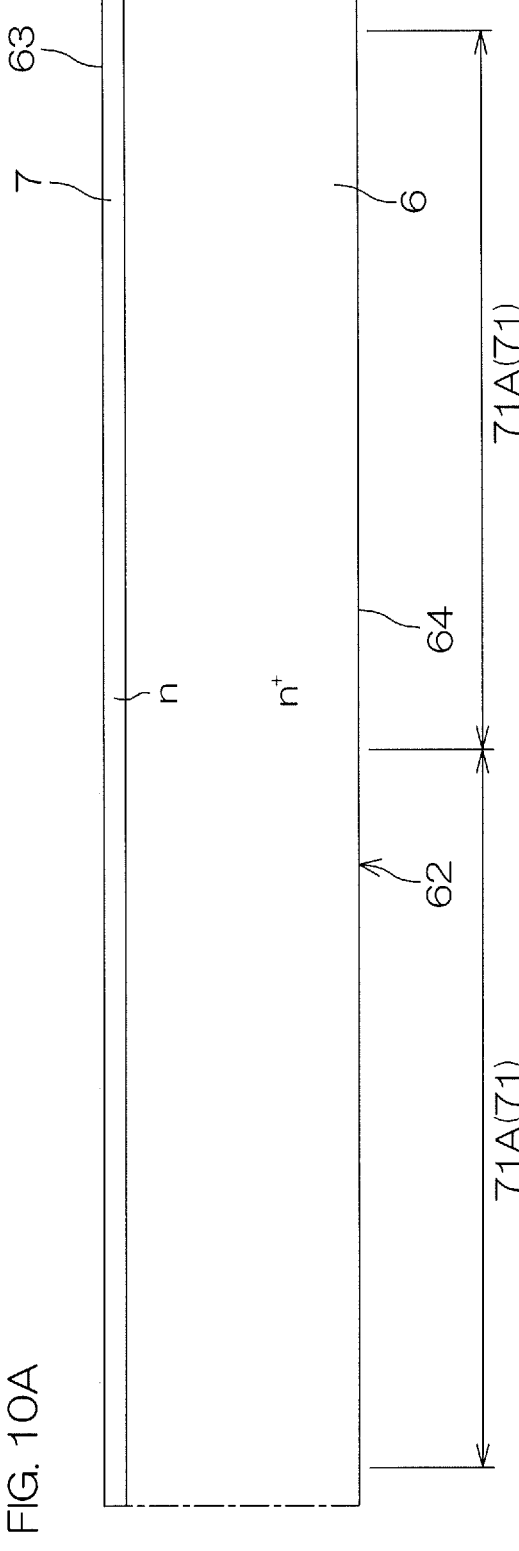
FIG. 10A is a sectional view of a region of a portion of the SiC wafer and shows an example of a method for manufacturing the SiC semiconductor devices shown in FIG. 3.
Figure 10B:
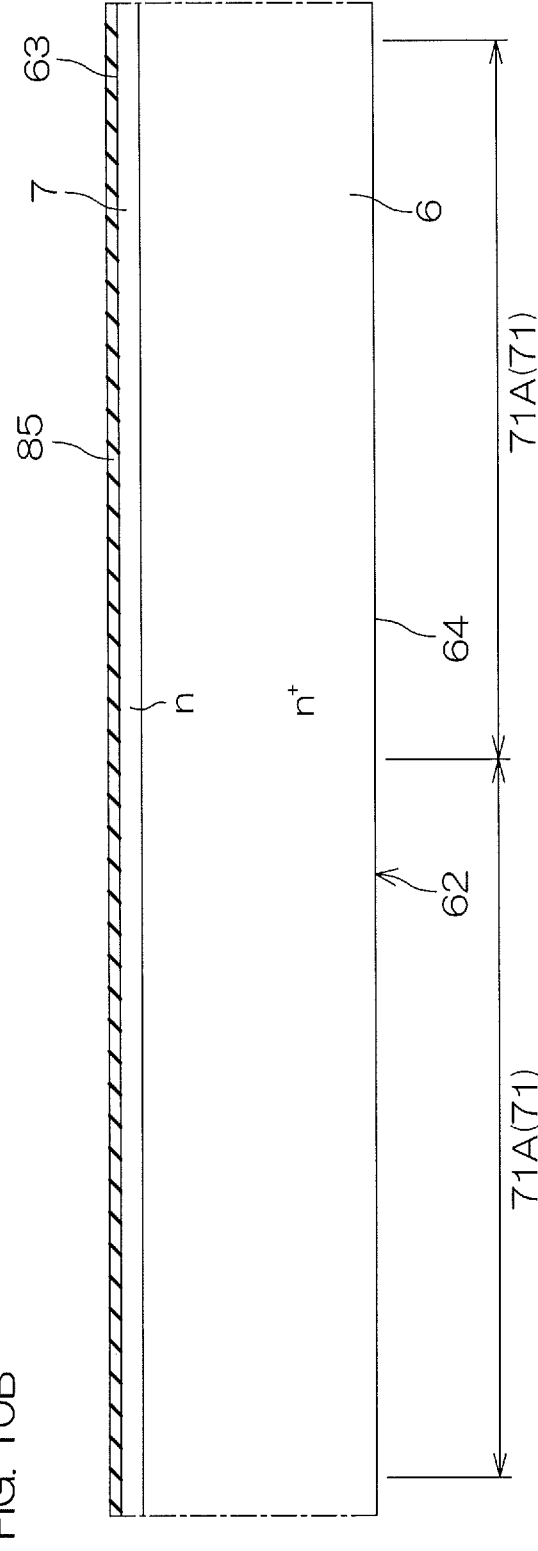
FIG. 10B is a sectional view of a step subsequent to that of FIG. 10A.
Figure 10C:
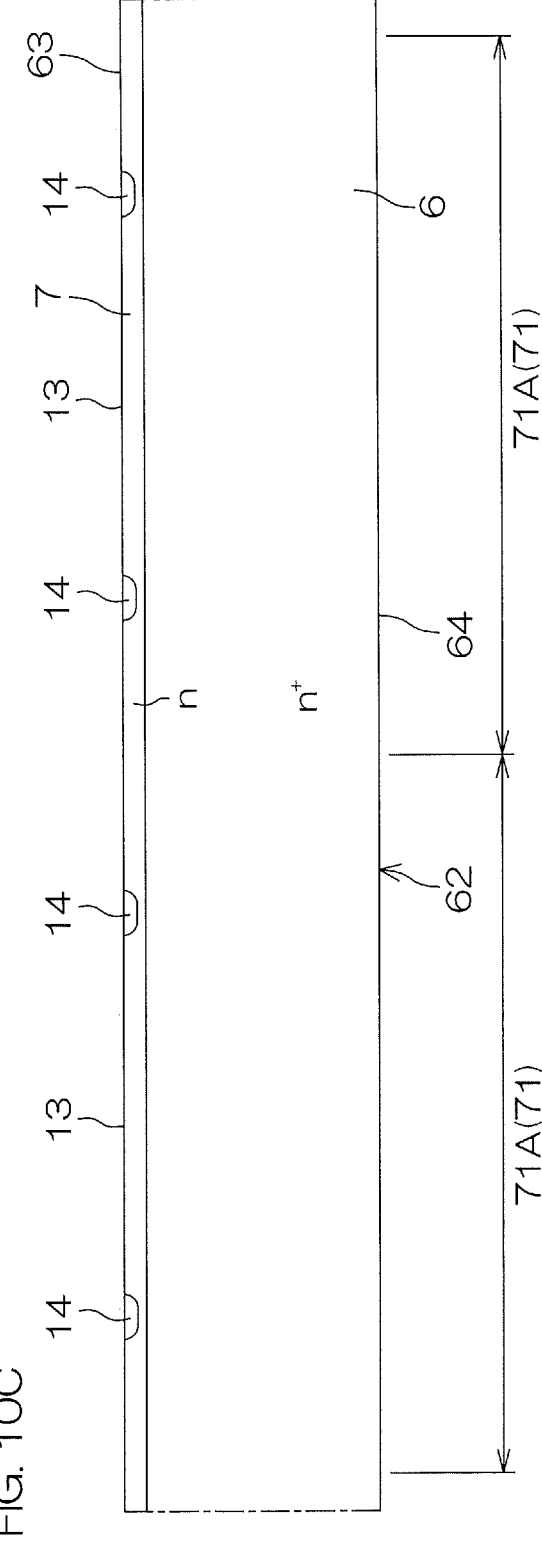
FIG. 10C is a sectional view of a step subsequent to that of FIG. 10B.
Figure 10D:
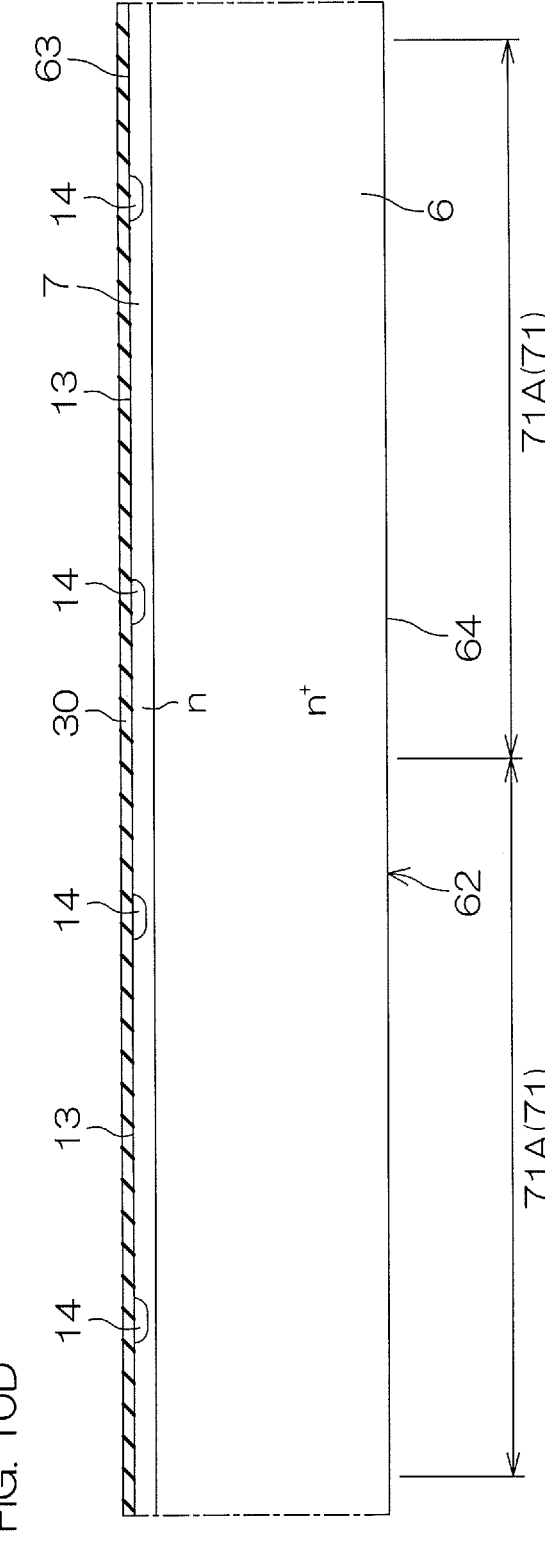
FIG. 10D is a sectional view of a step subsequent to that of FIG. 10C.
Figure 10E:
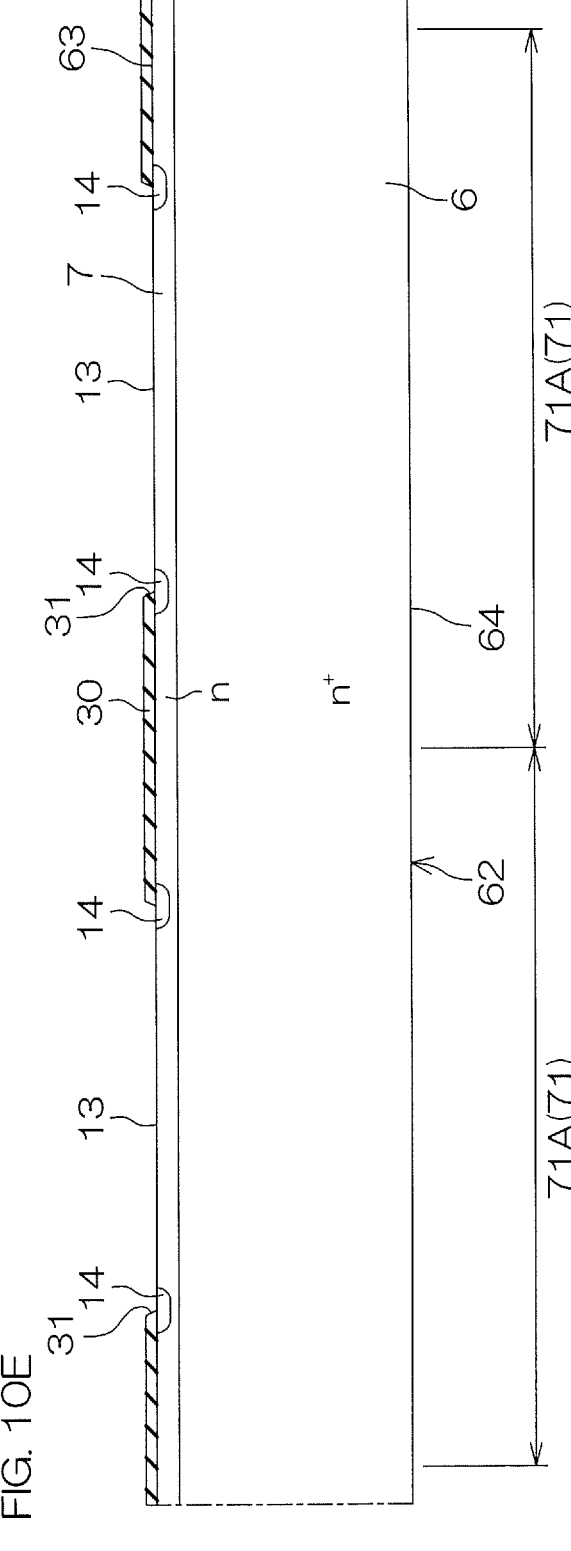
FIG. 10E is a sectional view of a step subsequent to that of FIG. 10D.
Figure 1O:
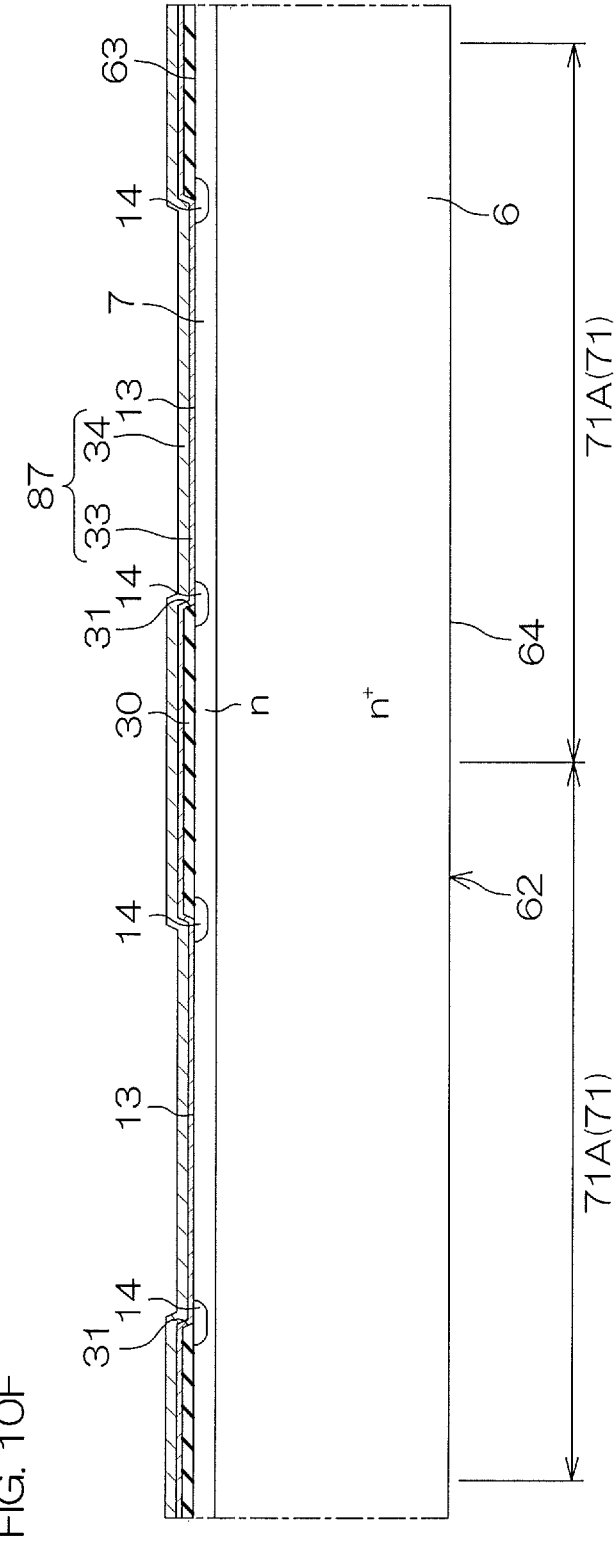
Figure 10G:
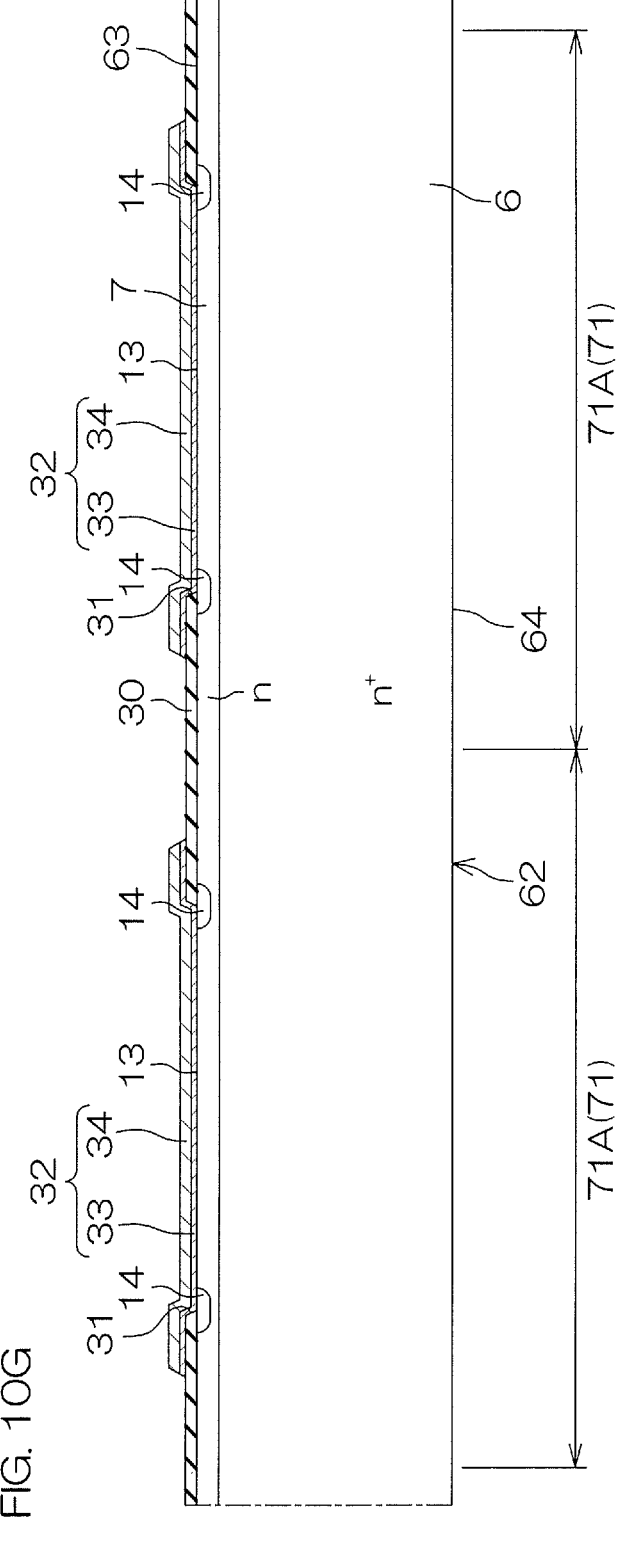
FIG. 10G is a sectional view of a step subsequent to that of FIG. 10F.
Figure 10H:
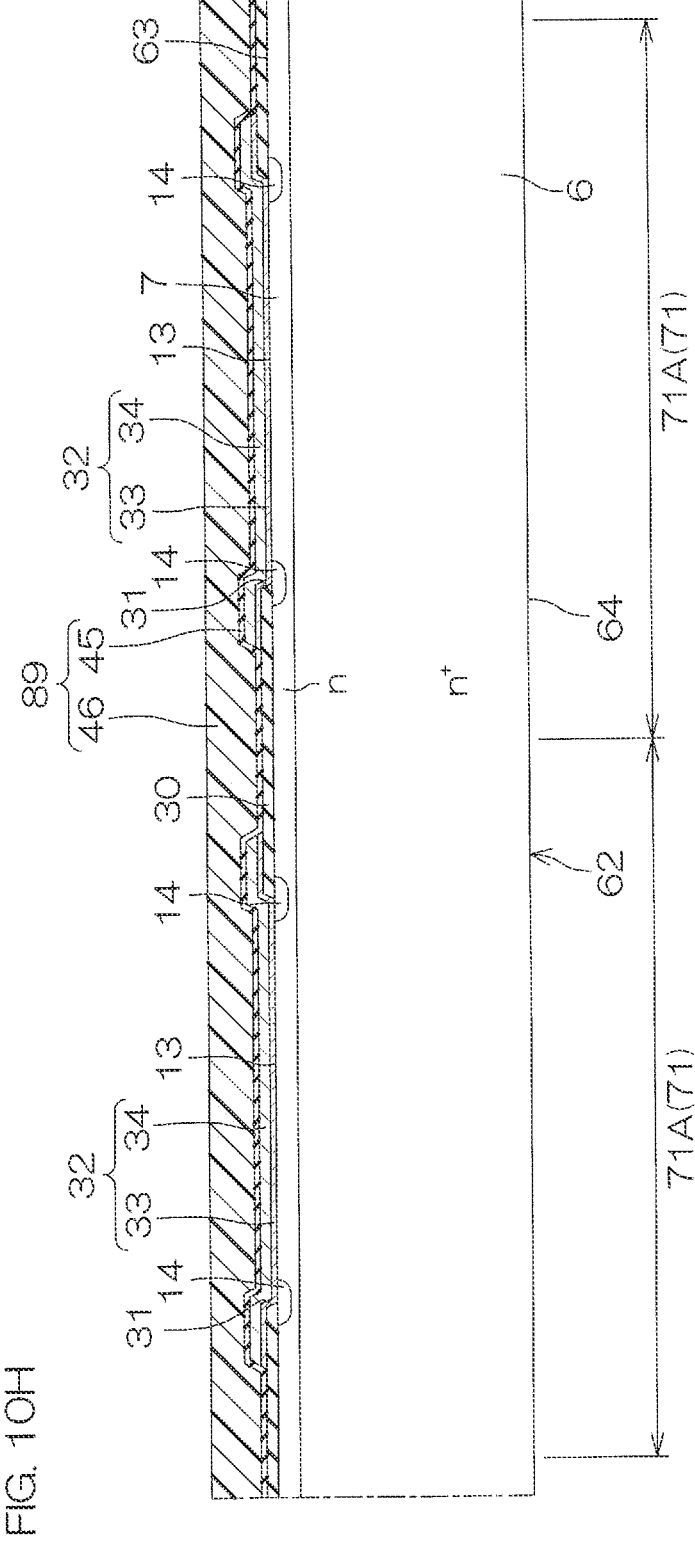
FIG. 10H is a sectional view of a step subsequent to that of FIG. 10G.
Figure 10:
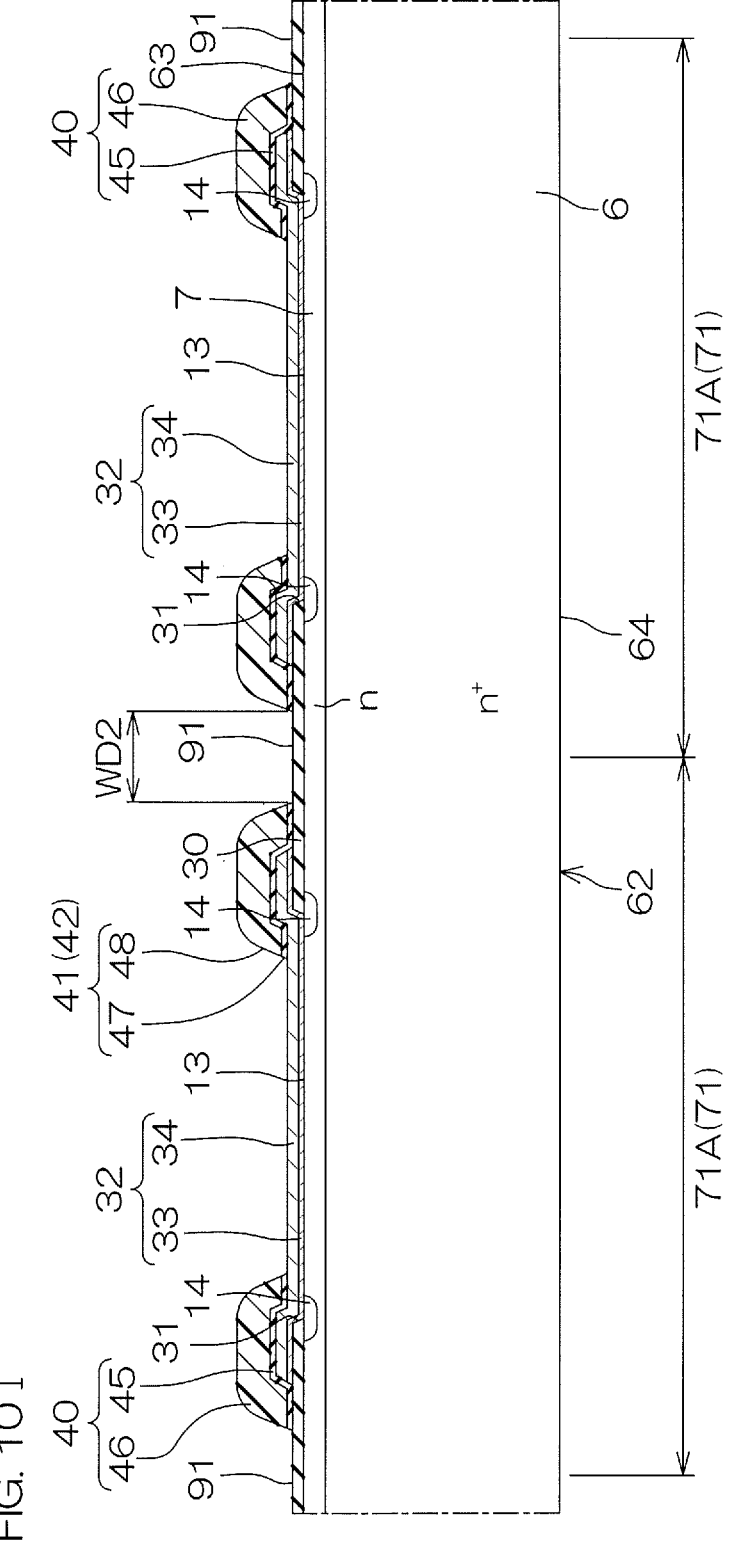
FIG. 10F is a sectional view of a step subsequent to that of FIG. 10E.
FIG. 10I is a sectional view of a step subsequent to that of FIG. 10H.
FIG. 10J is a sectional view of a step subsequent to that of FIG. 10I.
FIG. 10K is a sectional view of a step subsequent to that of FIG. 10J.
FIG. 10L is a sectional view of a step subsequent to that of FIG. 10K.
FIG. 10M is a sectional view of a step subsequent to that of FIG. 10L.
FIG. 10N is a sectional view of a step subsequent to that of FIG. 10M.
FIG. 10O is a sectional view of a step subsequent to that of FIG. 10N.
FIG. 10P is a sectional view of a step subsequent to that of FIG. 10O.
Figure 10J:
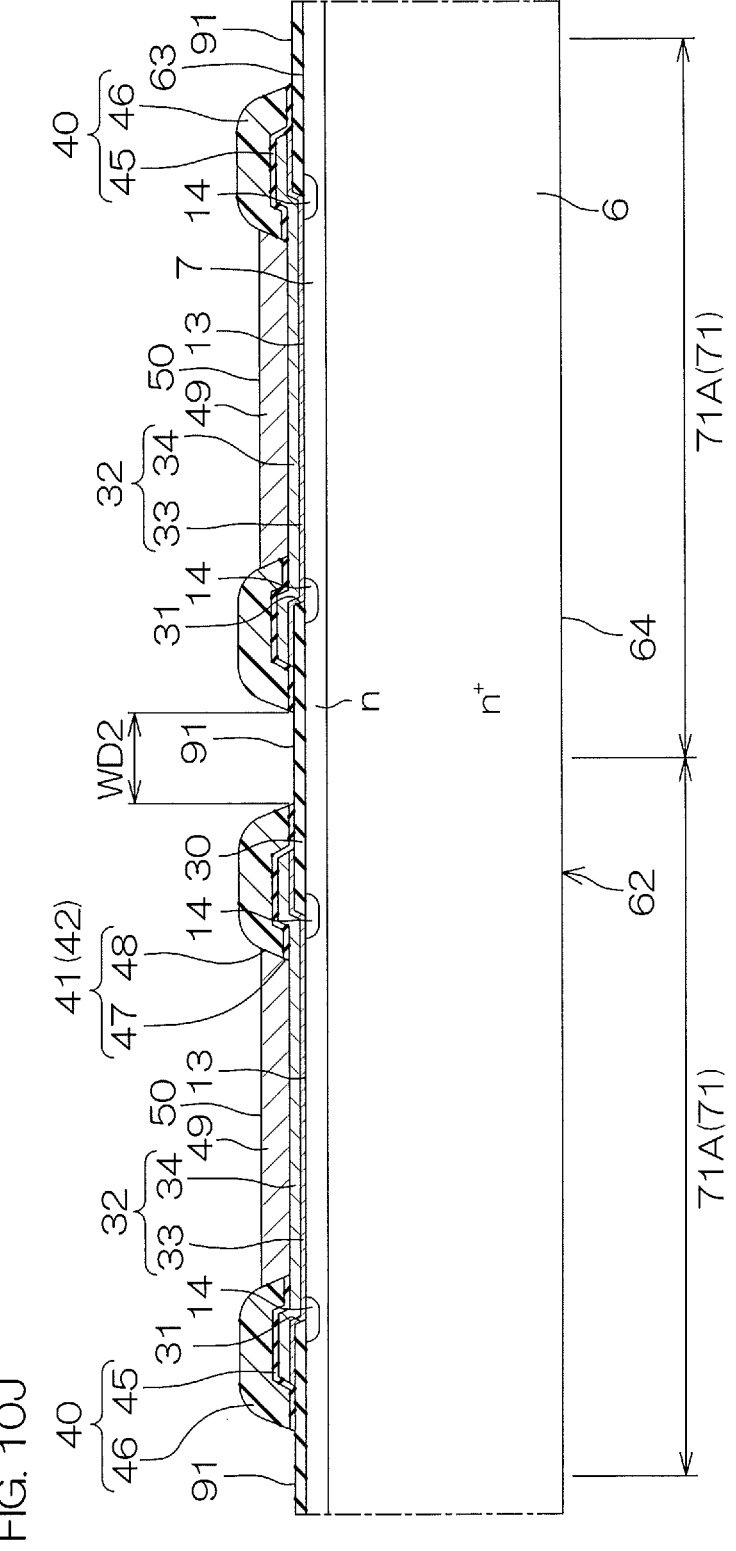
Figure 10K:
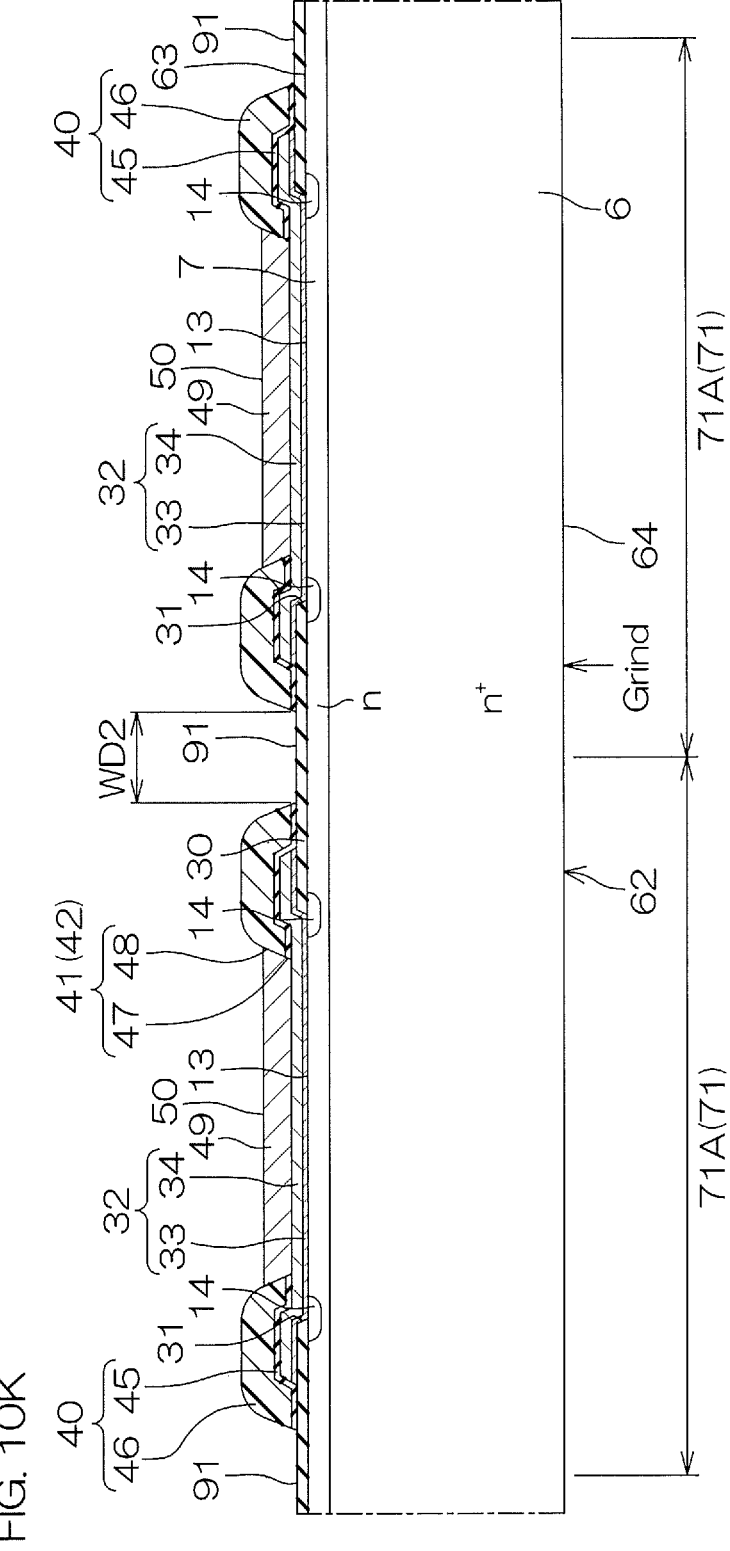
Figure 10L:
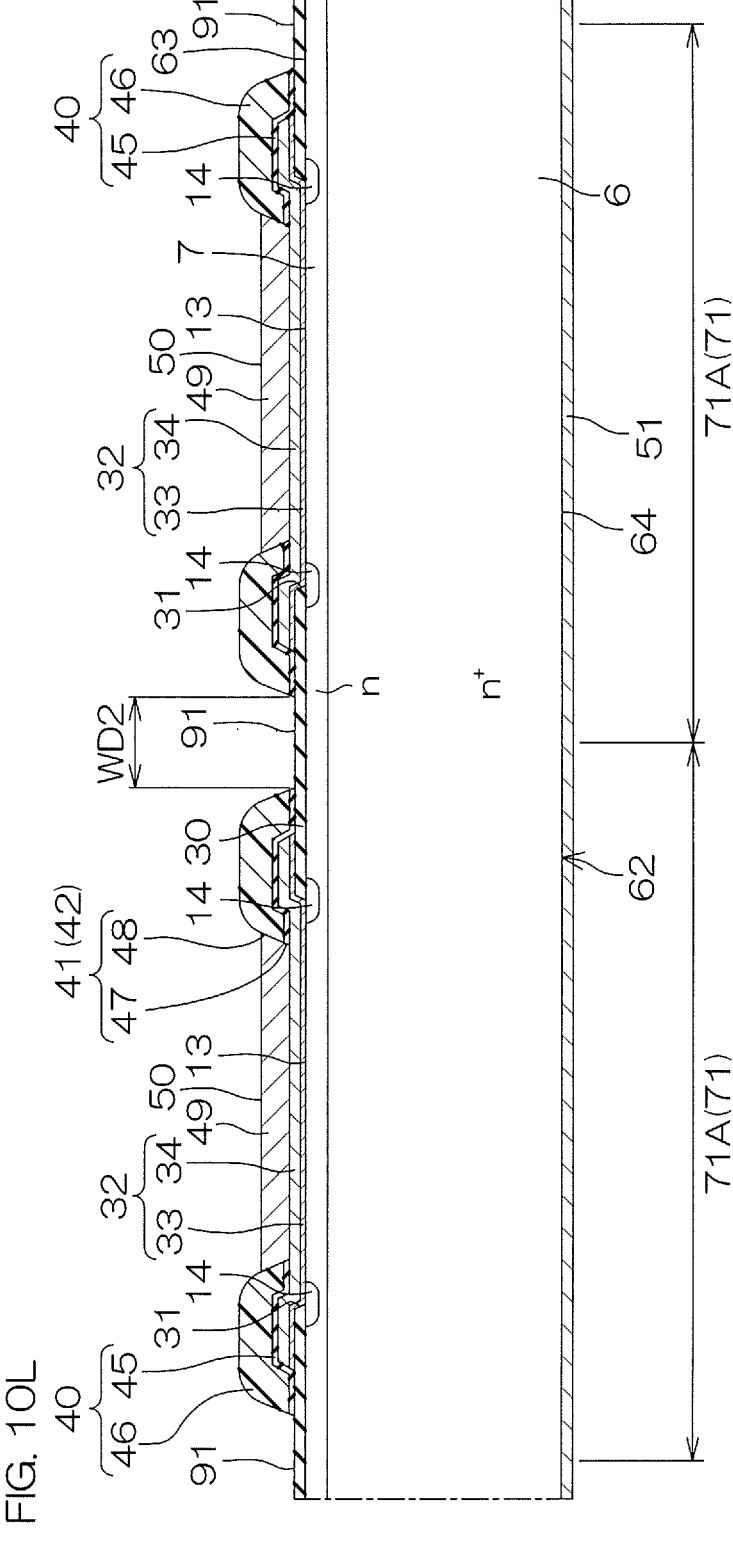
Figure 10M:
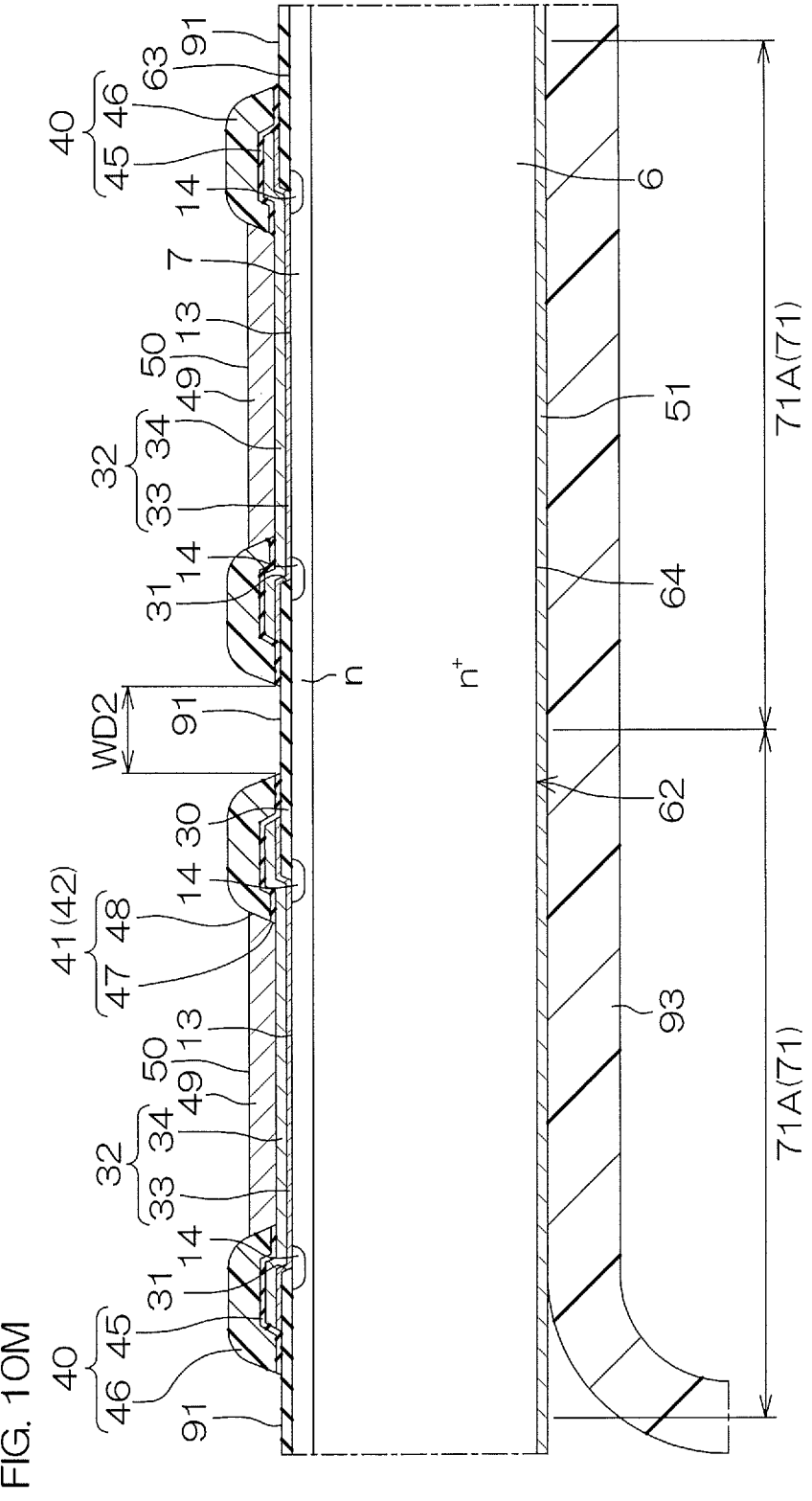
Figure 10N:
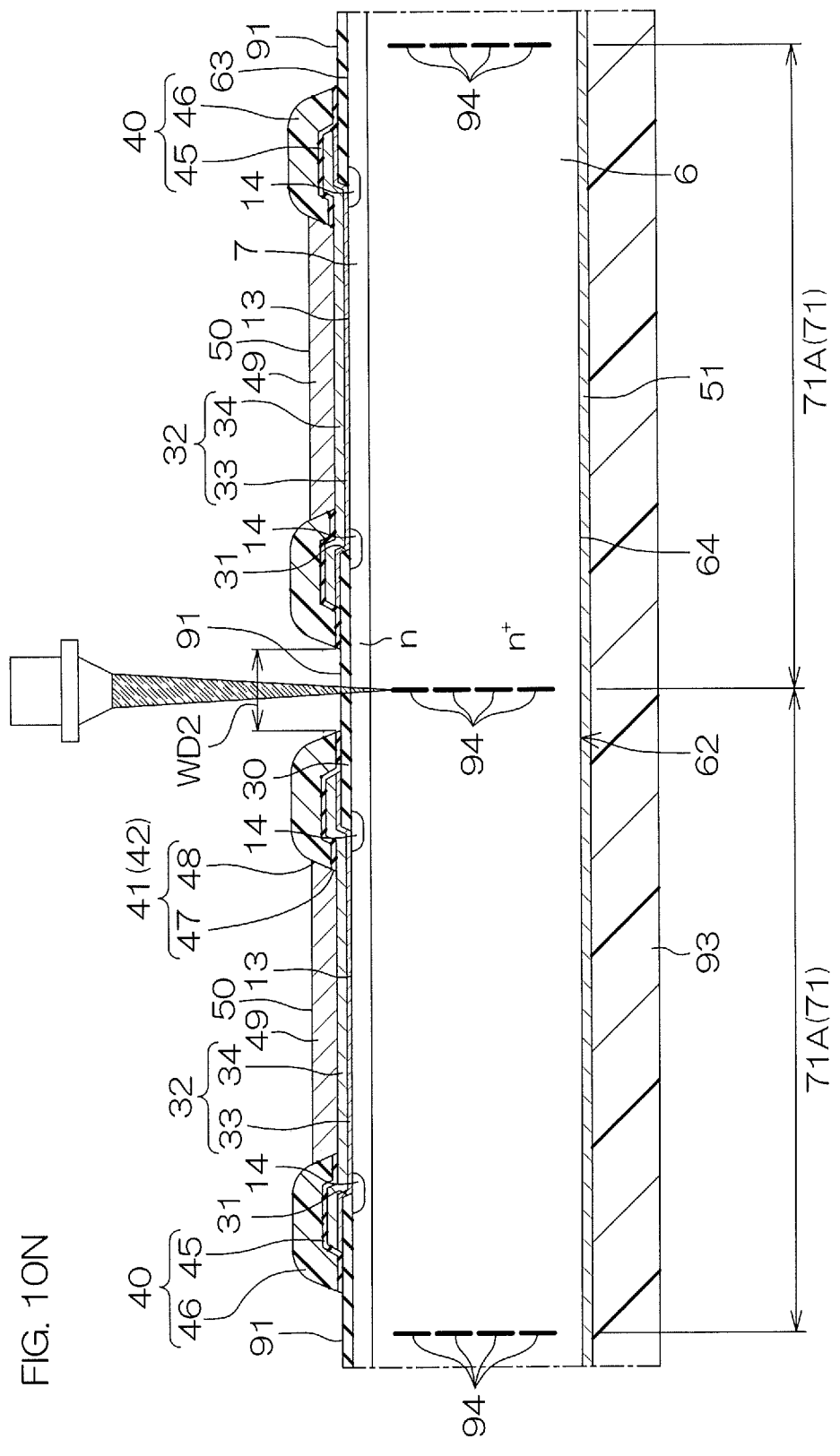
Figure 100:
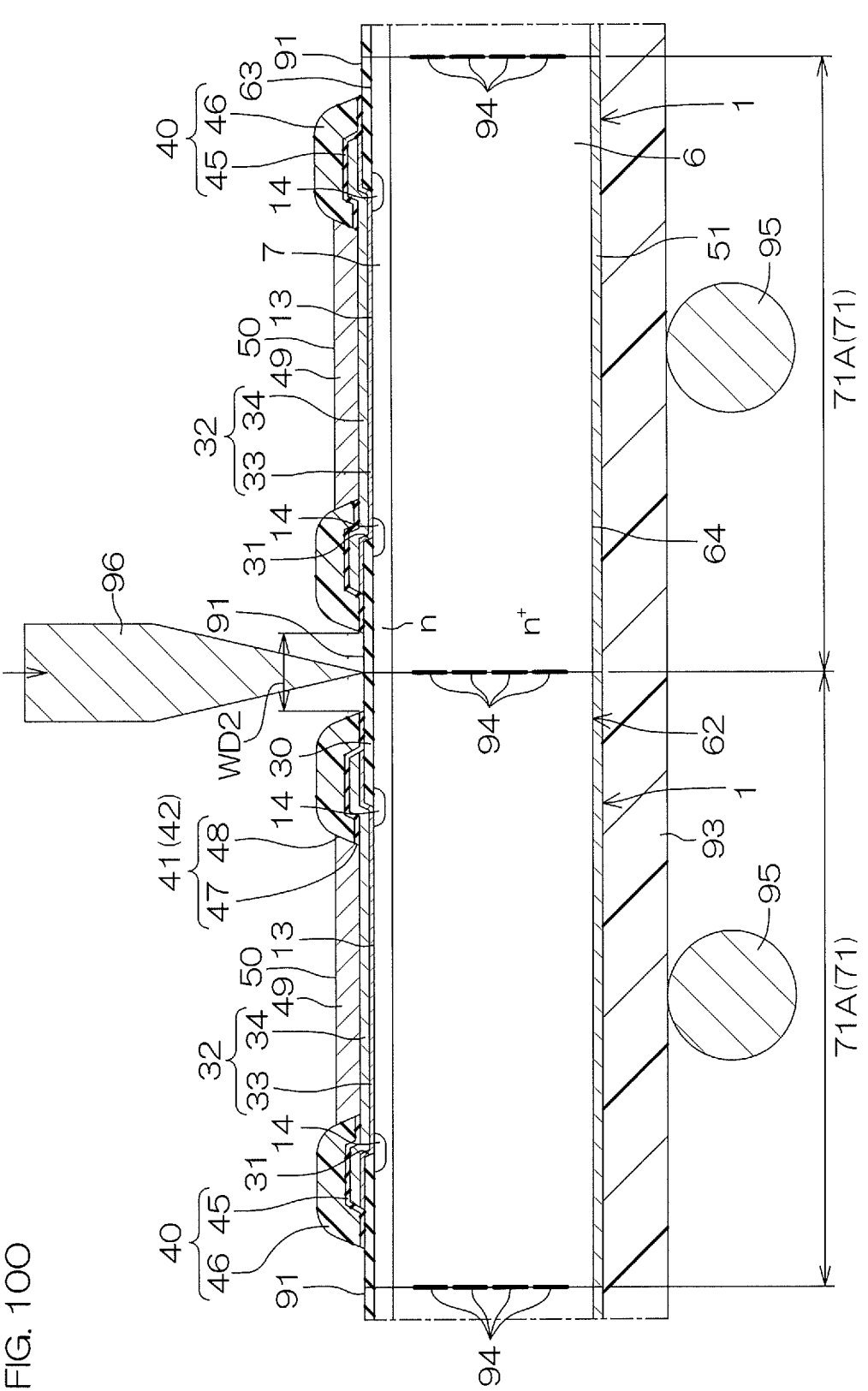
Figure 10P:
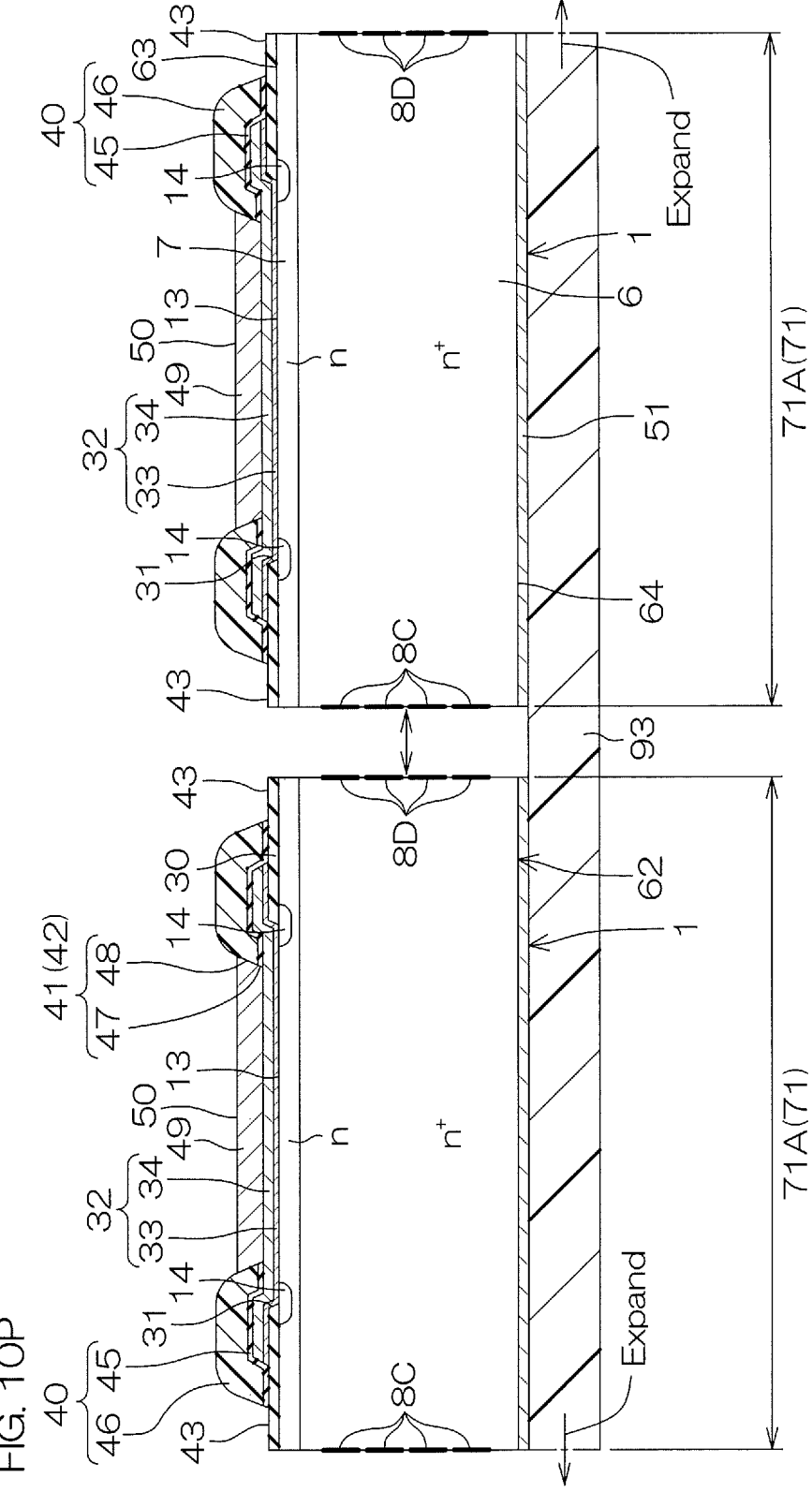
Figure 11A:
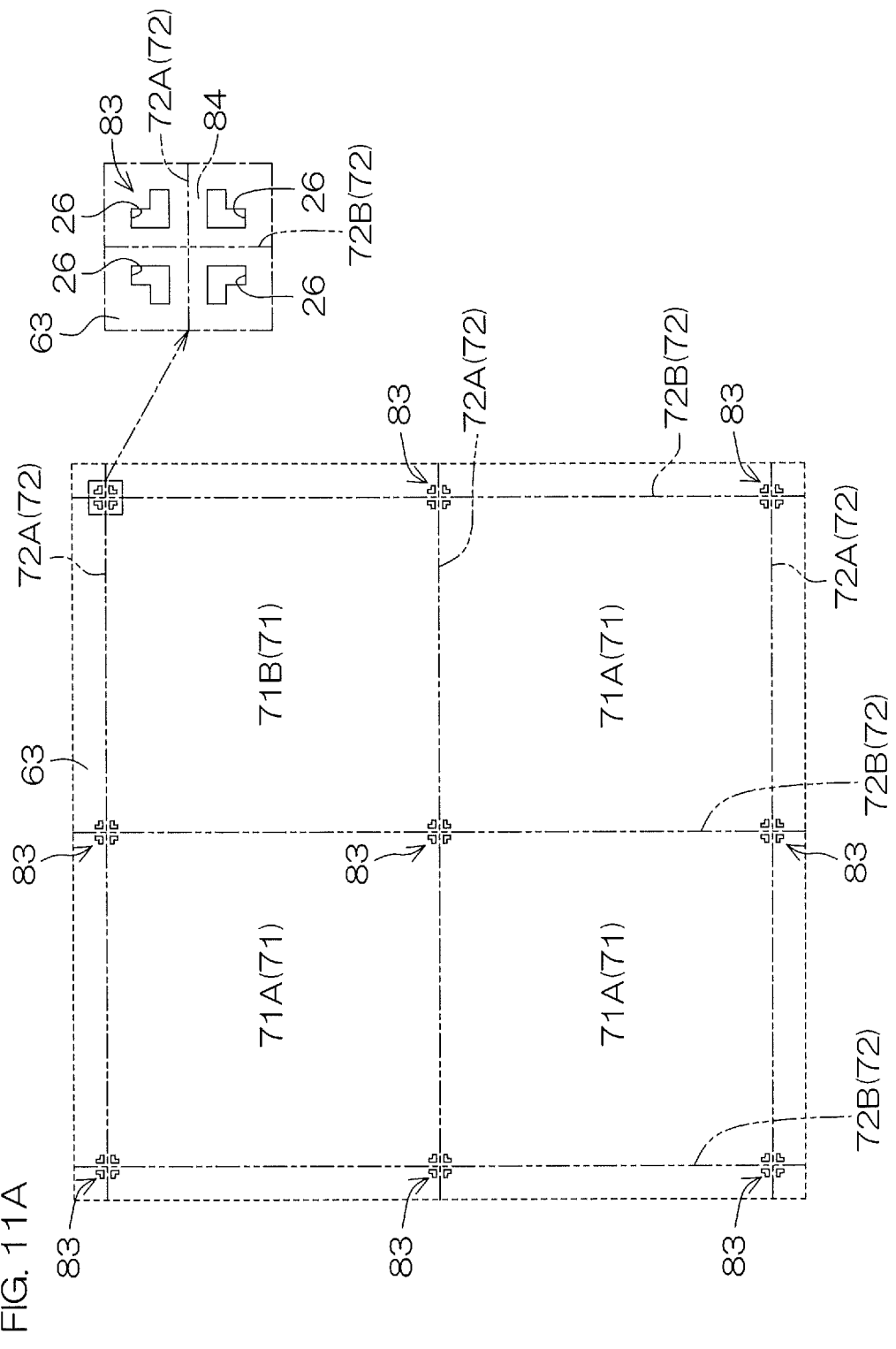
FIG. 11A is a plan view of a region of a portion of the SiC wafer and shows the example of the method for manufacturing the SiC semiconductor devices shown in FIG. 3.

FIG. 10A to FIG. 10P are sectional views of a region of a portion of the SiC wafer 62 and show an example of a method for manufacturing the SiC semiconductor devices 1 shown in FIG. 3. FIG. 11A to FIG. 11P are plan views of a region of a portion of the SiC wafer 62 and show the example of the method for manufacturing the SiC semiconductor devices 1 shown in FIG. 3. In each of FIG. 11A to FIG. 11P, a plan view of a region that includes three first chip regions 71A and one second chip region 71B is shown.

Referring to FIG. 10A and FIG. 11A, the SiC wafer 62 is prepared. Next, a plurality of the alignment trenches 26 are formed in the first wafer main surface 63. In this step, first, a hard mask (not shown) having a predetermined pattern is formed on the first wafer main surface 63. The hard mask is constituted of silicon oxide.

The hard mask is formed by a thermal oxidation treatment method or a CVD (chemical vapor deposition) method. The hard mask has a plurality of openings exposing regions at which the alignment trenches 26 are to be formed. The openings are each formed in an L shape in plan view. The openings are formed by an etching method. The etching method may be a wet etching method and/or a dry etching method.

Next, unnecessary portions of the SiC wafer 62 are removed by an etching method via the hard mask. The etching method may be a wet etching method and/or a dry etching method. The etching method is preferably a dry etching method. The alignment trenches 26 each constituted of an L shape in plan view are thereby formed in the first wafer main surface 63.

The scheduled cutting lines 72 are defined by the alignment trenches 26. Specifically, the alignment trenches 26 form a plurality of intersection pattern groups 83 each indicating an intersection of the scheduled cutting lines 72. The intersection pattern groups 83 are formed in a matrix at intervals in the a-axis direction and the m-axis direction of the SiC monocrystal.

Each intersection pattern group 83 includes four nearest neighboring alignment trenches 26. The four nearest neighboring alignment trenches 26 are formed at intervals in the a-axis direction and the m-axis direction of the SiC monocrystal. On the first wafer main surface 63, the four nearest neighboring alignment trenches 26 demarcate an intersection 84 extending in the a-axis direction and the m-axis direction of the SiC monocrystal by the outer corner portions 24. By being quadrisected, the intersection 84 becomes the L-shaped passages 25 of SiC chips 2.

A width of the intersection 84 may exceed 0 μm and be not more than 400 μm. The width of the intersection 84 may exceed 0 μm and be not more than 20 μm, be not less than 20 μm and not more than 40 μm, be not less than 40 μm and not more than 100 μm, be not less than 100 μm and not more than 200 μm, be not less than 200 μm and not more than 300 μm, or be not less than 300 μm and not more than 400 μm.

The scheduled cutting lines 72 of lattice shape that pass through the intersections 84 of the respective intersection pattern groups 83 in plan view are thereby defined. Also, the first chip regions 71A respectively having one alignment trench 26 at each of four corners in plan view are demarcated by the scheduled cutting lines 72. Also, the second chip regions 71B respectively having one alignment trench 26 at each of four corners in plan view are demarcated by the scheduled cutting lines 72.

Figure 11B:
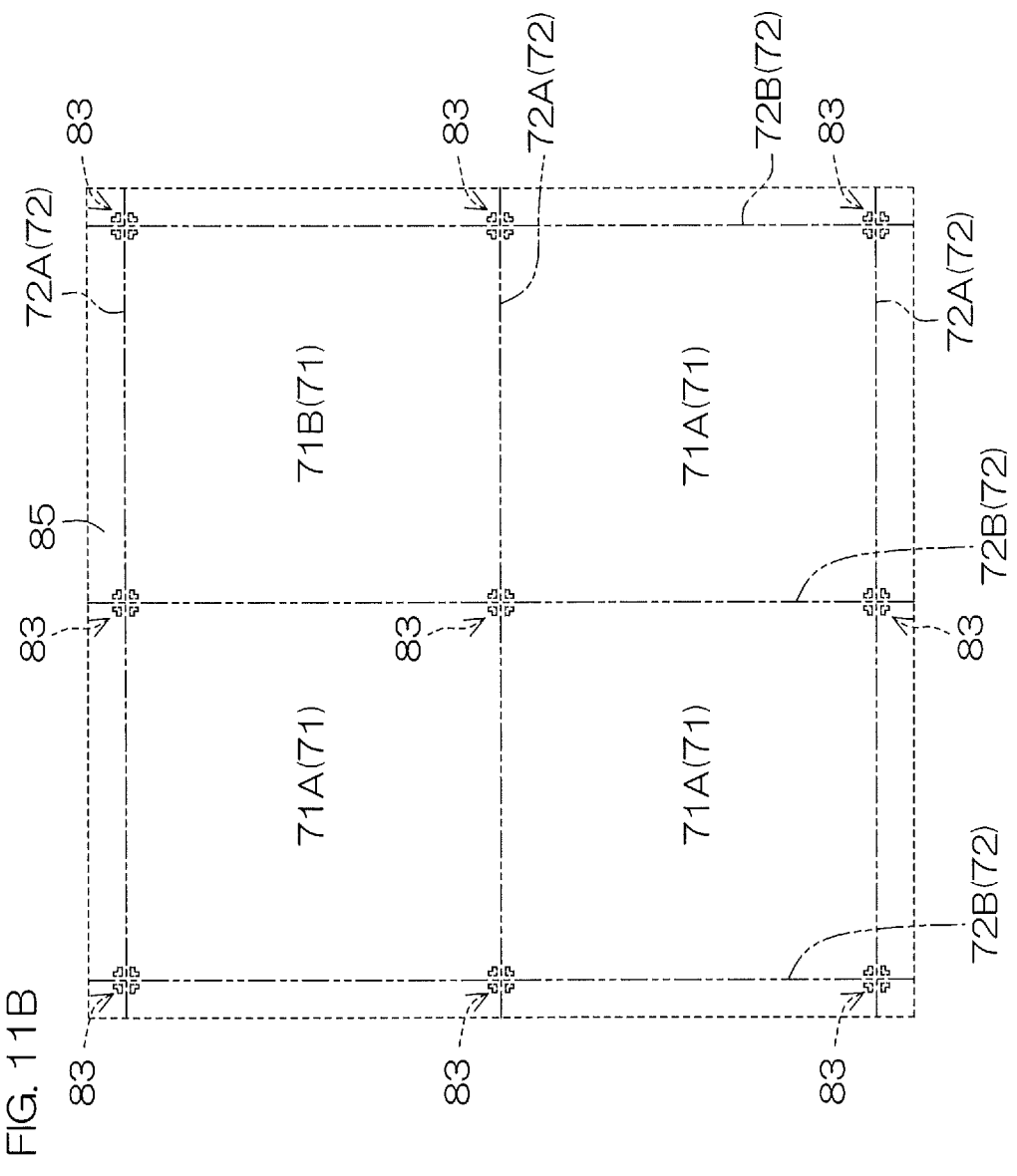
FIG. 11B is a plan view of a step subsequent to that of FIG. 11A.

Next, referring to FIG. 10B and FIG. 11B, a base insulating layer 85 that is to be a base of the insulators 27 is formed on the first wafer main surface 63. The base insulating layer 85 fills the alignment trenches 26 and covers the first wafer main surface 63. The base insulating layer 85 is formed by a thermal oxidation treatment method and/or a CVD method.

Next, a portion of the base insulating layer 85 covering the first wafer main surface 63 is removed by an etching method. The etching method may be a wet etching method and/or a dry etching method. The alignment patterns 20 including the alignment trenches 26 and the insulators 27 are thereby formed.

Figure 11C:
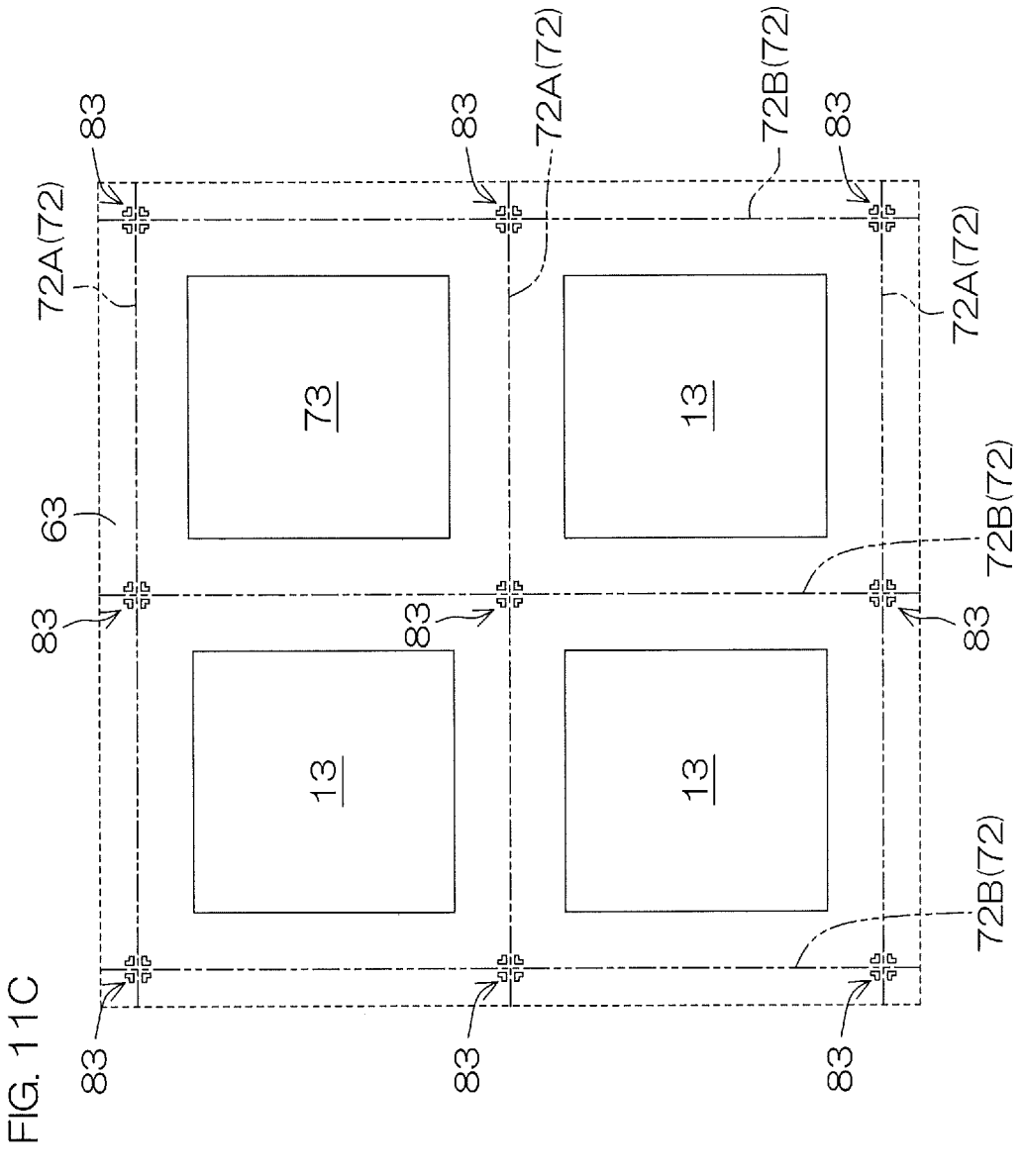
FIG. 11C is a plan view of a step subsequent to that of FIG. 11B.

Next, referring to FIG. 10C and FIG. 11C, main portions of the SBDs 12 (here, the diode regions 13 and the guard regions 14) are formed in the first chip regions 71A and semiconductor portions (for example, semiconductor portions, etc., of SBDs or MISFETs) of the monitor patterns 73 are formed in the second chip regions 71B. This step may include a step of selectively introducing an n-type impurity and/or a p-type impurity into the first chip regions 71A and the second chip regions 71B. The n-type impurity and/or the p-type impurity may be introduced into the SiC wafer 62 by an ion implantation method via an ion implantation mask (not shown).

Figure 11D:
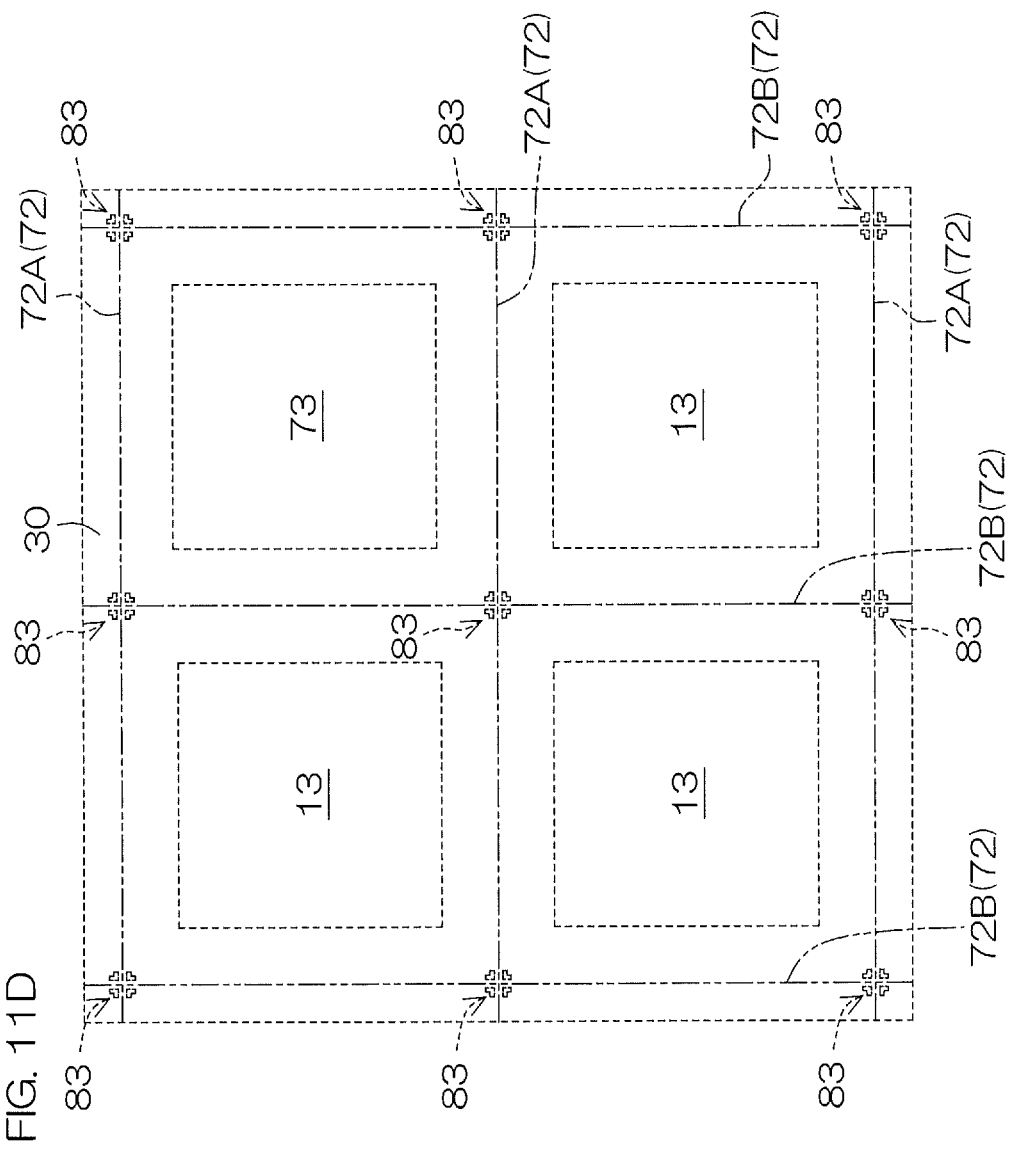
FIG. 11D is a plan view of a step subsequent to that of FIG. 11C.

Next, referring to FIG. 10D and FIG. 11D, the interlayer insulating layer 30 is formed on the first wafer main surface 63. The interlayer insulating layer 30 covers the first chip regions 71A and the second chip regions 71B. The interlayer insulating layer 30 includes silicon oxide. The interlayer insulating layer 30 is formed by a thermal oxidation treatment method or a CVD method.

Figure 11E:
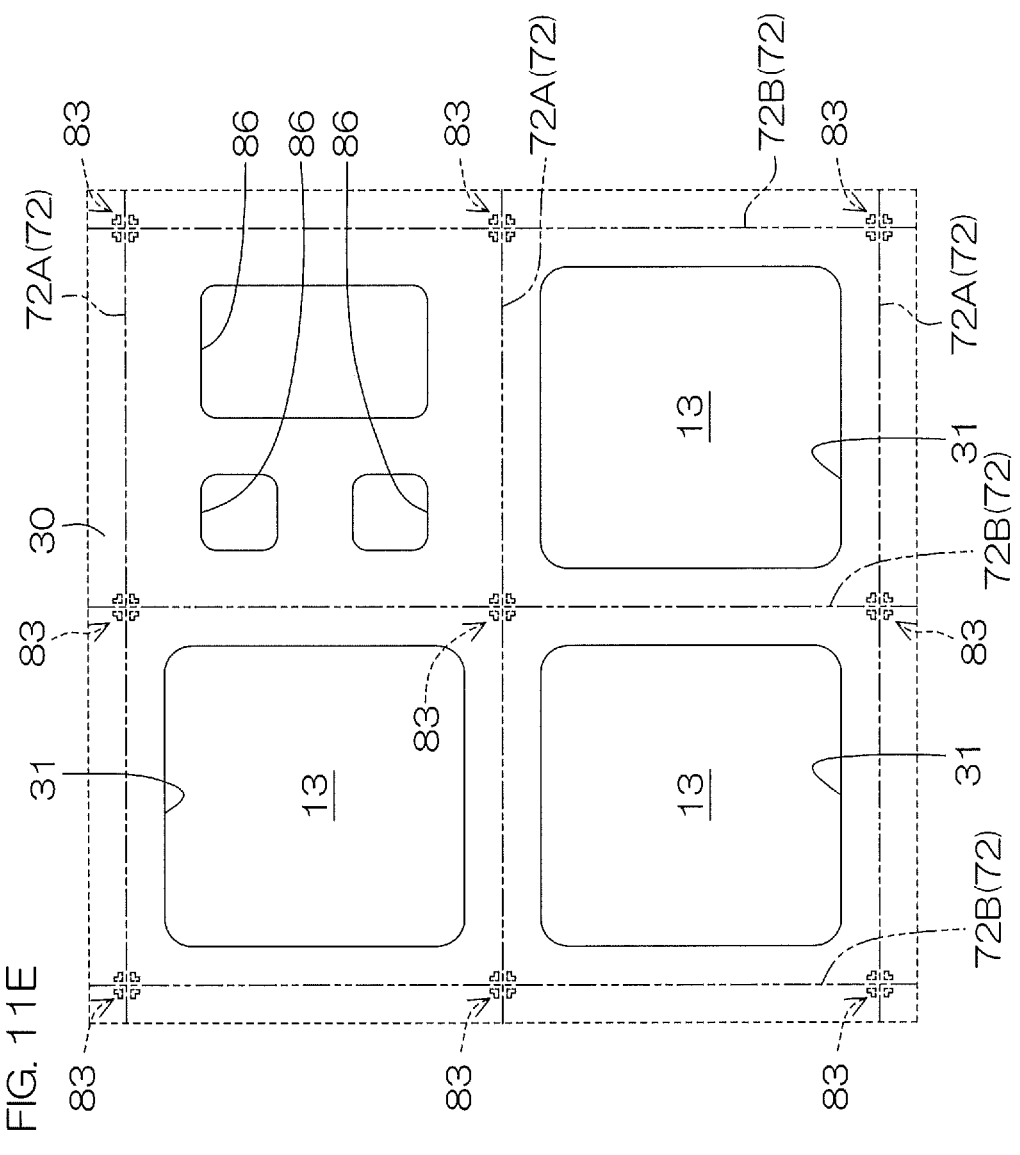
FIG. 11E is a plan view of a step subsequent to that of FIG. 11D.

Next, referring to FIG. 10E and FIG. 11E, a plurality of the contact openings 31 and a plurality of monitor contact openings 86 are formed in the interlayer insulating layer 30. The contact openings 31 are respectively formed in portions of the interlayer insulating layer 30 covering the first chip regions 71A. The monitor contact openings 86 are respectively formed in portions of the interlayer insulating layer 30 covering the second chip regions 71B. The number of monitor contact openings 86 in each second chip region 71B is arbitrary and is adjusted in accordance with the monitor pattern 73 formed in the second chip region 71B.

The contact openings 31 and the monitor contact openings 86 are formed by removing unnecessary portions of the interlayer insulating layer 30 by an etching method via a resist mask (not shown). The etching method may be a wet etching method and/or a dry etching method.

Figure 11F:
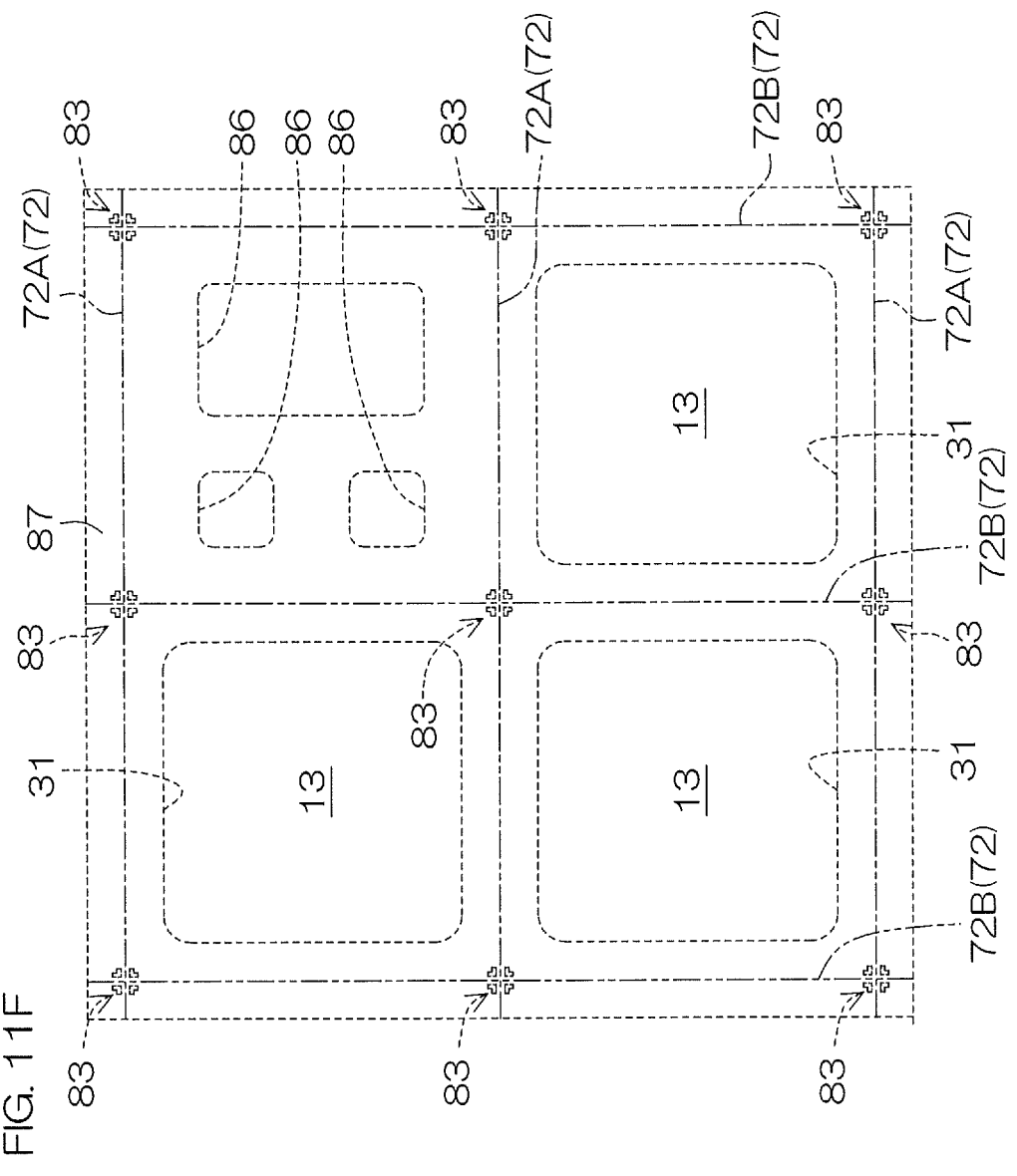
FIG. 11F is a plan view of a step subsequent to that of FIG. 11E.

Next, referring to FIG. 10F and FIG. 11F, a first base main surface electrode 87 is formed on the first wafer main surface 63. The first base main surface electrode 87 has a laminated structure that includes the barrier layer 33 and the main body layer 34. The barrier layer 33 and the main body layer 34 may respectively be formed by a sputter method and/or a vapor deposition method.

Figure 11G:
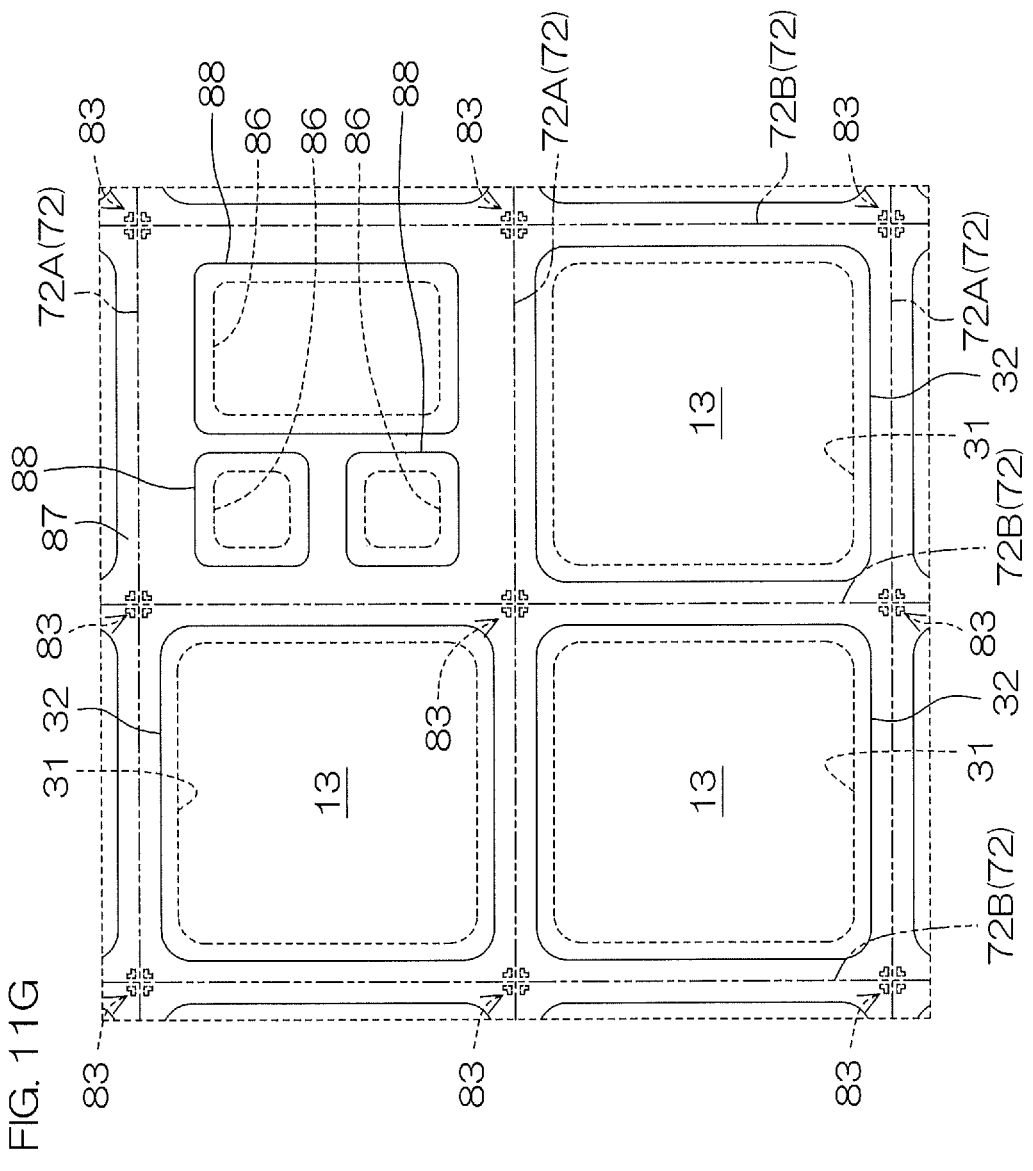
FIG. 11G is a plan view of a step subsequent to that of FIG. 11F.

Next, referring to FIG. 10G and FIG. 11G, unnecessary portions of the first base main surface electrode 87 are removed and a plurality of the first main surface electrodes 32 are formed respectively in the chip regions 71. Hereinafter, the first main surface electrodes 32 formed in the second chip regions 71B shall be referred to as monitor main surface electrodes 88. The unnecessary portions of the first base main surface electrode 87 may be removed by an etching method via a resist mask (not shown). The etching method may be a wet etching method and/or a dry etching method.

The first main surface electrodes 32 cover the first chip regions 71A respectively such as to expose the scheduled cutting lines 72. The first main surface electrodes 32 also expose the alignment trenches 26 (intersection pattern groups 83). The first main surface electrodes 32 are electrically connected to the diode regions 13 and the guard regions 14 in the corresponding first chip regions 71A.

The monitor main surface electrodes 88 cover the second chip regions 71B respectively such as to expose the scheduled cutting lines 72. The monitor main surface electrodes 88 also expose the alignment trenches 26 (intersection pattern groups 83). The monitor main surface electrodes 88 are electrically connected to the semiconductor regions, etc., in the corresponding second chip regions 71B. The number of monitor main surface electrodes 88 in each second chip region 71B is arbitrary and is adjusted in accordance with the monitor pattern 73 formed in the second chip region 71B.

Figure 11H:
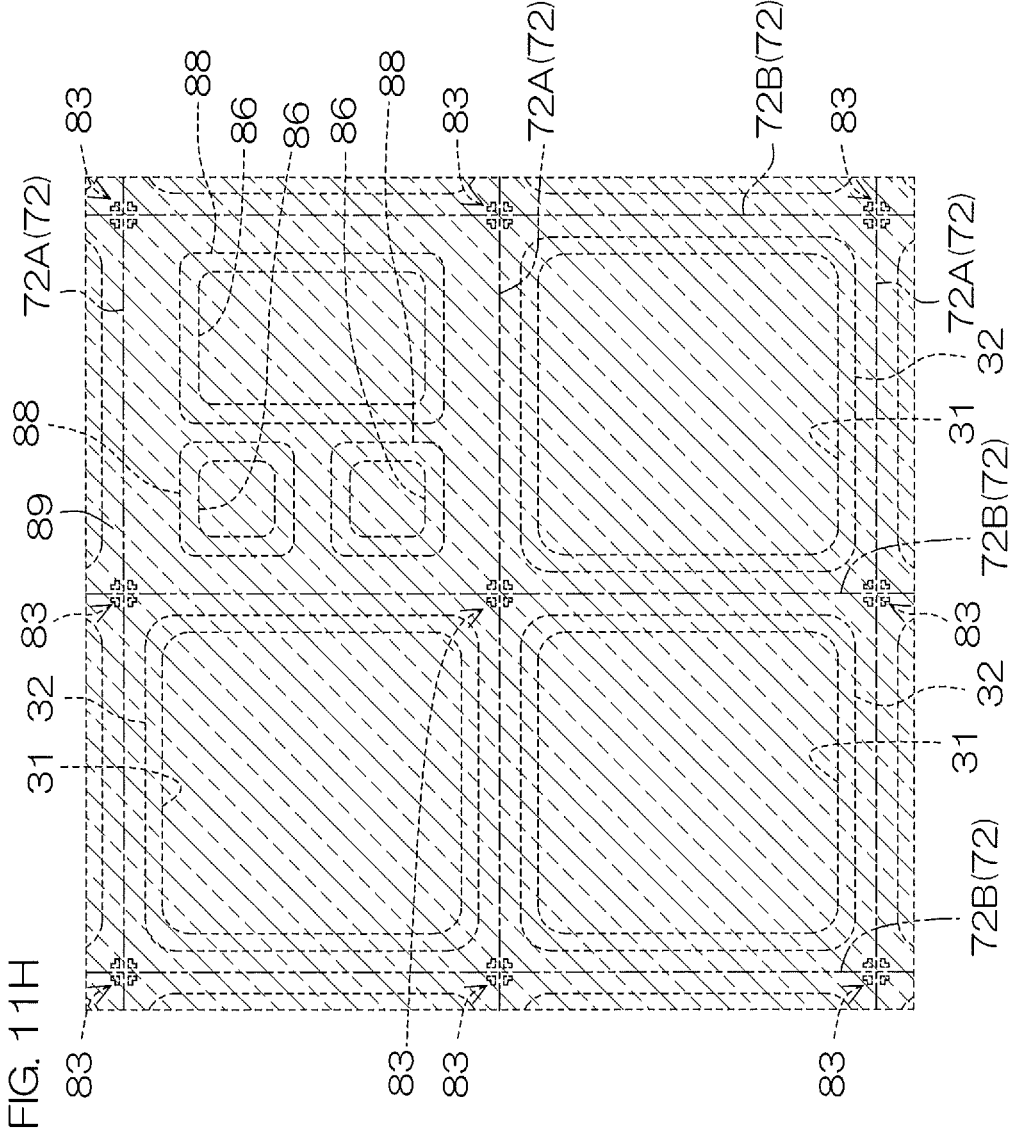
FIG. 11H is a plan view of a step subsequent to that of FIG. 11G.
Figure 11:
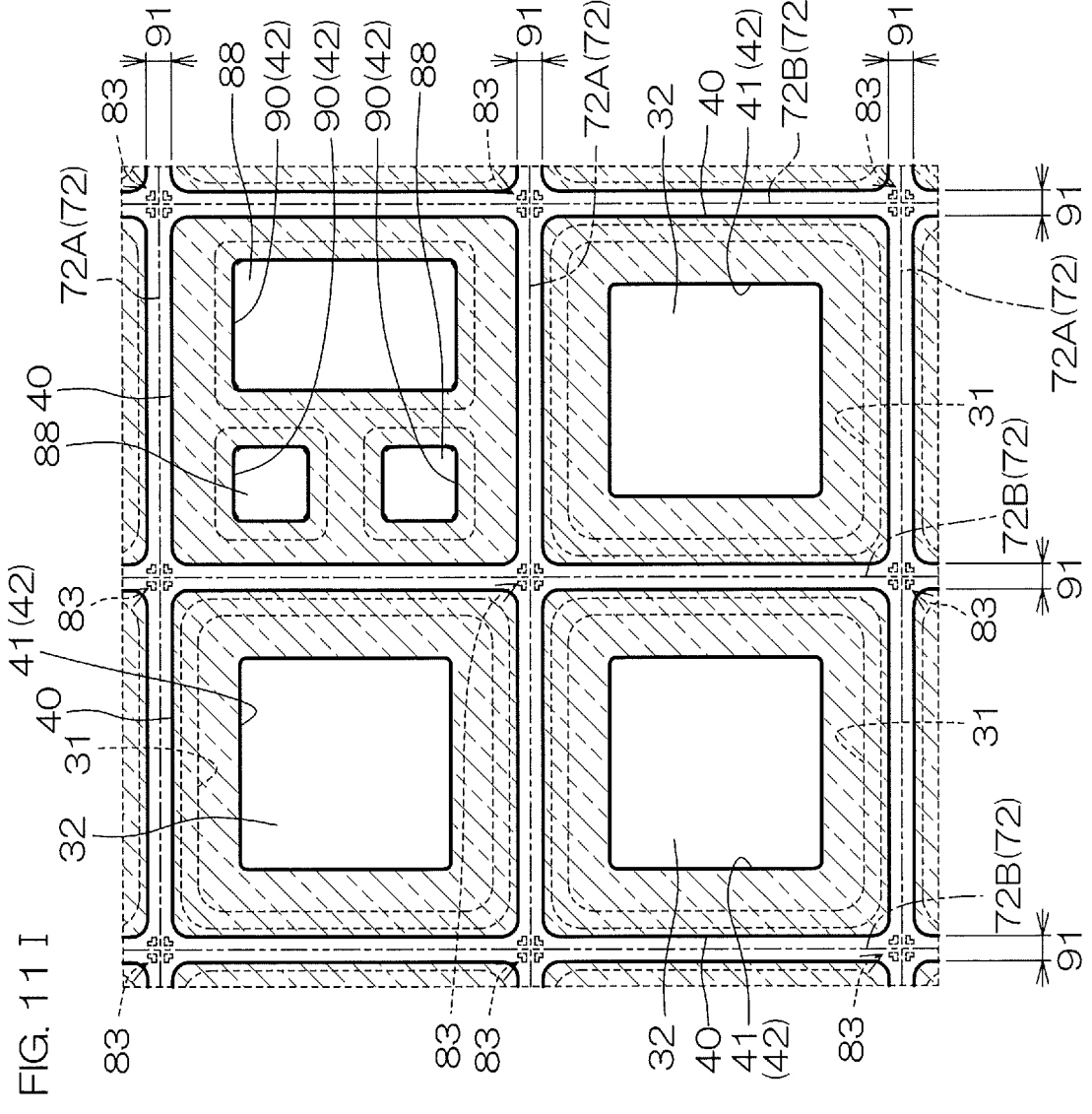
FIG. 11I is a plan view of a step subsequent to that of FIG. 11H.
FIG. 11J is a plan view of a step subsequent to that of FIG. 11I.
FIG. 11K is a plan view of a step subsequent to that of FIG. 11J.
FIG. 11L is a plan view of a step subsequent to that of FIG. 11K.
FIG. 11M is a plan view of a step subsequent to that of FIG. 11L.
FIG. 11N is a plan view of a step subsequent to that of FIG. 11M.
FIG. 11O is a plan view of a step subsequent to that of FIG. 11N.
FIG. 11P is a plan view of a step subsequent to that of FIG. 11O.

Next, referring to FIG. 10H and FIG. 11H, a base insulating layer 89 that is to be a base of the insulating layers 40 is formed on the first wafer main surface 63. The insulating layers 40 each have the laminated structure that includes the passivation layer 45 and the resin layer 46. The passivation layer 45 includes silicon nitride. The passivation layer 45 may be formed by a CVD method. The resin layer 46 includes a photosensitive resin (polybenzoxazole in this embodiment). The resin layer 46 may be formed by coating the photosensitive resin onto the passivation layer 45.

Next, referring to FIG. 10I and FIG. 11I, a plurality of the pad openings 41, a plurality of monitor pad openings 90, and dicing streets 91 are formed in the base insulating layer 89 and, at the same time, the base insulating layer 89 is divided into a plurality of the insulating layers 40.

In this step, first, the resin layer 46 is selectively exposed and thereafter developed. The second openings 48 and the dicing streets 91 are thereby formed in the resin layer 46. Next, portions of the passivation layer 45 exposed from the resin layer 46 are removed by an etching method. The etching method may be a wet etching method and/or a dry etching method. The first openings 47 and the dicing streets 91 are thereby formed in the passivation layer 45. Also, the base insulating layer 89 is thereby divided into the insulating layers 40.

The pad openings 41 are each formed by a first opening 47 and a second opening 48. The pad openings 41 expose the corresponding first main surface electrodes 32. The monitor pad openings 90 are each formed by a first opening 47 and a second opening 48. The monitor pad openings 90 expose the corresponding monitor main surface electrodes 88. The number of monitor pad openings 90 is arbitrary and is adjusted in accordance with the monitor pattern 73 (monitor main surface electrode 88) formed in the second chip region 71B.

The dicing streets 91 are demarcated by the peripheral edges of the insulating layers 40 and are formed in a lattice extending along the scheduled cutting lines 72 in plan view. The dicing streets 91 expose the scheduled cutting lines 72 in plan view. Further, the dicing streets 91 expose the alignment trenches 26 (intersection pattern groups 83) in plan view.

An accessory pattern other than the alignment trenches 26 (intersection pattern groups 83) is not formed in portions of the first wafer main surface 63 exposed from the dicing streets 91. Also, an accessory pattern is not formed in a portion of the interlayer insulating layer 30 exposed from the dicing streets 91.

A width WD2 of the dicing streets 91 may be not less than 2 μm and not more than 100 μm. The width WD2 is a width in a direction orthogonal to a direction in which each dicing street 91 extends. The width WD2 may be not less than 2 μm and not more than 20 μm, not less than 20 μm and not more than 40 μm, not less than 40 μm and not more than 60 μm, not less than 60 μm and not more than 80 μm, or not less than 80 μm and not more than 100 μm.

The width WD2 is preferably not less than 10% and not more than 50% of the final thickness TW of the SiC wafer 62. The width WD2 may be not less than 10% and not more than 15%, not less than 15% and not more than 20%, not less than 20% and not more than 25%, not less than 25% and not more than 30%, not less than 30% and not more than 35%, not less than 35% and not more than 40%, not less than 40% and not more than 45%, or not less than 45% and not more than 50% of the final thickness TW of the SiC wafer 62. The width WD2 is preferably not less than 10% and not more than 30% of the final thickness TW of the SiC wafer 62.

With the dicing streets 91, the interference of laser light by the insulating layers 40 can be suppressed when irradiating the laser light to the interior of the SiC wafer 62. In particular, by making the width WD2 of the dicing streets 91 not less than 10% and not more than 50% of the final thickness TW of the SiC wafer 62, the interference of laser light by the insulating layers 40 can be suppressed appropriately. Thereby, the undesired refraction of the laser light due to the difference in the refractive indices of the insulating layers 40 and air can be suppressed and the laser light can be focused on the appropriate region in the SiC wafer 62. Consequently, the first to fourth modified regions 8A to 8D can be formed appropriately in a subsequent step.

The peripheral edges of each insulating layer 40 have the inclined surfaces 44 that are inclined downward from the main surface of the insulating layer 40 toward the interlayer insulating layer 30. The inclined surfaces 44 may be formed in curved shapes recessed toward the SiC wafer 62 side. The angle θ2 of each inclined surface 44 may be not less than 30° and not more than 60°. The angle θ2 is the angle that the straight line joining the start point and the end point of the inclined surface 44 forms with the first main surface 3 within the insulating layer 40.

The angle θ2 may be not less than 30° and not more than 35°, not less than 35° and not more than 40°, not less than 40° and not more than 45°, not less than 45° and not more than 50°, not less than 50° and not more than 55°, or not less than 55° and not more than 60°. The angle θ2 is preferably not less than 40° and not more than 50°.

By making the peripheral edges of the insulating layers 40 be the inclined surfaces 44, the interference of laser light by the insulating layers 40 can be suppressed when irradiating the laser light to the interior of the SiC wafer 62. In particular, by making the angle θ2 of the insulating layer 40 not less than 30° and not more than 60°, the interference of laser light by the insulating layers 40 can be suppressed appropriately. Thereby, the undesired refraction of the laser light due to the difference in the refractive indices of the insulating layers 40 and air can be suppressed and the laser light can be focused on the appropriate region in the SiC wafer 62. Consequently, the first to fourth modified regions 8A to 8D can be formed appropriately in the subsequent step.

The width WD2 of the dicing streets 91 extending in the a-axis direction may be equal to or may differ from the width WD2 of dicing streets 91 extending in the m-axis direction. For example, the width WD2 of the dicing streets 91 extending in the a-axis direction may be less than the width WD2 of dicing streets 91 extending in the m-axis direction. In this case, the total number of the chip regions 71 can be increased.

Figure 11J:
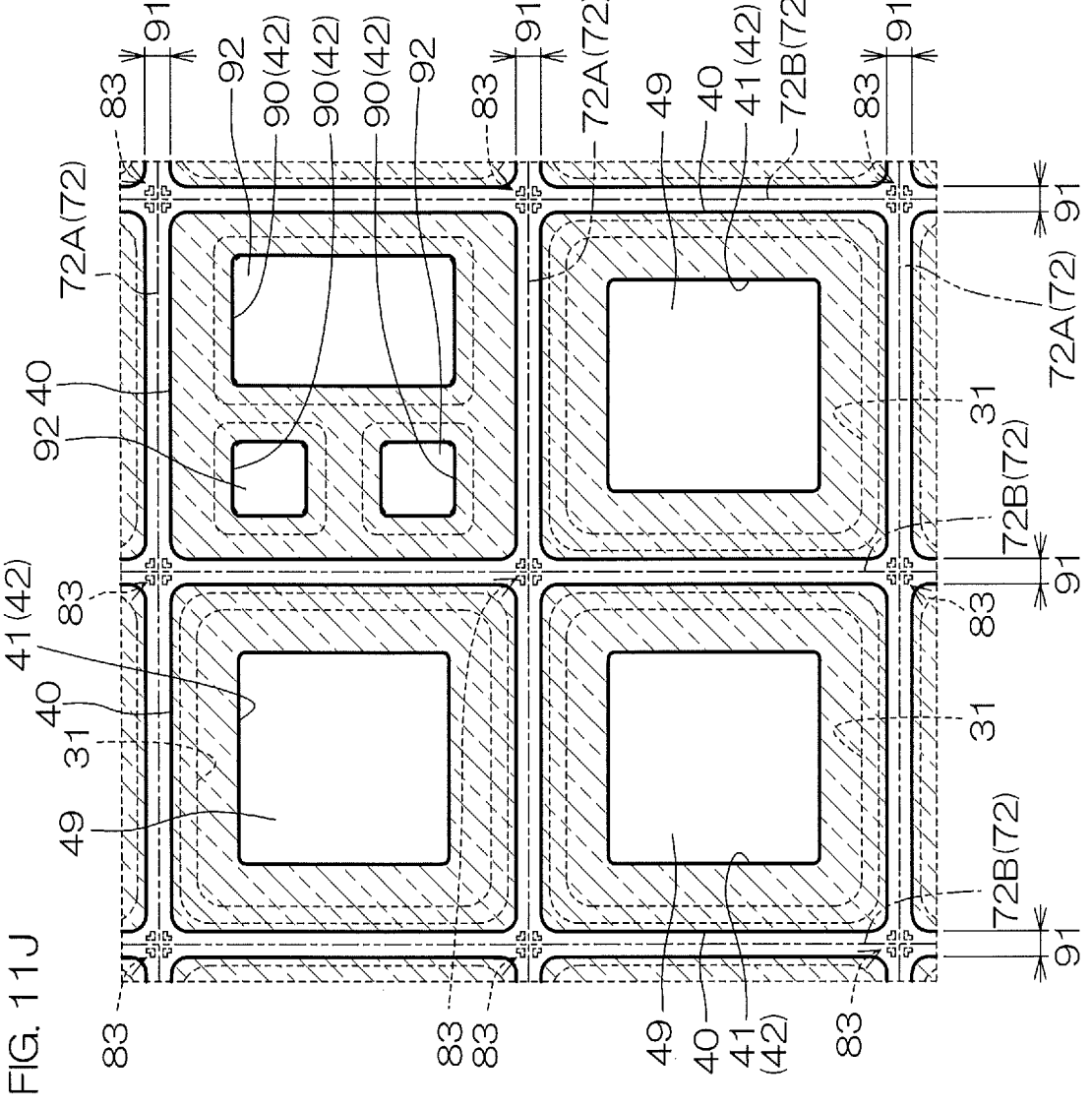

Next, referring to FIG. 10J and FIG. 11J, a plurality of the pad electrodes 49 are respectively formed on the corresponding first main surface electrodes 32 and a plurality of monitor pad electrodes 92 are respectively formed on the corresponding monitor main surface electrodes 88. The pad electrodes 49 and the monitor pad electrodes 92 may respectively be formed by a plating method.

Figure 11K:
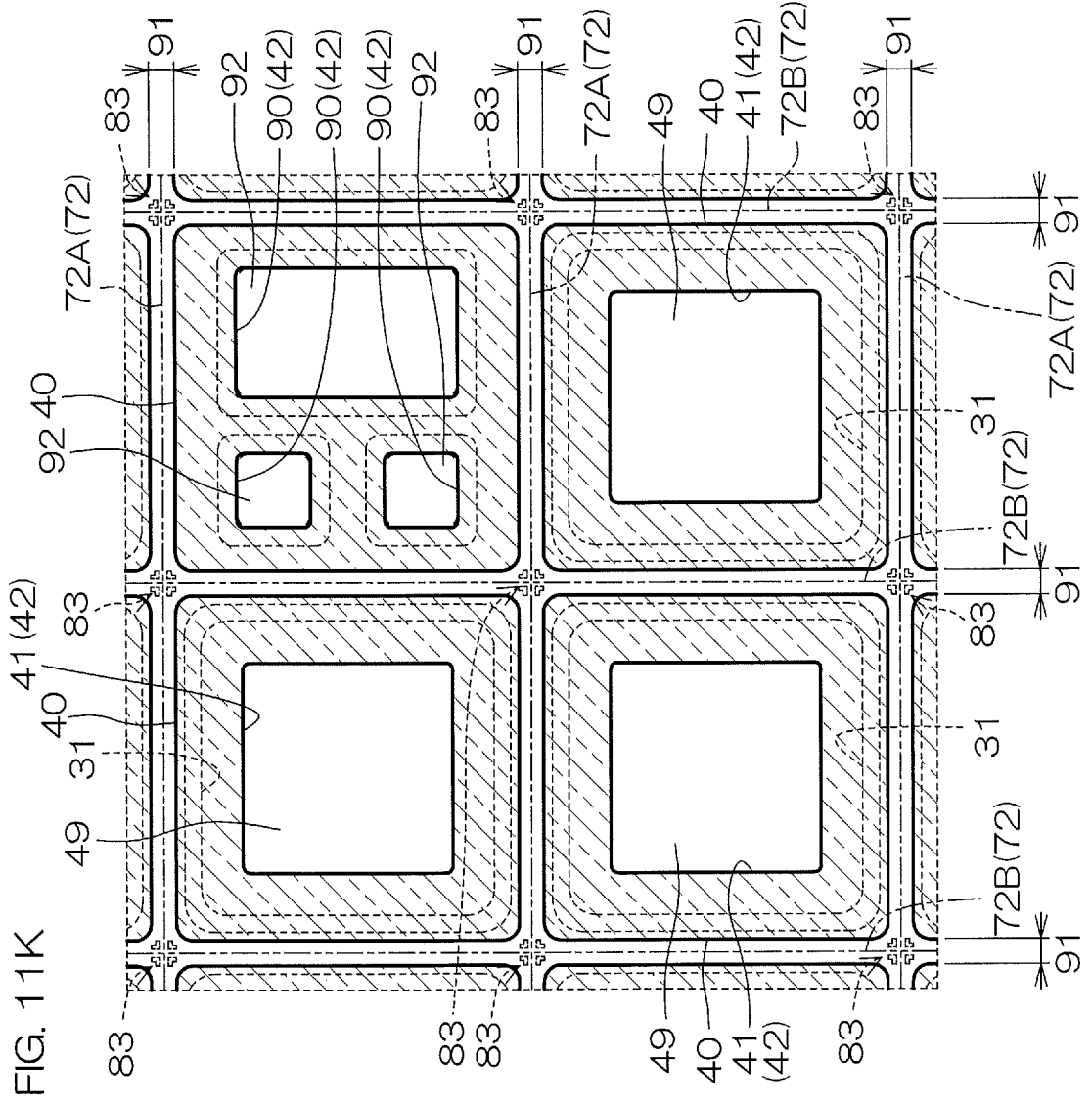

Next, referring to FIG. 10K and FIG. 11K, the second wafer main surface 64 is ground. The second wafer main surface 64 may be ground by a CMP (chemical mechanical polishing) method. The SiC wafer 62 is thereby thinned until it is of a desired thickness.

Figure 11L:
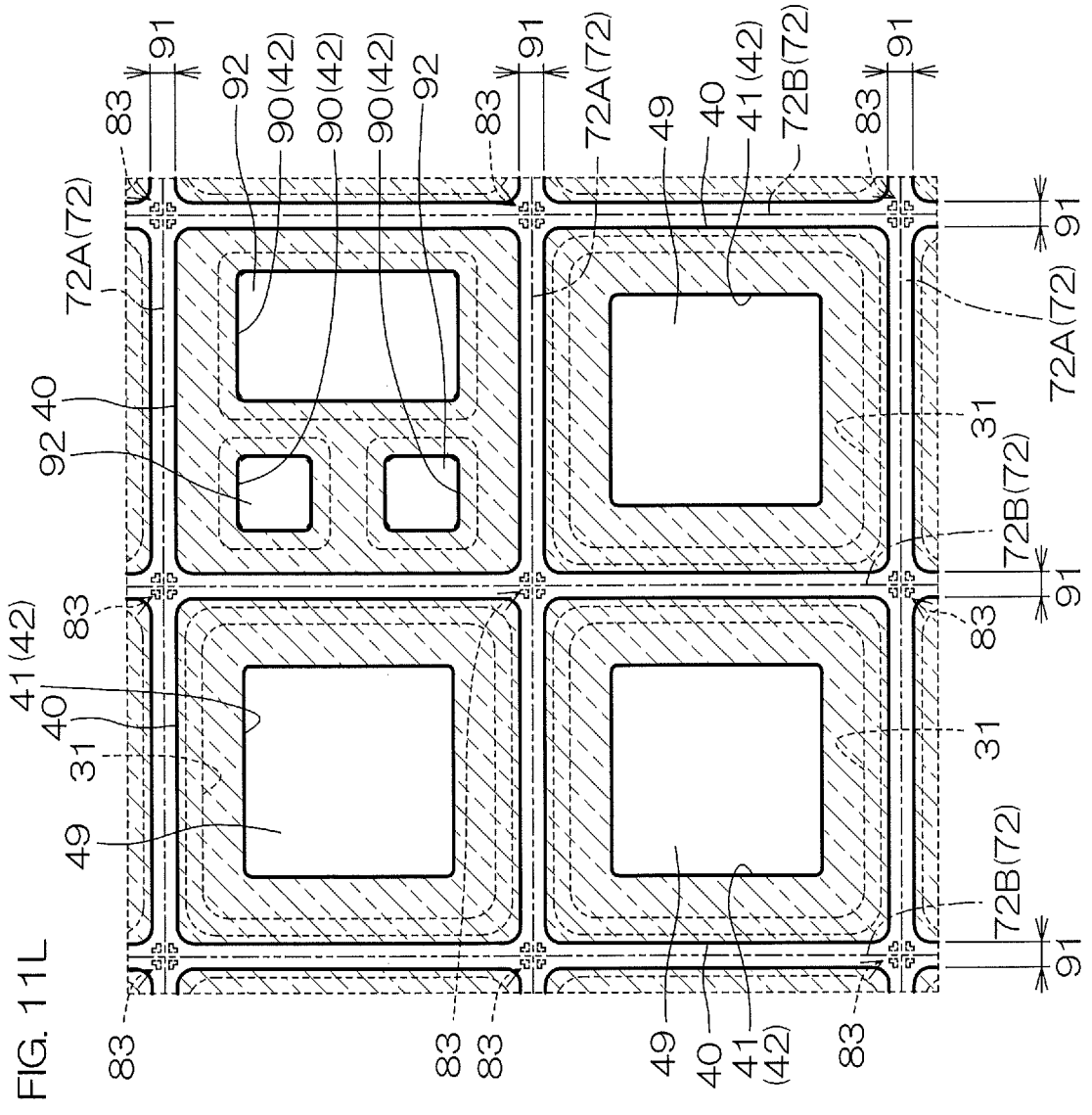

Next, referring to FIG. 10L and FIG. 11L, the second main surface electrode 51 is formed on the second wafer main surface 64. The second main surface electrode 51 may be formed by a sputter method, a vapor deposition method, and/or a plating method. Prior to the step of forming the second main surface electrode 51 or in the step of forming the second main surface electrode 51, an annealing treatment may be performed on the second wafer main surface 64. The annealing treatment on the second wafer main surface 64 may be performed by a laser irradiation method.

Figure 11M:
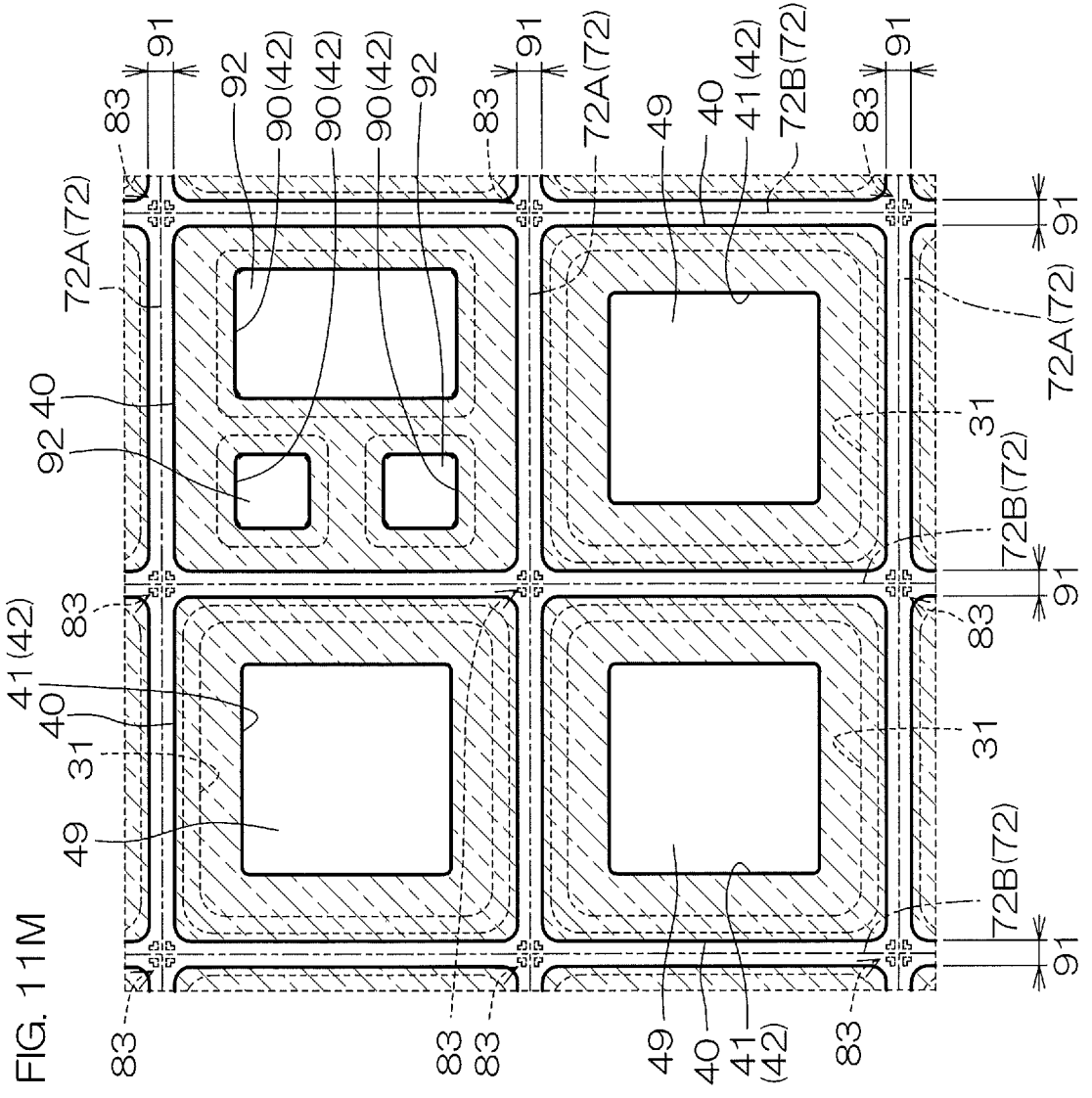

Next, referring to FIG. 10M and FIG. 11M, an elastic support tape 93 is adhered to the second wafer main surface 64.

Figure 11N:
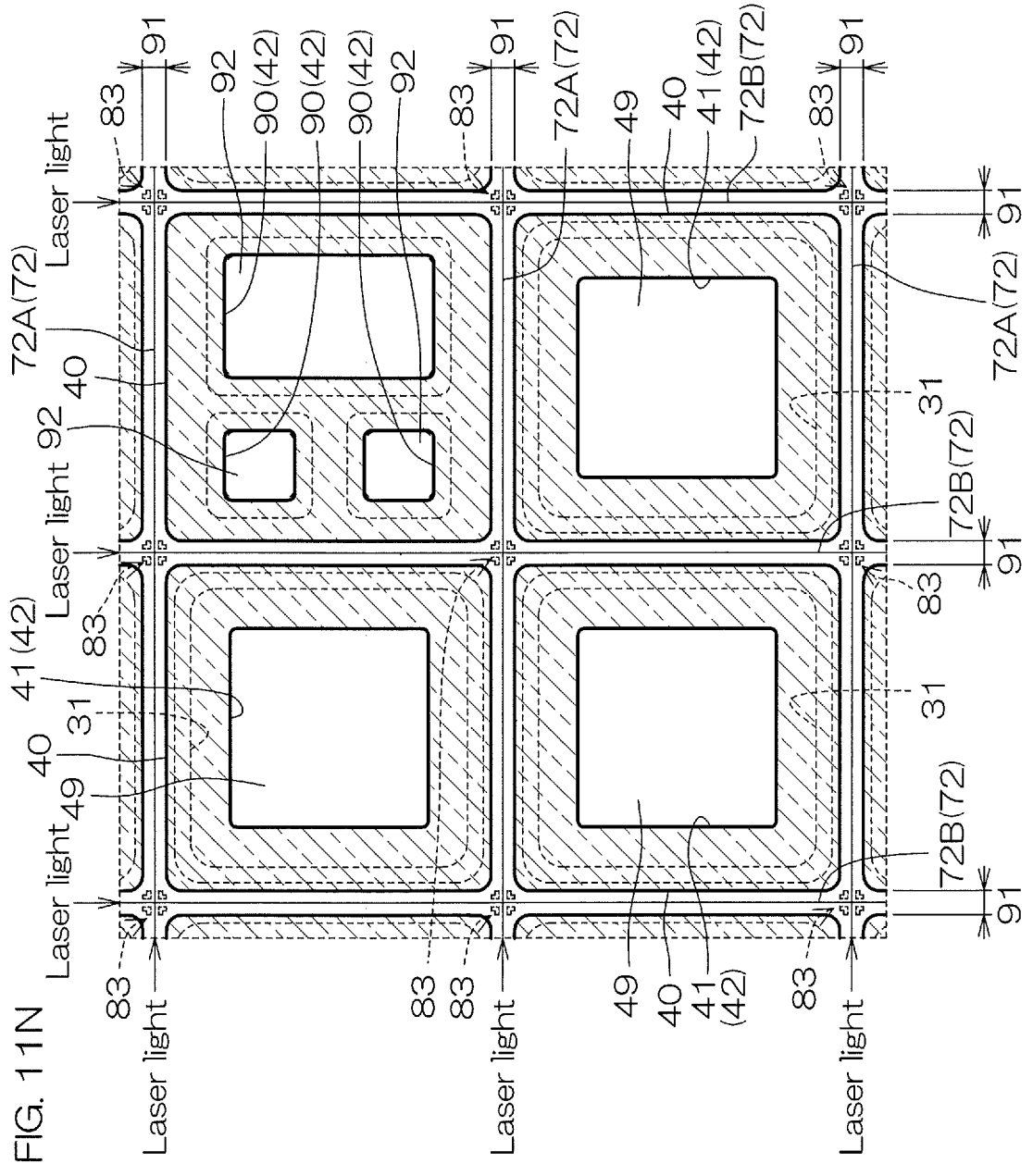

Next, referring to FIG. 10N and FIG. 11N, laser light is irradiated to the scheduled cutting lines 72 of the SiC wafer

62. A plurality of modified regions 94 that are to be bases of the first to fourth modified regions 8A to 8D are thereby formed in the SiC wafer 62.

The laser light is irradiated to the SiC wafer 62 from the first wafer main surface 63 side and via the interlayer insulating layer 30 exposed from the dicing streets 91. The thickness of the interlayer insulating layer 30 is extremely small in comparison to the thickness TW of the SiC wafer 62 and therefore, the interlayer insulating layer 30 does not obstruct the laser light made incident on the SiC wafer 62. Also, the dicing streets 91 are demarcated by the inclined surfaces 44 of the insulating layers 40. By demarcating the dicing streets 91 by the inclined surfaces 44 of the insulating layers 40, blocking of the laser light by the insulating layers 40 can be suppressed.

A focal point of the laser light, laser energy, laser pulse duty ratio, laser irradiation speed, etc., are respectively set to arbitrary values in accordance with the number (number of levels), positions, sizes, shapes, thicknesses, etc., of the modified regions 94 to be formed. Also, a modification ratio of the SiC wafer 62 is adjusted in accordance with the number, positions, sizes, shapes, thicknesses, etc., of the modified regions 94.

In this step, the laser light is irradiated in multiple stages (four stages in this step) to different depth positions of the SiC wafer 62 at a single irradiation position on a scheduled cutting line 72. When the irradiation of the laser light with respect to the single irradiation position ends, the irradiation position of the laser light is moved to another position on the scheduled cutting line 72 and the laser light is irradiated in multiple stages again. The levels (four levels in this step) of the modified regions 94 are thereby formed at intervals in the normal direction Z in the interior of the SiC wafer 62.

The modified regions 94 are respectively formed in the interior of the SiC wafer 62 at intervals to the second wafer main surface 64 side from the first wafer main surface 63. The modified regions 94 are respectively formed in the interior of the SiC wafer 62 at intervals to the first wafer main surface 63 side from the second wafer main surface 64.

The second wafer main surface 94 are preferably formed in the SiC substrate 6. The modified regions 94 are even more preferably formed in the SiC substrate 6 at intervals toward the second wafer main surface 64 side from the SiC epitaxial layer 7. Variations in physical properties and electrical properties of the SiC epitaxial layer 7 due to the modified regions 94 can thereby be suppressed. That is, the functional devices can be formed appropriately in the SiC epitaxial layer 7.

Due to extending along the a-axis direction of the SiC monocrystal, the second scheduled cutting lines 72B have a property of cleaving more easily than the first scheduled cutting lines 72A that extend along the m-axis direction of the SiC monocrystal.

A modification ratio of the second scheduled cutting lines 72B may thus be less than a modification ratio of the first scheduled cutting lines 72A. For example, if at the second scheduled cutting lines 72B, the modified regions 94 are not formed at positions deep in comparison to the first scheduled cutting lines 72A, the width WD2 of the dicing streets 91 extending in the a-axis direction can be made narrower than the width WD2 of the dicing streets 91 extending in the m-axis direction.

The modified regions 94 along the second scheduled cutting lines 72B may be formed after forming the modified regions 94 along the first scheduled cutting lines 72A. The modified regions 94 along the first scheduled cutting lines 72A may be formed after forming the modified regions 94 along the second scheduled cutting lines 72B. The modified regions 94 along the first scheduled cutting lines 72A and the modified regions 94 along the second scheduled cutting lines 72B may be formed alternately.

Figure 11O:
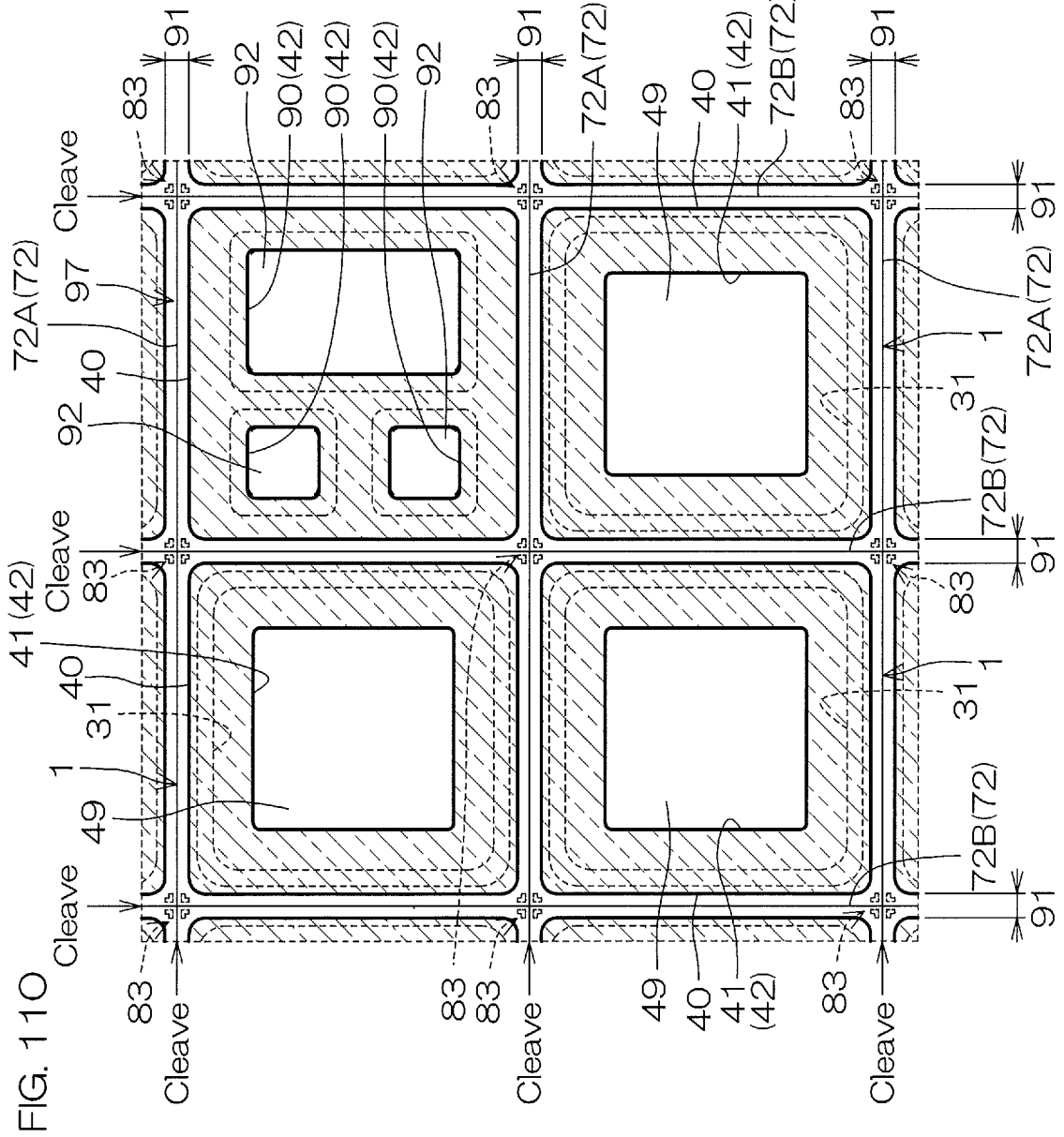
Figure 11P:
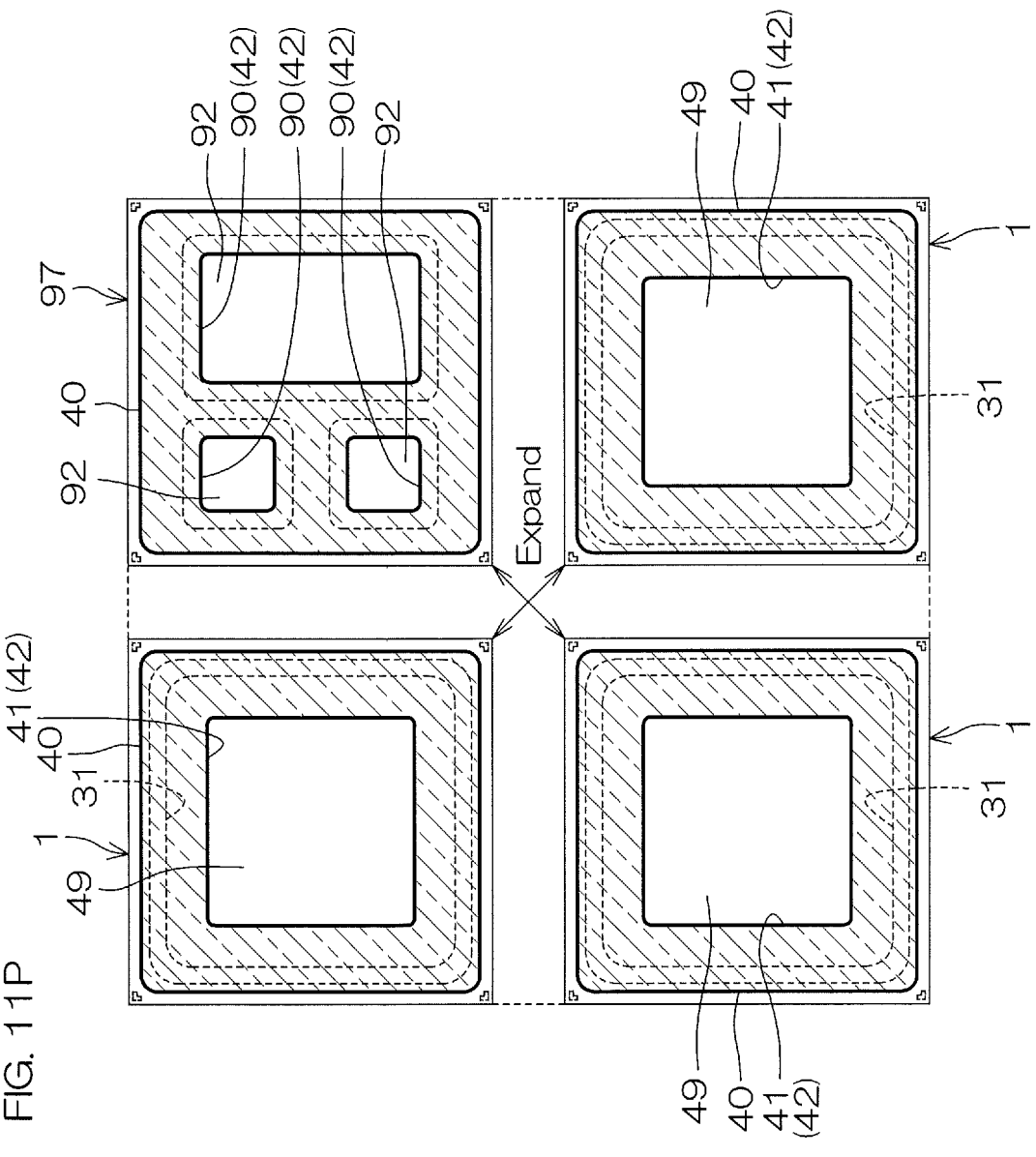

Next, referring to FIG. 10O and FIG. 11O, the SiC wafer 62 is cleaved along the scheduled cutting lines 72 with the modified regions 94 as starting points. The SiC wafer 62 is cleaved together with the interlayer insulating layer 30. The interlayer insulating layer 30 is extremely small in thickness and thus does not hinder the cleavage.

The SiC wafer 62 may be cleaved by a breaking method of a shearing type, 3-point bending type, folding type, and/or roller pressing type. A breaking method of a 3-point bending type is shown as an example in FIG. 10O.

With a breaking method of a 3-point bending type, for example, two supporting members 95 supporting the SiC wafer 62 from the second wafer main surface 64 side and a single blade member 96 imparting a cleaving force to the SiC wafer 62 from the first wafer main surface 63 side are used. The two supporting members 95 are arranged such as to oppose each other in plan view across a scheduled cutting line 72 to be cleaved. The blade member 96 imparts the cleaving force to the scheduled cutting line 72 to be cleaved.

Thereby, the SiC wafer 62 is cleaved along the scheduled cutting lines 72, the first chip regions 71A become a plurality of the SiC semiconductor devices 1, and the second chip regions 71B become a plurality of dummy SiC semiconductor devices 97. Also, the intersections 84 of the SiC wafer 62 become the L-shaped passages 25 of the SiC semiconductor devices 1. Also, the dicing streets 91 of the SiC wafer 62 become the dicing streets 43 of the SiC semiconductor devices 1.

With this step, an example where the cleaving force is imparted to the SiC wafer 62 from the first wafer main surface 63 side was described. However, the cleaving force may be imparted to the SiC wafer 62 from the second wafer main surface 64 side instead. In this case, the support tape 93 may be adhered to the first wafer main surface 63 side.

The SiC wafer 62 may be cleaved along the second scheduled cutting lines 72B after being cleaved along the first scheduled cutting lines 72A. That is, the SiC wafer 62 may be cleaved in the nearest neighbor directions after being cleaved in directions intersecting the nearest neighbor directions. Although in the step of cleaving the first scheduled cutting lines 72A, the SiC wafer 62 is cleaved in the directions intersecting the nearest neighbor directions, the stress applied to the SiC wafer 62 is sustained continuously such that forming of meanderings at cleaved portions is suppressed.

On the other hand, in the step of cleaving the second scheduled cutting lines 72B, the SiC wafer 62 is already cleaved along the m-axis direction and therefore the stress applied to the SiC wafer 62 becomes discontinuous. However, forming of meanderings at the cleaved portions is suppressed because stress can be applied along the nearest neighbor directions. In particular, forming of meanderings having a connection portion of a cleaved portion along a first scheduled cutting line 72A and a cleaved portion along a second scheduled cutting line 72B as a starting point can be suppressed. Forming of meanderings can thus also be suppressed by making use of physical properties of the SiC wafer 62.

Next, referring to FIG. 10P and FIG. 11P, the support tape 93 is expanded in directions from a center toward peripheral edges of the SiC wafer 62 and fixed. Distances between the SiC semiconductor devices 1 are thereby maintained constant. Also, distances between the SiC semiconductor devices 1 and the dummy SiC semiconductor devices 97 are maintained constant. Cracking of the SiC semiconductor devices 1 due to collision during handling can thereby be suppressed. Suppression of shape defects of the SiC semiconductor devices 1, etc., is also effective in terms of avoiding unwanted collision.

Figure 12:
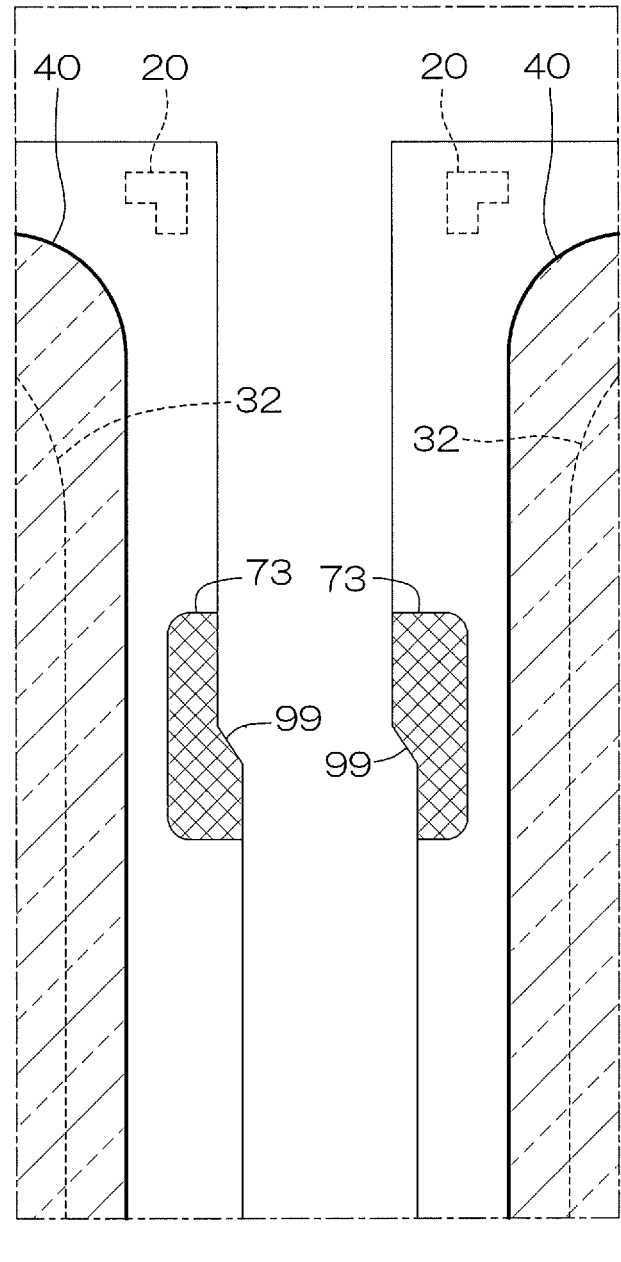
FIG. 12 is an enlarged plan view of a cleaved portion of an SiC wafer according to a reference example.

FIG. 12 is an enlarged plan view of a cleaved portion of an SiC wafer 98 according to a reference example. Structures of the SiC wafer 98 corresponding to those of the SiC wafer 62 shall be provided with the same reference signs and description thereof shall be omitted.

The SiC wafer 98 includes a monitor pattern 73 formed in the dicing street 91 in the first wafer main surface 63. In FIG. 12, the monitor pattern 73 is shown with hatching. The monitor pattern 73 is formed on the scheduled cutting line 72. With the SiC wafer 98, laser light is blocked by the monitor pattern 73 in the step of forming the modified regions 94.

Therefore, an unmodified portion in which the modified region 94 is not present is formed in a region of the SiC wafer 98 blocked by the monitor pattern 73. In the step of cleaving the SiC wafer 98, a force that maintains an atomic arrangement acts at the unmodified portion directly below the monitor pattern 73. In particular, the SiC monocrystal has a physical property of being strong in the force that maintains the atomic arrangement in comparison to an Si monocrystal, etc. A meandering 99 with the monitor pattern 73 as a starting point is thus formed in the cleaved portion of the SiC wafer 98. A maximum meandering width (absolute value) of the meandering 99 in plan view exceeds 10 μm.

Such a problem can be solved by forming the first chip region 71A that includes the monitor pattern 73. However, in this case, the planar area of the first chip region 71A increases and consequently, the number of obtained SiC semiconductor devices 1 that can be obtained from a single SiC wafer 62 decreases. Also, as a result of the SiC semiconductor device 1 becoming large due to the increase in the planar area of the first chip region 71A, a requirement to refine the SiC semiconductor device 1 cannot be answered. Also, if a monitor pattern (accessory pattern) is constituted of a metal pattern, there is also a possibility of the electrical characteristics of the SiC semiconductor device 1 varying due to the monitor pattern.

On the other hand, with the SiC wafer 62, the monitor pattern 73 is not formed in a region other than the second chip regions 71B. That is, with the SiC wafer 62, the second chip regions 71B that are dedicated to the monitor patterns 73 are set. A monitor pattern 73 would thus not be a blocking object with respect to laser light.

Also, the alignment patterns 20 are formed in the first wafer main surface 63 at intervals from the dicing streets 91 in plan view. Moreover, the alignment patterns 20 are formed of a material other than a metal material. Specifically, the alignment patterns 20 each have the alignment trench structure that includes the alignment trench 26 and the insulator 27. Also, an accessory pattern other than the alignment patterns 20 is not formed in the first wafer main surface 63 positioned inside the dicing streets 91. An accessory pattern would thus not be a blocking object with respect to laser light.

Also, the first main surface electrodes 32 and the monitor main surface electrodes 88 are formed in the first wafer main surface 63 at intervals from the dicing streets 91 in plan view. The first main surface electrodes 32 and the monitor main surface electrodes 88 would thus not be blocking objects with respect to laser light.

Also, the modified regions 94 are formed along the scheduled cutting lines 72 at intervals from the alignment patterns 20. The alignment patterns 20 thus would not be obstructions to the cleaving of the SiC wafer 62. The modified regions 94 can thereby be formed appropriately at the scheduled cutting lines 72 and, at the same time, the cleaving force can be applied appropriately to the scheduled cutting lines 72.

Shape defects of the cleaved portions due to the first main surface electrodes 32, the monitor main surface electrodes 88, the alignment patterns 20, and the monitor patterns 73 can thus be suppressed and therefore, meanderings of the cleaved portions of the SiC wafer 62 can be suppressed appropriately. A maximum meandering width (absolute value) of the cleaved portions of the SiC wafer 62 can thus be suppressed to be not more than 10 μm (specifically, not more than 5 μm).

Also, by suppressing meanderings of the cleaved portions, a margin that takes meanderings into consideration can be made small and therefore, the chip regions 71 can be reduced. Also, the chip regions 71 can be reduced because there is no need to form the monitor patterns 73 in the first chip regions 71A. A requirement to make the SiC semiconductor device 1 compact can thus be answered, and at the same time, the number of obtained SiC semiconductor devices 1 that can be obtained from a single SiC wafer 62 can be increased.

Also, with the SiC wafer 62, the insulating layers 40 do not have to be cut physically. Thereby, the SiC wafer 62 can be cleaved smoothly and, at the same time, peeling and degradation of the insulating layers 40 can be suppressed. Consequently, shape defects of the cleaved portions of the SiC wafer 62 due to the insulating layers 40 can be suppressed.

Figure 13:
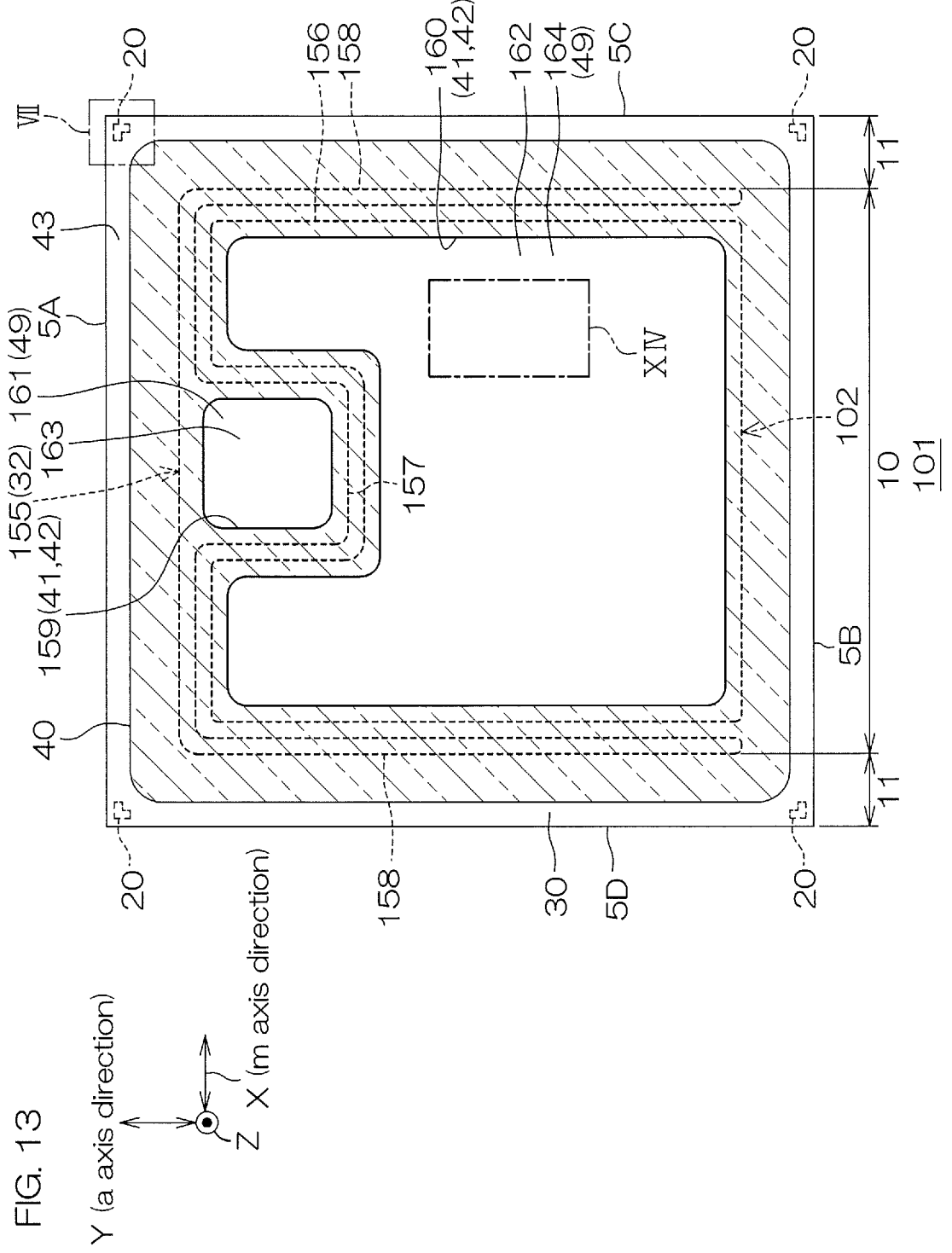
FIG. 13 is a plan view of an SiC semiconductor device according to a second preferred embodiment of the present invention.
Figure 14:
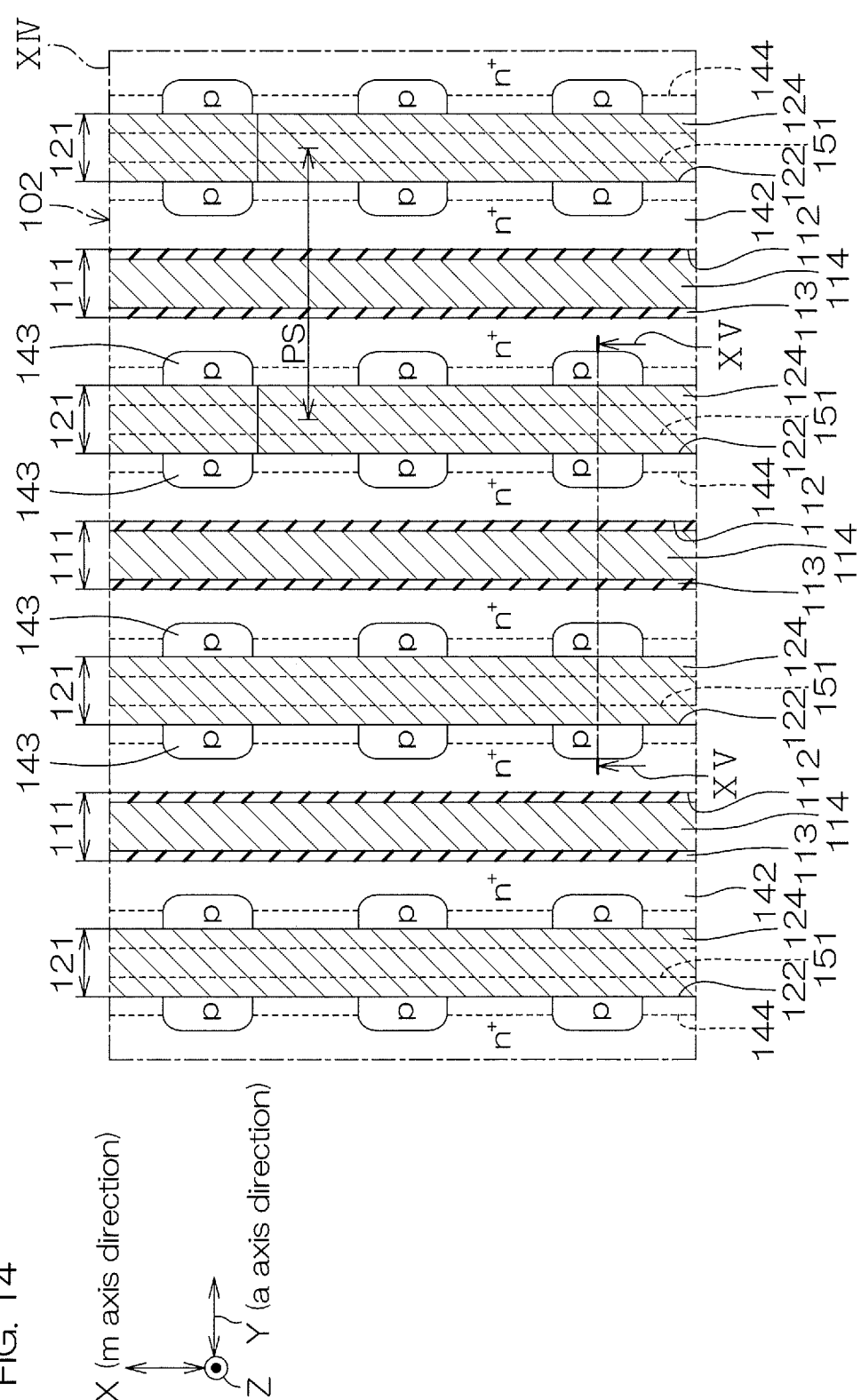
FIG. 14 is an enlarged plan view of an internal structure of a region XIV shown in FIG. 13.
Figure 15:
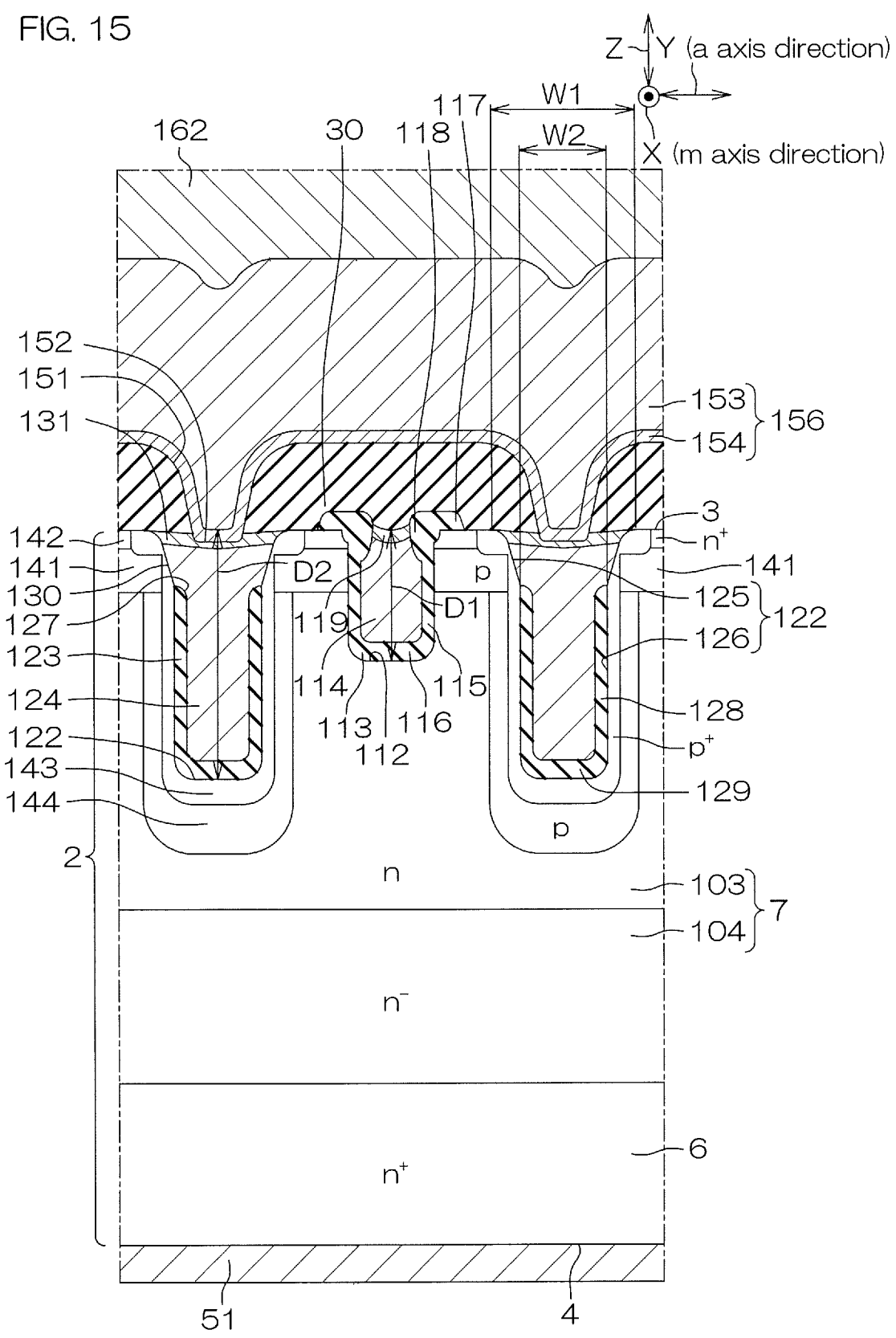
FIG. 15 is a sectional view taken along line XV-XV shown in FIG. 14.

FIG. 13 is a plan view of an SiC semiconductor device 101 according to a second preferred embodiment of the present invention. FIG. 14 is an enlarged plan view of an internal structure of a region XIV shown in FIG. 13. FIG. 15 is a sectional view taken along line XV-XV shown in FIG. 14. In the following, structures corresponding to the structures described with respect to the SiC semiconductor device 1 shall be provided with the same reference signs and description thereof shall be omitted.

Referring to FIG. 13 to FIG. 15, the SiC semiconductor device 101 is a switching device having a MISFET (metal insulator semiconductor field effect transistor) 102 being formed as an example of a functional device in place of the SBD 12 in the active region 10. That is, the SiC semiconductor devices 101 are manufactured by forming the MISFETs 102 in the first chip regions 71A of the SiC wafer 62.

The SiC semiconductor device 101 includes the SiC chip 2, the first to fourth modified regions 8A to 8D (first to fourth modified portions 9A to 9D), the alignment patterns 20, the interlayer insulating layer 30, the first main surface electrode 32, the insulating layer 40, the pad electrode 49, and the second main surface electrode 51. In FIG. 13, the insulating layer 40 is shown with hatching.

The SiC substrate 6 is formed as a drain region of the MISFET 102. The SiC epitaxial layer 7 is formed as a drift region of the MISFET 102. The second main surface electrode 51 is formed as a drain electrode of the MISFET 102.

In this embodiment, the SiC epitaxial layer 7 has different n-type impurity concentrations along the normal direction Z. Specifically, the SiC epitaxial layer 7 includes a high concentration region 103 of high n-type impurity concentration and a low concentration region 104 of lower n-type impurity concentration than the high concentration region 103.

The high concentration region 103 is formed in a region at the first main surface 3 side. The low concentration region 104 is formed in a region at the second main surface 4 side with respect to the high concentration region 103. A thickness of the high concentration region 103 is less than a thickness of the low concentration region 104. The thickness of the high concentration region 103 is less than one-half the total thickness of the SiC epitaxial layer 7.

A peak value of the n-type impurity concentration of the high concentration region 103 may be not less than $1.0 \times 10^{16}$ $cm^{-3}$ and not more than $1.0 \times 10^{18}$ $cm^{-3}$. A peak value of the n-type impurity concentration of the low concentration region 104 may be not less than $1.0 \times 10^{15}$ $cm^{-3}$ and not more than $1.0 \times 10^{16}$ $cm^{-3}$. Obviously, the n-type impurity concentration of the SiC epitaxial layer 7 may have a concentration gradient with which the n-type impurity concentration decreases gradually in a range of not less than $1.0 \times 10^{15}$ $cm^{-3}$ and not more than $1.0 \times 10^{18}$ $cm^{-3}$ from the SiC substrate 6 toward the first main surface 3.

The SiC semiconductor device 101 includes a plurality of trench gate structures 111 formed in the first main surface 3 in the active region 10. The trench gate structures 111 are respectively formed as bands extending in the first direction X and are formed at intervals in the second direction Y. The trench gate structures 111 are formed in stripes extending in the first direction X as a whole in plan view.

In this embodiment, the trench gate structures 111 extend as bands from a peripheral edge portion at one side (the third side surface 5C side) toward a peripheral edge portion at another side (the fourth side surface 5D side) of the active region 10. The trench gate structures 111 cross an intermediate portion of the active region 10 between the peripheral edge portion at one side and the peripheral edge portion at the other side.

A length of each trench gate structure 111 may be not less than 1 mm and not more than 10 mm. The length of each trench gate structure 111 may be not less than 1 mm and not more than 2 mm, not less than 2 mm and not more than 4 mm, not less than 4 mm and not more than 6 mm, not less than 6 mm and not more than 8 mm, or not less than 8 mm and not more than 10 mm. The length of each trench gate structure 111 is preferably not less than 2 mm and not more than 6 mm. A total extension per unit area of a single trench gate structure 111 may be not less than 0.5 $μm/μm^2$ and not more than 0.75 $μm/μm^2$.

Each trench gate structure 111 includes a gate trench 112, a gate insulating layer 113, and a gate electrode 114. In FIG. 14, the gate insulating layers 113 and the gate electrodes 114 are shown with hatching.

Each gate trench 112 is formed in the SiC epitaxial layer 7. The gate trench 112 includes side walls and a bottom wall. The side walls that form long sides of the gate trench 112 are formed by the a-planes of the SiC monocrystal. The side walls that form short sides of the gate trench 112 are formed by the m-planes of the SiC monocrystal.

The side walls of the gate trench 112 may extend along the normal direction Z. Angles that the side walls of the gate trench 112 form with respect to the first main surface 3 within the SiC chip 2 may be not less than 90° and not more than 95° (for example, not less than 91° and not more than 93°). The side walls of the gate trench 112 may be formed substantially perpendicular to the first main surface 3. The gate trench 112 may be formed in a convergent shape with which an opening width narrows from the first main surface 3 toward the bottom wall.

The bottom wall of the gate trench 112 is positioned in the high concentration region 103. The bottom wall of the gate trench 112 faces the c-plane of the SiC monocrystal. The bottom wall of the gate trench 112 has an off angle inclined in the a-axis direction with respect to the c-plane of the SiC monocrystal. The bottom wall of the gate trench 112 may be formed parallel to the first main surface 3. The bottom wall of the gate trench 112 may be formed in a shape curved toward the second main surface 4.

The gate trench 112 has a first depth D1. The first depth D1 may be not less than 0.5 μm and not more than 3 μm. The first depth D1 may be not less than 0.5 μm and not more than 1 μm, not less than 1 μm and not more than 1.5 μm, not less than 1.5 μm and not more than 2 μm, not less than 2 μm and not more than 2.5 μm, or not less than 2.5 μm and not more than 3 μm.

A width along the second direction Y of the gate trench 112 may be not less than 0.1 μm and not more than 2 μm. The width of the gate trench 112 may be not less than 0.1 μm and not more than 0.5 μm, not less than 0.5 μm and not more than 1 μm, not less than 1 μm and not more than 1.5 μm, or not less than 1.5 μm and not more than 2 μm.

An opening edge portion of the gate trench 112 includes an inclined portion that is inclined downwardly from the first main surface 3 toward an inner side of the gate trench 112. The opening edge portion of the gate trench 112 is a portion connecting the first main surface 3 and the side walls of the gate trench 112. The inclined portion of the gate trench 112 is formed in a shape curved toward an inner side of the SiC chip 2. The inclined portion of the gate trench 112 may be formed in a shape curved toward the inner side of the gate trench 112. The inclined portion of the gate trench 112 relaxes concentration of electric field with respect to the opening edge portion of the gate trench 112.

The gate insulating layer 113 includes at least one among silicon oxide, silicon nitride, aluminum oxide, zirconium oxide, and tantalum oxide. The gate insulating layer 113 may have a laminated structure in which a silicon oxide layer and a silicon nitride layer are laminated in any order. The gate insulating layer 113 may have a single layer structure constituted of a silicon oxide layer or a silicon nitride layer. In this embodiment, the gate insulating layer 113 has a single layer structure constituted of a silicon oxide layer.

The gate insulating layer 113 is formed as a film along the inner walls of each gate trench 112 and demarcates a recess space within the gate trench 112. The gate insulating layer 113 includes a first region 115, a second region 116, and a third region 117. The first region 115 is formed along the side walls of the gate trench 112. The second region 116 is formed along the bottom wall of the gate trench 112. The third region 117 is formed along the first main surface 3.

A thickness of the first region 115 is less than a thickness of the second region 116 and a thickness of the third region 117. The thickness of the first region 115 may be not less than 0.01 μm and not more than 0.2 μm. The thickness of the second region 116 may be not less than 0.05 μm and not more than 0.5 μm. The thickness of the third region 117 may be not less than 0.05 μm and not more than 0.5 μm.

The gate insulating layer 113 includes a bulging portion 118 bulging toward an interior of the gate trench 112 at the opening edge portion. The bulging portion 118 is formed at a connection portion of the first region 115 and the third region 117 of the gate insulating layer 113. The bulging portion 118 is formed in a shape curved toward the inner side of the gate trench 112. The bulging portion 118 narrows an opening of the gate trench 112 at the opening edge portion. A gate insulating layer 113 not having the bulging portion 118 may be formed instead. A gate insulating layer 113 having a uniform thickness may be formed instead.

Each gate electrode 114 is embedded across the gate insulating layer 113 in the corresponding gate trench 112. Specifically, the gate electrode 114 is embedded in the recess space demarcated by the gate insulating layer 113 within the gate trench 112. The gate electrode 114 has an electrode surface exposed from the opening of the gate trench 112. The electrode surface of the gate electrode 114 is formed in a curved shape recessed toward the bottom wall of the gate trench 112. The electrode surface of the gate electrode 114 is narrowed by the bulging portion 118 of the gate insulating layer 113.

The gate electrode 114 is constituted of a conductive material other than a metal material. The gate electrode 114 is preferably constituted of a conductive polysilicon. In this embodiment, the gate electrode 114 includes a p-type polysilicon doped with a p-type impurity.

The p-type impurity concentration of the gate electrode 114 may be not less than $1.0 \times 10^{18}$ cm$^{-3}$ and not more than $1.0 \times 10^{22}$ cm$^{-3}$. The p-type impurity of the gate electrode 114 may include at least one among boron, aluminum, indium, and gallium. A sheet resistance of the gate electrode 114 may be not less than 10Ω/□ and not more than 500Ω/□ (approximately 200Ω/□ in this embodiment). A thickness of the gate electrode 114 may be not less than 0.5 μm and not more than 3 μm.

The SiC semiconductor device 101 includes a first low resistance layer 119 that covers the gate electrodes 114. The first low resistance layer 119 covers the gate electrodes 114 within the gate trenches 112. The first low resistance layer 119 forms a portion of each trench gate structure 111.

The first low resistance layer 119 includes a conductive material having a sheet resistance less than the sheet resistance of the gate electrodes 114. The sheet resistance of the first low resistance layer 119 may be not less than 0.01Ω/□ and not more than 10Ω/□. A thickness in the normal direction Z of the first low resistance layer 119 is preferably less than the thickness of the gate electrodes 114. The thickness of the first low resistance layer 119 may be not less than 0.01 μm and not more than 3 μm.

Specifically, the first low resistance layer 119 includes a polycide layer. The polycide layer is formed by siliciding surface layer portions of the gate electrodes 114 by a metal material. That is, the electrode surfaces of the gate electrodes 114 are formed by the first low resistance layer 119. Specifically, the polycide layer is constituted of a p-type polycide layer that includes the p-type impurity doped in the gate electrodes 114. The polycide layer preferably has a specific resistance of not less than 10 μΩ·cm and not more than 110 μΩ·cm.

A sheet resistance inside the gate trenches 112 with the gate electrodes 114 and the first low resistance layer 119 embedded therein is not more than the sheet resistance of the gate electrodes 114 alone. The sheet resistance inside the gate trenches 112 is preferably not more than a sheet resistance of an n-type polysilicon doped with an n-type impurity. The sheet resistance inside the gate trenches 112 is approximated by the sheet resistance of the first low resistance layer 119. The sheet resistance inside the gate trenches 112 may be not less than 0.01Ω/□ and not more than 10Ω/□. The sheet resistance inside the gate trenches 112 is preferably less than 10 Ω/□.

The first low resistance layer 119 may contain at least one among TiSi, TiSi$_2$, NiSi, CoSi, CoSi$_2$, MoSi$_2$, and WSi$_2$. Among these types of materials, NiSi, CoSi$_2$, and TiSi$_2$ are especially suitable as the polycide layer forming the first low resistance layer 119 due to being comparatively low in specific resistance value and temperature dependence. The first low resistance layer 119 is most preferably constituted of $CoSi_2$ that has a property of being low in diffusion to other regions.

The first low resistance layer 119 includes contact portions in contact with the gate insulating layers 113. Specifically, the contact portions of the first low resistance layer 119 contact the third regions 117 (bulging portions 118) of the gate insulating layers 113. A current path between the first low resistance layer 119 and the SiC epitaxial layer 7 can thereby be suppressed. In particular, a design where the contact portions of the first low resistance layer 119 are connected to comparatively thick corner portions of the gate insulating layers 113 is effective for reducing a risk of a current path.

By embedding a p-type polysilicon having a work function differing from an n-type polysilicon in the gate trenches 112, a gate threshold voltage Vth can be increased by approximately 1 V. However, a p-type polysilicon has a sheet resistance of several tens of times (approximately 20 times) higher than a sheet resistance of an n-type polysilicon. Therefore, if a p-type polysilicon is adopted as a material of the gate electrodes 114, energy loss increases in accompaniment with increase in parasitic resistance inside the gate trenches 112 (referred to hereinafter simply as "gate resistance").

Thus, with the SiC semiconductor device 101, the first low resistance layer 119 (p-type polycide) is formed on the gate electrodes 114 (p-type polysilicon). With the first low resistance layer 119, the sheet resistance inside the gate trenches 112 can be reduced while allowing increase in the gate threshold voltage Vth.

For example, with the structure having the first low resistance layer 119, the sheet resistance can be decreased to not more than 1/100th in comparison to a structure not having the first low resistance layer 119. Also, with the structure having the first low resistance layer 119, the sheet resistance can be decreased to not more than 1/5th in comparison to the gate electrodes 114 that contain the n-type polysilicon.

The gate resistance can thereby be reduced and therefore, a current can be diffused efficiently along the trench gate structures 111. That is, the first low resistance layer 119 is formed as a current diffusion layer that diffuses the current inside the gate trenches 112. In particular, although time is required for transmission of current with the gate trenches 112 having a length of the millimeter order (a length not less than 1 mm), switching delay can be suppressed appropriately by the low resistance electrode layer 119.

Also, with the structure having the first low resistance layer 119, the p-type impurity concentration inside the SiC epitaxial layer 7 does not have to be increased for increasing the gate threshold voltage Vth. The gate threshold voltage Vth can thus be increased appropriately while suppressing increase in channel resistance.

The SiC semiconductor device 101 includes a plurality of trench source structures 121 respectively formed in regions between mutually adjacent ones of the trench gate structures 111. The trench source structures 121 are formed at intervals in the second direction Y in a mode of sandwiching a single trench gate structure 111.

The trench source structures 121 are each formed as a band extending in the first direction X. The trench source structures 121 are formed in stripes extending in the first direction X as a whole in plan view.

A pitch PS in the second direction Y between central portions of mutually adjacent trench source structures 121 may be not less than 1 μm and not more than 5 μm. The pitch PS may be not less than 1 μm and not more than 2 μm, not less than 2 μm and not more than 3 μm, not less than 3 μm and not more than 4 μm, or not less than 4 μm and not more than 5 μm. The pitch PS is preferably not less than 1.5 μm and not more than 3 μm.

Each trench source structure 121 includes a source trench 122, a source insulating layer 123, and a source electrode 124. In FIG. 14, the source electrodes 124 are shown with hatching. Each source trench 122 is formed in the SiC epitaxial layer 7. The source trench 122 includes side walls and a bottom wall. The side walls that form long sides of the source trench 122 are formed by the a-planes of the SiC monocrystal. The side walls that form short sides of the source trench 122 are formed by the m-planes of the SiC monocrystal.

The bottom walls of the source trenches 122 are positioned in the high concentration region 103. The bottom walls of the source trenches 122 are positioned in regions at the second main surface 4 side with respect to the bottom walls of the gate trenches 112. The bottom walls of the source trenches 122 are positioned in regions between the bottom walls of the gate trenches 112 and the low concentration region 104 in regard to the normal direction Z.

The bottom walls of the source trenches 122 are arranged along the c-plane of the SiC monocrystal. The bottom walls of the source trench 122 have an off angle inclined in the a-axis direction with respect to the c-plane of the SiC monocrystal. The bottom walls of the source trenches 122 may be formed parallel to the first main surface 3. The bottom walls of the source trenches 122 may each be formed in a shape curved toward the second main surface 4.

The source trenches 122 have a second depth D2 that exceeds the first depth D1 of the gate trenches 112. Under a condition that the source trenches 122 are positioned inside the high concentration region 103, a ratio DS/DG of the second depth D2 with respect to the first depth D1 may be not less than 1.5. The ratio DS/DG is preferably not less than 2.

The second depth D2 may be not less than 0.5 μm and not more than 10 μm. The second depth D2 may be not less than 0.5 μm and not more than 1 μm, not less than 1 μm and not more than 2 μm, not less than 2 μm and not more than 4 μm, not less than 4 μm and not more than 6 μm, not less than 6 μm and not more than 8 μm, or not less than 8 μm and not more than 10 μm. The source trenches 122 having the second depth D2 substantially equal to the first depth D1 may be formed instead.

Each source trench 122 includes a first trench portion 125 and a second trench portion 126. The first trench portion 125 is formed at an opening side of the source trench 122. The first trench portion 125 has a first width W1 in the second direction Y. The first trench portion 125 may be formed in a convergent shape with which the first width W1 narrows from the first main surface 3 toward the bottom wall side.

The first trench portion 125 that traverses the bottom walls of the gate trenches 112 in the normal direction Z may be formed. That is, a depth of the first trench portion 125 may exceed the first depth D1 of the gate trenches 112.

The first trench portion 125 is preferably formed in a region at the first main surface 3 side with respect to the bottom walls of the gate trenches 112. That is, the depth of the first trench portion 125 is preferably less than the first depth D1 of the gate trenches 112. The depth of the first trench portion 125 may be not less than 0.1 μm and not more than 2 μm. The depth of the first trench portion 125 may be not less than 0.1 μm and not more than 0.5 μm, not less than 0.5 μm and not more than 1 μm, not less than 1 μm and not more than 1.5 μm, or not less than 1.5 μm and not more than 2 μm.

The first width W1 of the first trench portion 125 may be not less than the width of the gate trenches 112 or may be less than the width of the gate trenches 112. The first width W1 preferably exceeds the width of the gate trenches 112. The first width W1 may be not less than 0.1 μm and not more than 2 μm. The first width W1 may be not less than 0.1 μm and not more than 0.5 μm, not less than 0.5 μm and not more than 1 μm, not less than 1 μm and not more than 1.5 μm, or not less than 1.5 μm and not more than 2 μm.

The second trench portion 126 is formed at the bottom wall side of the source trench 122. In the normal direction Z, the second trench portion 126 is formed in a region between the first trench portion 125 and a bottom portion of the SiC epitaxial layer 7 and traverses the bottom walls of the gate trenches 112. In the normal direction Z, a depth of the second trench portion 126 on basis of the first trench portion 125 preferably exceeds the first depth D1 of the gate trenches 112.

The second trench portion 126 has a second width W2 that is less than the first width W1 in the second direction Y. Under a condition of being less than the first width W1, the second width W2 may be not less than the width of the gate trenches 112 or may be less than the width of the gate trenches 112.

The second width W2 may be not less than 0.1 μm and less than 2 μm. The second width W2 may be not less than 0.1 μm and less than 2 μm. The second width W2 may be not less than 0.1 μm and not more than 0.5 μm, not less than 0.5 μm and not more than 1 μm, not less than 1 μm and not more than 1.5 μm, or not less than 1.5 μm and less than 2 μm. Obviously, the second trench portion 126 having the second width W2 that is substantially equal to the first width W1 may be formed instead.

An overall opening width of the source trench 122 is preferably formed to be approximately the same as the opening width of the gate trenches 112. The opening width of the source trench 122 being approximately the same as the opening width of the gate trenches 112 refers to the opening width of the source trench 122 falling within a range of ±20% of the opening width of the gate trenches 112.

Side walls of the second trench portion 126 may extend along the normal direction Z. Angles that the side walls of the second trench portion 126 form with respect to the first main surface 3 within the SiC chip 2 may be not less than 90° and not more than 95° (for example, not less than 91° and not more than 93°). The side walls of the second trench portion 126 may be formed substantially perpendicular to the first main surface 3. The second trench portion 126 may be formed in a convergent shape with which the second width W2 narrows from the first trench portion 125 toward the bottom wall side.

Each source insulating layer 123 includes at least one among silicon oxide, silicon nitride, aluminum oxide, zirconium oxide, or tantalum oxide. The source insulating layer 123 may have a laminated structure in which a silicon oxide layer and a silicon nitride layer are laminated in any order. The source insulating layer 123 may have a single layer structure constituted of a silicon oxide layer or a silicon nitride layer. In this embodiment, the source insulating layer 123 has a single layer structure constituted of a silicon oxide layer.

The source insulating layer 123 is formed as a film along the inner walls of the corresponding source trench 122 and demarcates a recess space within the source trench 122.

Specifically, the source insulating layer 123 is formed as a film along the inner walls of the source trench 122 such as to expose the first trench portion 125 and cover the second trench portion 126.

The source insulating layer 123 thereby demarcates the recess space within the second trench portion 126 of the source trench 122. Also, the source insulating layer 123 has a side wall window portion 127 exposing the first trench portion 125 of the source trench 122.

The source insulating layer 123 includes a first region 128 and a second region 129. The first region 128 is formed along the side walls of the source trench 122. The second region 129 is formed along the bottom wall of the source trench 122. A thickness of the first region 128 is less than a thickness of the second region 129. The thickness of the first region 128 may be not less than 0.01 μm and not more than 0.2 μm. The thickness of the second region 129 may be not less than 0.05 μm and not more than 0.5 μm.

The thickness of the first region 128 may be substantially equal to the thickness of the first regions 128 of the gate insulating layers 113. The thickness of the second region 129 may be substantially equal to the thickness of the second regions 129 of the gate insulating layers 113. The source insulating layers 123 that each have a uniform thickness may be formed instead.

Each source electrode 124 is embedded in the corresponding source trench 122 across the source insulating layer 123. Specifically, the source electrode 124 is embedded in the first trench portion 125 and the second trench portion 126 of the source trench 122 across the source insulating layer 123.

The source electrode 124 is embedded in the recess space demarcated by the second trench portion 126 at the bottom wall side of the source trench 122. The source electrode 124 has a side wall contact portion 130 in contact with side walls of the first trench portion 125 exposed from the side wall window portion 127 at the opening side of the source trench 122.

The source electrode 124 has an electrode surface exposed from the opening of the source trench 122. The electrode surface of the source electrode 124 is formed in a curved shape recessed toward the bottom wall of the source trench 122. The electrode surface of the source electrode 124 may be formed parallel to the first main surface 3.

A thickness of the source electrode 124 in the normal direction Z may be not less than 0.5 μm and not more than 10 μm. The thickness of the source electrode 124 may be not less than 0.5 μm and not more than 1 μm, not less than 1 μm and not more than 2 μm, not less than 2 μm and not more than 4 μm, not less than 4 μm and not more than 6 μm, not less than 6 μm and not more than 8 μm, or not less than 8 μm and not more than 10 μm.

The source electrode 124 is constituted of a conductive material other than a metal material. The source electrode 124 is preferably constituted of a conductive polysilicon. In this embodiment, the source electrode 124 includes a p-type polysilicon doped with a p-type impurity.

The p-type impurity concentration of the source electrode 124 may be not less than $1 \times 10^{18}$ cm$^{-3}$ and not more than $1 \times 10^{22}$ cm$^{-3}$. The p-type impurity concentration of the source electrode 124 is preferably equal to the p-type impurity concentration of the gate electrode 114. The p-type impurity of the source electrode 124 may include at least one among boron, aluminum, indium, and gallium.

The SiC semiconductor device 101 includes second low resistance layers 131 each covering a source electrode 124. Each second low resistance layer 131 covers the source electrode 124 within the corresponding source trench 122.

The second low resistance layer 131 forms a portion of the corresponding trench source structure 121. The second low resistance layers 131 have the same structure as the first low resistance layers 119. The description related to the first low resistance layers 119 applies to the description related to the second low resistance layers 131.

The SiC semiconductor device 101 includes a p-type body region 141 formed in a surface layer portion of the first main surface 3 in the active region 10. The body region 141 defines the active region 10. A p-type impurity concentration of the body region 141 is less than the p-type impurity concentration of the gate electrodes 114. The p-type impurity concentration of the body region 141 is less than the p-type impurity concentration of the source electrodes 124. A peak value of the p-type impurity concentration of the body region 141 may be not less than $1.0 \times 10^{17}$ cm$^{-3}$ and not more than $1.0 \times 10^{19}$ cm$^{-3}$.

In the surface layer portion of the first main surface 3, the body region 141 covers the side walls of the gate trenches 112 and the side walls of the source trenches 122. The body region 141 is formed in a region at the first main surface 3 side with respect to the bottom walls of the gate trenches 112. The body region 141 opposes the gate electrodes 114 across the gate insulating layers 113.

The body region 141 is further formed in regions at the first trench portion 125 sides with respect to the second trench portions 126 of the source trenches 122. The body region 141 covers the first trench portions 125 of the source trenches 122.

The body region 141 is connected to the side wall contact portions 130 of the source electrodes 124 exposed from the first trench portions 125 of the source trenches 122. The body region 141 is thereby source-grounded within the SiC chip 2. The body region 141 may cover portions of the second trench portions 126. In this case, the body region 141 may oppose the source electrodes 124 across portions of the source insulating layers 123.

The SiC semiconductor device 101 includes n$^+$-type source regions 142 formed in surface layer portions of the body region 141. The source regions 142 are formed along the gate trenches 112. A peak value of an n-type impurity concentration of the source regions 142 exceeds the peak value of the n-type impurity concentration of the high concentration region 103. The peak value of the n-type impurity concentration of the source regions 142 may be not less than $1.0 \times 10^{18}$ cm$^{-3}$ and not more than $1.0 \times 10^{21}$ cm$^{-3}$.

In the surface layer portions of the body region 141, the source regions 142 cover the side walls of the gate trenches 112 and the side walls of the source trenches 122. The source regions 142 oppose the gate electrodes 114 across the gate insulating layers 113. The source regions 142 preferably oppose the first low resistance layers 119 across the gate insulating layers 113.

The source regions 142 are further formed in regions at the first trench portion 125 sides with respect to the second trench portions 126 of the source trenches 122. The source regions 142 cover the first trench portions 125 of the source trenches 122. The source regions 142 are connected to the side wall contact portions 130 of the source electrodes 124 exposed from the first trench portions 125 of the source trenches 122. The source regions 142 are thereby source-grounded within the SiC chip 2.

Portions of the source regions 142 that are oriented along the side walls of the gate trenches 112 define the channels of the MISFET 102 with the high concentration region 103 within the body region 141. ON/OFF of the channels is controlled by the gate electrodes 114.

The SiC semiconductor device 101 includes a plurality of p$^+$-type contact regions 143 formed in surface layer portions of the first main surface 3 in the active region 10. A peak value of a p-type impurity concentration of each contact region 143 exceeds the peak value of the p-type impurity concentration of the body region 141. The peak value of the p-type impurity concentration of each contact region 143 may be not less than $1.0 \times 10^{18}$ cm$^{-3}$ and not more than $1.0 \times 10^{21}$ cm$^{-3}$.

The contact regions 143 are respectively formed in regions along the source trenches 122. Specifically, a plurality of contact regions 143 are formed in a relationship of several-to-one correspondence with respect to a corresponding single source trench 122. The contact regions 143 are respectively formed at intervals along the corresponding single source trench 122. The contact regions 143 are respectively formed at intervals from the gate trenches 112.

Each contact region 143 covers the first trench portion 125 of the corresponding source trench 122. Each contact region 143 is interposed between the side wall contact portion 130 of the source electrode 124 and the source regions 142 at the first trench portion 125 of the corresponding source trench 122. Further, each contact region 143 is interposed between the side wall contact portion 130 of the source electrode 124 and the body region 141 at the first trench portion 125 of the corresponding source trench 122.

Each contact region 143 is thereby electrically connected to the source electrode 124, the body region 141, and the source regions 142. Also, each contact region 143 is source-grounded within the SiC chip 2.

Portions of each contact region 143 that cover the first trench portion 125 is led out toward the gate trenches 112. The portions of each contact region 143 that cover the first trench portion 125 of the source trench 122 are formed in regions at the first main surface 3 side with respect to a bottom portion of the body region 141. The portions of each contact region 143 that cover the first trench portion 125 may extend to intermediate regions between the gate trenches 112 and the source trench 122.

Each contact region 143 further covers the second trench portion 126 of the corresponding source trench 122. At the second trench portion 126 of the corresponding source trench 122, each contact region 143 opposes the source electrode 124 across the source insulating layer 123.

Each contact region 143 further covers the bottom wall of the corresponding source trench 122. Each contact region 143 opposes the source electrode 124 across the bottom wall of the corresponding source trench 122. A bottom portion of each contact region 143 may be formed parallel to the bottom wall of the corresponding source trench 122.

The SiC semiconductor device 101 includes a plurality of p-type deep well regions 144 formed in surface layer portions of the first main surface 3 in the active region 10. A peak value of a p-type impurity concentration of each deep well region 144 is less than the peak value of the p-type impurity concentration of the contact regions 143.

The peak value of the p-type impurity concentration of each deep well region 144 may be not less than the peak value of the p-type impurity concentration of the body region 141 or may be less than the peak value of the p-type impurity concentration of the body region 141. The peak value of the p-type impurity concentration of each deep well region 144 may be not less than $1.0 \times 10^{17}$ cm$^{-3}$ and not more than $1.0 \times 10^{19}$ cm$^{-3}$.

The deep well regions 144 are formed in a relationship of one-to-one correspondence with respect to the source trenches 122. Each deep well region 144 is formed as a band extending along the corresponding source trench 122 in plan view.

Each deep well region 144 is formed in the high concentration region 103. Each deep well region 144 is formed in a region at the second main surface 4 side with respect to the body region 141. Each deep well region 144 is continuous to the body region 141.

Each deep well region 144 includes a portion that covers the second trench portion 126 of the corresponding source trench 122. Each deep well region 144 includes portions that cover the second trench portion 126 of the corresponding source trench 122 across the contact regions 143.

Each deep well region 144 further includes a portion covering the bottom wall of the corresponding source trench 122. Each deep well region 144 includes portions covering the bottom wall of the corresponding source trench 122 across the contact regions 143.

Each deep well region 144 has a bottom portion positioned at the second main surface 4 side with respect to the bottom walls of the gate trenches 112. The bottom portion of each deep well region 144 may be formed parallel to the bottom wall of each source trench 122. The deep well regions 144 are preferably formed to be of constant depth.

Each deep well region 144 forms a pn junction portion with the high concentration region 103. From the pn junction portions, depletion layers spread toward the gate trenches 112. The depletion layers may overlap with the bottom walls of the gate trenches 112.

With an SiC semiconductor device 101 that includes just a pn junction diode, due to the structure of not including trenches, a problem of concentration of electric field inside the SiC chip 2 does not occur frequently. The respective deep well regions 144 make the trench gate type MISFET 102 approach the structure of a pn junction diode.

The electric field within the SiC chip 2 can thereby be relaxed in the trench gate type MISFET 102. Also, with the deep well regions 144 having the bottom portions at the second main surface 4 side with respect to the bottom walls of the gate trenches 112, concentration of electric field with respect to the gate trenches 112 can be relaxed appropriately by the depletion layers. Narrowing the pitch PS between mutually adjacent ones of the source trenches 122 (deep well regions 144) is effective in terms of relaxing the concentration of electric field and improving withstand voltage.

The deep well regions 144 are preferably formed to be of constant depth. The withstand voltage (for example, electrostatic breakdown strength) of the SiC chip 2 can thereby be suppressed from being restricted by the respective deep well regions 144 and therefore, improvement of the withstand voltage can be achieved appropriately.

By using the source trenches 122, the deep well regions 144 can be formed appropriately in comparatively deep regions of the SiC chip 2. Also, the deep well regions 144 can be formed along the source trenches 122 and therefore, occurrence of variation in the depth of the deep well regions 144 can be suppressed appropriately.

Also, in this embodiment, portions of the high concentration region 103 are interposed in regions between the mutually adjacent ones of the deep well regions 144. A JFET (junction field effect transistor) resistance can thereby be reduced in the regions between the mutually adjacent ones of the deep well regions 144.

Also, in this embodiment, the bottom portions of the respective deep well regions 144 are positioned in the high concentration region 103. Current paths can thereby be formed in lateral directions parallel to the first main surface 3 in regions of the high concentration region 103 directly below the respective deep well regions 144. Consequently, current spreading resistance can be reduced. The low concentration region 104 increases the withstand voltage of the SiC chip 2 in such a structure.

In this embodiment, the interlayer insulating layer 30 covers the source regions 142 and the contact regions 143 in the active region 10. Specifically, the interlayer insulating layer 30 covers entire areas of the source regions 142 and entire areas of the contact regions 143 in sectional view along the second direction Y in the active region 10. Also, the interlayer insulating layer 30 covers entire areas of the source regions 142 and entire areas of the contact regions 143 in plan view.

Even more specifically, in the active region 10, the interlayer insulating layer 30 crosses the first trench portions 125 of the source trenches 122 and covers the source electrodes 124. On the first main surface 3, the interlayer insulating layer 30 covers the side wall contact portions 130 of the source electrodes 124.

The interlayer insulating layer 30 includes source holes 151. The source holes 151 expose the source electrodes 124 in the active region 10. The source holes 151 may be formed as bands extending along the trench source structures 121. Specifically, the source holes 151 are formed inside regions surrounded by the side walls of the source trenches 122 (first trench portions 125) in plan view.

The source holes 151 expose the source electrodes 124 at intervals toward inner sides of the source trenches 122 from the side walls of the source trenches 122 (first trench portions 125). The source holes 151 expose just the source electrodes 124. An opening edge portion of each source hole 151 is formed in a shape curved toward an interior of the source hole 151.

Recesses 152 recessed toward bottom walls of the source trenches 122 are formed in the electrode surfaces of the source electrodes 124. The recesses 152 may be formed as bands extending along the trench source structures 121. The recesses 152 are formed inside the regions surrounded by the side walls of the source trenches 122 (first trench portions 125) in plan view.

The recesses 152 are formed at intervals toward inner sides of the source trenches 122 from the side walls of the source trenches 122 (first trench portions 125). The recesses 152 expose the second low resistance layers 131. The recesses 152 may penetrate through the second low resistance layers 131. The source holes 151 are in communication with the recesses 152 of the source electrodes 124.

In this embodiment, the first main surface electrode 32 has a laminated structure including a barrier layer 153 and a main body layer 154 that are laminated in that order from the SiC chip 2 side.

The barrier layer 153 preferably includes at least one among a Ti layer and a TiN layer. The barrier layer 153 preferably has a laminated structure including a Ti layer and a TiN layer that are laminated in that order from the SiC chip 2 side. The barrier layer 153 may instead have a single layer structure constituted of a Ti layer or a TiN layer.

A thickness of the barrier layer 153 may be not less than 0.01 μm and not more than 6 μm. The thickness of the barrier layer 153 may be not less than 0.01 μm and not more than 0.1 μm, not less than 0.1 μm and not more than 2 μm, not less than 2 μm and not more than 4 μm, or not less than 4 μm and not more than 6 μm.

The main body layer 154 has a resistance value less than a resistance value of the barrier layer 153. The main body layer 154 includes at least one among a pure Al layer, an AlSi alloy layer, an AlCu alloy layer, and an AlSiCu alloy layer.

A thickness of the main body layer 154 exceeds the thickness of the barrier layer 153. The thickness of the main body layer 154 may be not less than 0.05 μm and not more than 10 μm. The thickness of the main body layer 154 may be not less than 0.05 μm and not more than 0.1 μm, not less than 0.1 μm and not more than 1 μm, not less than 1 μm and not more than 2 μm, not less than 2 μm and not more than 4 μm, not less than 4 μm and not more than 6 μm, not less than 6 μm and not more than 8 μm, or not less than 8 μm and not more than 10 μm.

The first main surface electrode 32 includes a gate main surface electrode 155 and a source main surface electrode 156. A gate voltage is applied to the gate main surface electrode 155. The gate voltage may be not less than 10 V and not more than 50 V (for example, approximately 30 V). A source voltage is applied to the source main surface electrode 156. The source voltage may be a reference voltage (for example, a GND voltage).

The gate main surface electrode 155 is formed in the active region 10. The gate main surface electrode 155 includes a gate pad 157 and a gate finger 158. The gate pad 157 is formed in a region at the first side surface 5A side in plan view.

Specifically, the gate pad 157 is formed along a region along a central portion of the first side surface 5A in plan view. The gate pad 157 may be formed in a region along a corner portion connecting any two of the side surfaces 5A to 5D in plan view. The gate pad 157 may be formed in a quadrilateral shape in plan view.

The gate finger 158 is led out from the gate pad 157 and extends as a band along the peripheral edges of the active region 10. In this embodiment, the gate finger 158 extends along the first side surface 5A, the third side surface 5C, and the fourth side surface 5D and demarcates an inner side of the active region 10 from three directions.

The gate finger 158 is electrically connected to the gate electrodes 114 via the interlayer insulating layer 30. An electrical signal from the gate pad 157 is transmitted to the gate electrodes 114 via the gate finger 158.

The source main surface electrode 156 is formed in the active region 10 at intervals from the gate main surface electrode 155. The source main surface electrode 156 is formed in a C shape in plan view such as to cover a region of C shape demarcated by the gate main surface electrode 155.

The source main surface electrode 156 is electrically connected to the source electrodes 124 via the source holes 151. That is, in this embodiment, the source main surface electrode 156 constituted of a metal material is electrically connected to the source electrodes 124 constituted of the conductive polysilicon.

In this embodiment, the insulating layer 40 selectively covers the gate main surface electrode 155 and the source main surface electrode 156. The pad opening 41 of the insulating layer 40 includes a gate pad opening 159 and a source pad opening 160. The gate pad opening 159 and the source pad opening 160 are formed by the first opening 47 of the passivation layer 45 and the second opening 48 of the resin layer 46, respectively.

The gate pad opening 159 exposes the gate pad 157 of the gate main surface electrode 155. A planar shape of the gate pad opening 159 is arbitrary. The source pad opening 160 exposes the source main surface electrode 156. A planar shape of the source pad opening 160 is arbitrary.

In this embodiment, the pad electrode 49 includes a gate pad electrode 161 and a source pad electrode 162. The gate pad electrode 161 is formed on the gate main surface electrode 155 within the gate pad opening 159. The gate pad electrode 161 is electrically connected to the gate main surface electrode 155. The gate pad electrode 161 has a gate terminal surface 163 that is externally connected to a lead wire.

The gate terminal surface 163 is positioned at the gate main surface electrode 155 side with respect to the main surface of the insulating layer 40 (resin layer 46). The gate terminal surface 163 may project higher than the main surface of the insulating layer 40 (resin layer 46). The gate terminal surface 163 may have an overlap portion covering the main surface of the insulating layer 40 (resin layer 46).

The source pad electrode 162 is formed on the source main surface electrode 156 within the source pad opening 160. The source pad electrode 162 is electrically connected to the source main surface electrode 156. The source pad electrode 162 has a source terminal surface 164 that is externally connected to a lead wire.

The source terminal surface 164 is positioned at the source main surface electrode 156 side with respect to the main surface of the insulating layer 40 (resin layer 46). The source terminal surface 164 may project higher than the main surface of the insulating layer 40 (resin layer 46). The source terminal surface 164 may have an overlap portion covering the main surface of the insulating layer 40 (resin layer 46).

Even in a case where the SiC semiconductor device 101 that includes the MISFET 102 in place of the SBD 12 is manufactured, the same effects as the SiC semiconductor device can be exhibited. Although not clearly stated in the description of the SiC semiconductor device 101, in regard to the thickness and the inclination angles θ1 and θ2 of the insulating layer 40, the width WD of the dicing streets 43, the structure of the pad electrode 49, etc., the same arrangements as in the first preferred embodiment can be applied.

The present invention can be implemented in yet other embodiments.

With each of the preferred embodiments described above, an example where the insulating layer 40 has the laminated structure including the passivation layer 45 and the resin layer 46 was described. However, the insulating layer 40 may instead have a single layer structure constituted of the passivation layer 45 or the resin layer 46.

With the first preferred embodiment described above, an example where the n-type diode regions 13 are formed was described. However, p-type diode regions 13 may be adopted in place of the n-type diode regions 13. In this case, a pn junction diode can be provided in place of the SBD 12.

With the second preferred embodiment described above, an example where the first low resistance layers 119 and the second low resistance layers 131 are formed was described. However, a structure where one of either or both of the first low resistance layers 119 and the second low resistance layers 131 is or are not formed may be adopted instead.

With the second preferred embodiment described above, an example where the gate electrodes 114 that contain a p-type polysilicon doped with a p-type impurity are formed was described. However, if increase in the gate threshold voltage Vth is not emphasized, the gate electrodes 114 may contain an n-type polysilicon doped with an n-type impurity in place of the p-type polysilicon.

In this case, the first low resistance layer 119 may be formed by siliciding, by a metal material, portions of the gate electrodes 114 (n-type polysilicon) that form surface layer portions. That is, the first low resistance layer 119 may contain an n-type polycide. In case of such a structure, gate resistance can be reduced. Obviously, the first low resistance layer 119 does not have to be formed.

With the second preferred embodiment described above, an example where the source electrodes 124 that contain a p-type polysilicon doped with a p-type impurity are formed was described. However, an n-type polysilicon doped with an n-type impurity may be contained in place of the p-type polysilicon.

In this case, the second low resistance layers 131 may be formed by siliciding, by a metal material, portions of the source electrodes 124 (n-type polysilicon) that form surface layer portions. That is, the second low resistance layers 131 may contain an n-type polycide. Obviously, the second low resistance layers 131 do not have to be formed.

With the second preferred embodiment described above, an example where the MISFET 102 is formed was described. However, a p$^+$-type collector region may be adopted in place of the n$^+$-type drain region. With this structure, an IGBT (insulated gate bipolar transistor) can be provided in place of the MISFET 102. In this case, in each of the preferred embodiments described above, the "source" of the MISFET 102 is replaced by an "emitter" of the IGBT and the "drain" of the MISFET 102 is replaced by a "collector" of the IGBT.

In each of the preferred embodiments described above, a structure with which the conductivity types of the respective semiconductor portions are inverted may be adopted. That is, a p-type portion may be made to be of an n-type and an n-type portion may be made to be of a p-type.

With each of the preferred embodiments described above, an example where the first direction X is the m-axis direction of the SiC monocrystal and the second direction Y is the a-axis direction of the SiC monocrystal was described. However, an embodiment where the first direction X is the a-axis direction of the SiC monocrystal and the second direction Y is the m-axis direction of the SiC monocrystal may be adopted instead.

With each of the preferred embodiments described above, the width WD of the dicing streets 43 was set to not less than 5% and not more than 25% of the thickness TC of the SiC chip 2 to suppress the interference of laser light by the insulating layer 40 (resin layer 46). That is, the width WD2 of the dicing streets 91 was set to not less than 10% and not more than 50% of the final thickness TW of the SiC wafer 62.

However, the width WD of the dicing streets 43 (width WD2 of the dicing streets 91) may be set such that the laser light is irradiated to the SiC wafer 62 (SiC chip 2) via the insulating layer 40.

In this case, the width WD of the dicing streets 43 (width WD2 of the dicing streets 91) can be reduced further. For example, the maximum meandering width (absolute value) of the cleaved portions of the SiC wafer 62 is not more than 10 μm (specifically, not more than 5 μm) and therefore, the width WD2 of the dicing streets 91 can be set to not less than 5 μm and not more than 20 μm. That is, the width WD of the dicing streets 43 can be set to not less than 2.5 μm and not more than 10 μm.

The chip regions 71 occupying the SiC wafer 62 can thereby be increased and therefore, the number of obtained SiC semiconductor devices 1 that can be obtained from a single SiC wafer 62 can be increased.

However, in this case, a distance between the first main surface electrodes 32 that are mutually adjacent among mutually adjacent ones of the chip regions 71 must be set to not less than 40% of the thickness TC of the SiC chip 2 (final thickness TW of the SiC wafer 62). That is, distances from the peripheral edges of the first main surface electrodes 32 to the side surfaces 5A to 5D must be set to not less than 20% of the thickness TC of the SiC chip 2 (final thickness TW of the SiC wafer 62).

A field plate (field electrode), an equipotential electrode, or other voltage withstanding structure as an example of a metal layer differing from the first main surface electrode 32 may be formed at a portion further to an outer side than the first main surface electrode 32. In this case, a step of forming the metal layer of the field plate, the equipotential electrode, etc., in a region at an outer side of the first main surface electrode 32 in each chip region 71 should be performed during the step of forming the first main surface electrode 32 or before or after the step of forming the first main surface electrode 32.

In this case, a distance between the metal layers that are mutually adjacent among mutually adjacent ones of the chip regions 71 must be set to not less than 40% of the thickness TC of the SiC chip 2 (final thickness TW of the SiC wafer 62). That is, distances from the peripheral edges of the metal layers to the side surfaces 5A to 5D must be set to not less than 20% of the thickness TC of the SiC chip 2 (final thickness TW of the SiC wafer 62).

In this case, the insulating layer 40 preferably has a flat main surface. If a field plate, an equipotential electrode, or other voltage withstanding structure is formed at a portion further to an outer side than the first main surface electrode 32, an uneven structure that reflects the interlayer insulating layer 30, the field plate, etc., is formed on the main surface of the insulating layer 40 and it is therefore likely to be difficult to focus the laser light on a desired position with good precision. Such a problem can thus be suppressed by flattening the main surface of the insulating layer 40.

Examples of features that are extracted from this description and the drawings are indicated below.

[A1] A method for manufacturing an SiC semiconductor device that includes an SiC semiconductor layer, a main surface electrode formed on the SiC semiconductor layer, and an insulating layer partially covering the main surface electrode on the SiC semiconductor layer, the method for manufacturing the SiC semiconductor device including a step of preparing an SiC wafer having a main surface, a step of demarcating, on the main surface of the SiC wafer, a plurality of chip regions including a main chip region and a dummy chip region, a step of forming the main surface electrode in each chip region, a step of forming the insulating layer that partially covers the respective main surface electrodes and exposes outer peripheries of the respective chip regions as a dicing line, a step of irradiating laser light along the dicing line and forming a modified region oriented along the dicing line in an interior of the SiC wafer, and a step of applying an external force to the SiC wafer and cleaving the SiC wafer with the modified region as a starting point, and the main surface electrodes being formed in regions avoiding the dicing line.

According to this method for manufacturing the SiC semiconductor device, interference of laser light by the main surface electrodes can be suppressed. The modified region can thereby be formed appropriately in a desired region in the SiC wafer. Consequently, the SiC wafer can be cleaved appropriately.

[A2] The method for manufacturing the SiC semiconductor device according to A1, further including a test step of evaluating, in the dummy chip region, a suitability of the respective steps performed in the respective chip regions.

[A3] The method for manufacturing the SiC semiconductor device according to A1 or A2, where, in the step of forming the insulating layer, the dicing street in which a metal pattern is not present is exposed.

[A4] The method for manufacturing the SiC semiconductor device according to any one of A1 to A3, where the step of demarcating the chip regions includes a step of demarcating the chip regions of quadrilateral shape each having an alignment pattern at four corners in plan view.

[A5] The method for manufacturing the SiC semiconductor device according to A4, where the alignment patter is arranged to avoid a position of the dicing line to which laser light is irradiated.

[A6] The method for manufacturing the SiC semiconductor device according to A4 or A5, where the alignment pattern is formed by removing the main surface of the SiC wafer by an etching method.

[B1] A method for manufacturing an SiC semiconductor device that includes an SiC semiconductor layer, a main surface electrode formed on the SiC semiconductor layer, and an insulating layer partially covering the main surface electrode on the SiC semiconductor layer, the method for manufacturing the SiC semiconductor device including a step of preparing an SiC wafer having a main surface, a step of demarcating, on the main surface of the SiC wafer, a plurality of chip regions including a main chip region and a dummy chip region, a step of forming the main surface electrode in each chip region, a step of forming the insulating layer that partially covers the respective main surface electrodes and exposes outer peripheries of the respective chip regions as a dicing line, a step of irradiating laser light along the dicing line and forming a modified region oriented along the dicing line in an interior of the SiC wafer, and a step of applying an external force to the SiC wafer and cleaving the SiC wafer with the modified region as a starting point, and the step of forming the insulating layer including a step of forming the insulating layer such that a peripheral edge of the insulating layer becomes an inclined surface.

According to this method for manufacturing the SiC semiconductor device, interference of laser light by the main surface electrodes can be suppressed. The modified region can thereby be formed appropriately in a desired region in the SiC wafer. Consequently, the SiC wafer can be cleaved appropriately.

[B2] The method for manufacturing the SiC semiconductor device according to B1, where an inclination angle of the inclined surface of the insulating layer with respect to the main surface of the SiC wafer is not less than 30° and not more than 60°.

[B3] The method for manufacturing the SiC semiconductor device according to B1 or B2, where an inclination angle of the inclined surface of the insulating layer with respect to the main surface of the SiC wafer is not less than 40° and not more than 50°.

[B4] The method for manufacturing the SiC semiconductor device according to any one of B1 to B3, where the inclined surface of the insulating surface is formed in a curved shape recessed toward the main surface of the SiC wafer.

[B5] The method for manufacturing the SiC semiconductor device according to any one of B1 to B4 where the dicing line having a width of not less than 20% of a thickness of the SiC wafer is formed.

[B6] The method for manufacturing the SiC semiconductor device according to any one of B1 to B5, further including a step of forming a pad electrode overlapping with the inclined surface of the insulating layer on the main surface electrode.

[B7] The method for manufacturing the SiC semiconductor device according to any one of B1 to B6, where the SiC wafer having a thickness of not more than 200 μm is prepared. The thickness of the SiC wafer means a thickness in the step of cleaving the SiC wafer.

[C1] In a method for manufacturing an SiC semiconductor device that includes an SiC semiconductor layer, a main surface electrode formed on the SiC semiconductor layer, and an insulating layer partially covering the main surface electrode on the SiC semiconductor layer, the method for manufacturing the SiC semiconductor device including a step of preparing an SiC wafer having a main surface, a step of demarcating, on the main surface of the SiC wafer, a plurality of chip regions including a main chip region and a dummy chip region, a step of forming the main surface electrode in each chip region, a step of forming the insulating layer that partially covers the respective main surface electrodes and exposes outer peripheries of the respective chip regions as a dicing line, a step of irradiating laser light along the dicing line and forming a modified region oriented along the dicing line in an interior of the SiC wafer, and a step of applying an external force to the SiC wafer and cleaving the SiC wafer with the modified region as a starting point, and the step of forming the modified region including a step of irradiating laser light to an interior of the SiC wafer via the insulating layer.

[C2] The method for manufacturing the SiC semiconductor device according to C1, where the dicing line having a width of not less than 5 μm and not more than 20 μm is formed.

[C3] The method for manufacturing the SiC semiconductor device according to C1 or C2, where a distance between the main surface electrodes that are adjacent among the chip regions that are mutually adjacent is not less than 40% of a thickness of the SiC wafer.

[C4] The method for manufacturing the SiC semiconductor device according to any one of C1 to C3, further including a step of forming a metal layer at an outer side of the main surface electrode in each of the chip regions and where a distance between a plurality of the metal layers that are adjacent among the chip regions that are mutually adjacent is not less than 40% of a thickness of the SiC wafer.

[C5] The method for manufacturing the SiC semiconductor device according to any one of C1 to C4, where the SiC wafer having a thickness of not more than 200 μm is prepared. The thickness of the SiC wafer means a thickness in the step of cleaving the SiC wafer.

[D1] A method for manufacturing an SiC semiconductor device including a step of preparing an SiC wafer having a main surface and constituted of an SiC monocrystal, a step of setting, on the main surface, a scheduled cutting line that demarcates a plurality of chip regions including a first chip region in which a functional device is formed and a second chip region in which a monitor pattern for performing process control of the first chip region is formed, a step of forming, on the main surface, a plurality of main surface electrodes respectively covering the chip regions such as to expose the scheduled cutting line and respectively forming a portion of the functional device and a portion of the monitor pattern, a step of irradiating laser light to the scheduled cutting line exposed from the main surface electrodes and forming a modified region that is modified to be of a property differing from the SiC monocrystal, and a step of cleaving the SiC wafer with the modified region as a starting point.

[D2] The method for manufacturing the SiC semiconductor device according to D1, further including a step of forming, on the main surface, a plurality of insulating layers partially covering the main surface electrodes and demarcating a dicing street that exposes the scheduled cutting line in a region between the chip regions that are mutually adjacent, prior to the step of forming the modified region, and where the laser light is irradiated to the scheduled cutting line exposed from the dicing street.

[D3] The method for manufacturing the SiC semiconductor device according to D2, where the insulating layers each having an inclined surface that demarcates the dicing street is formed.

[D4] The method for manufacturing the SiC semiconductor device according to D3, where the insulating layers each have the inclined surface that is recessed in curved shape.

[D5] The method for manufacturing the SiC semiconductor device according to any one of D2 to D4, where the dicing street has a width of not less than 10% and not more than 50% of a thickness of the SiC wafer.

[D6] The method for manufacturing the SiC semiconductor device according to any one of D2 to D5, where the insulating layers include a resin layer.

[D7] The method for manufacturing the SiC semiconductor device according to any one of D1 to D6, where the step of setting the scheduled cutting line includes a step of forming, in the main surface, a plurality of alignment patterns that define the scheduled cutting line.

[D8] The method for manufacturing the SiC semiconductor device according to D7, where the scheduled cutting line is defined in a region between the alignment patterns that are neighboring at intervals from the alignment patterns.

[D9] The method for manufacturing the SiC semiconductor device according to D7 or D8, where the chip regions each having a peripheral edge portion at which the alignment patterns are set, and the SiC wafer is cleaved such that the alignment patterns remain in the chip regions.

[D10] The method for manufacturing the SiC semiconductor device according to any one of D7 to D9, where the step of forming the alignment patterns includes a step of forming a trench in the main surface.

[D11] The method for manufacturing the SiC semiconductor device according to any one of D1 to D10, further including a step of forming an interlayer insulating layer on the main surface after the step of setting the scheduled cutting line and prior to the step of forming the main surface electrode and where the main surface electrode is formed on the interlayer insulating layer.

[D12] The method for manufacturing the SiC semiconductor device according to D11, where the interlayer insulating layer that covers the scheduled cutting line is formed, the laser light is irradiated to the SiC wafer via the interlayer insulating layer, and the SiC wafer is cleaved together with the interlayer insulating layer.

[D13] The method for manufacturing the SiC semiconductor device according to any one of D1 to D12, where the scheduled cutting line of lattice shape that demarcates the chip regions in a matrix is set.

[D14] The method for manufacturing the SiC semiconductor device according to any one of D1 to D13, where the scheduled cutting line of lattice shape that extends in an a-axis direction and an m-axis direction of the SiC monocrystal and demarcates the chip regions in a matrix aligned in the a-axis direction and the m-axis direction of the SiC monocrystal is set and the SiC wafer is cleaved in the a-axis direction and the m-axis direction of the SiC monocrystal.

[D15] The method for manufacturing the SiC semiconductor device according to D14, where a plurality of the second chip regions opposing each other in the a-axis direction of the SiC monocrystal across one or a plurality of the first chip regions are included.

[D16] The method for manufacturing the SiC semiconductor device according to D14 or D15, where a plurality of the second chip regions opposing each other in the m-axis direction of the SiC monocrystal across one or a plurality of the first chip regions are included.

[D17] The method for manufacturing the SiC semiconductor device according to any one of D1 to D16, where the number of the first chip regions is not less than 100 regions and not more than 10000 regions and the number of the second chip regions is not less than 1 region and not more than 20 regions.

[D18] The method for manufacturing the SiC semiconductor device according to any one of D1 to D17, where the first chip regions do not have a monitor pattern.

[D19] The method for manufacturing the SiC semiconductor device according to any one of D1 to D18, where the SiC wafer that includes an SiC substrate and an SiC epitaxial layer and has the main surface constituted of the SiC epitaxial layer is prepared.

[D20] An SiC semiconductor device including an SiC chip having a first main surface and a second main surface respectively formed in quadrilateral shapes in plan view and four side surfaces respectively connecting the first main surface and the second main surface and respectively constituted of cleavage surfaces, a modified region formed in the respective side surfaces and modified to be of a property differing from an SiC monocrystal, an alignment pattern as an accessory pattern formed in a peripheral edge portion of the first main surface at intervals inward from the respective side surfaces in plan view, a main surface electrode formed on the first main surface at intervals inward from the respective side surfaces and exposing the alignment pattern in plan view, and an insulating layer formed on the first main surface at intervals inward from the respective side surfaces, partially covering the main surface electrode, and demarcating a dicing street that, with the side surfaces, exposes the alignment pattern in plan view, and where an accessory pattern other than the alignment pattern is not formed in the peripheral edge portion of the first main surface positioned within the dicing street in plan view.

[D21] The SiC semiconductor device according to D20, where the alignment pattern is formed in a corner portion of the first main surface in plan view.

[D22] The SiC semiconductor device according to D20 or D21, where the alignment pattern includes a trench formed in the first main surface.

[D23] The SiC semiconductor device according to D22, where the alignment pattern includes an insulator embedded in the trench.

[D24] The SiC semiconductor device according to any one of D20 to D23, further including an interlayer insulating layer formed on the first main surface and covering the alignment pattern, and where the main surface electrode is formed on the interlayer insulating layer, and the insulating layer is formed on the interlayer insulating layer.

The present application corresponds to Japanese Patent Application No. 2019-112287 filed on Jun. 17, 2019 in the Japan Patent Office, and the entire disclosure of this applications is incorporated herein by reference. While preferred embodiments of the present invention have been described in detail, these are merely specific examples used to clarify the technical contents of the present invention and the present invention should not be interpreted as being limited to these specific examples and the scope of the present invention is to be limited only by the appended claims.

REFERENCE SIGNS LIST

1 SiC semiconductor device
2 SiC chip
3 first main surface
4 second main surface
5A side surface
5B side surface
5C side surface
5D side surface
7 SiC epitaxial layer
8A modified region
8B modified region
8C modified region
8D modified region
20 alignment pattern
26 alignment trench
27 insulator
30 interlayer insulating layer
32 first main surface electrode
41 insulating layer
44 inclined surface
46 resin layer
62 SiC wafer
63 first wafer main surface
71 chip region
71A first chip region
71B second chip region
72 scheduled cutting line
76 monitor pattern
90 dicing street
93 modified region
101 SiC semiconductor device

The invention claimed is:

1. A method for manufacturing an SiC semiconductor device comprising:
a step of preparing an SiC wafer having a main surface and constituted of an SiC monocrystal;
a step of setting, on the main surface, a scheduled cutting line that demarcates chip regions including a first chip region in which a functional device is to be formed and a second chip region as a dummy chip region in which a monitor pattern for performing process control of the first chip region is to be formed;
a step of forming, on the main surface, main surface electrodes respectively covering the chip regions such as to expose the scheduled cutting line and respectively forming a portion of the functional device and a portion of the monitor pattern;
a step of irradiating laser light to the scheduled cutting line exposed from the main surface electrodes and forming a modified region that is modified to be of a property differing from the SiC monocrystal; and
a step of cutting out the SiC semiconductor device from the first chip region and a dummy SiC semiconductor device from the second chip region by cleaving the SiC wafer with the modified region as a starting point;
wherein the step of setting the scheduled cutting line includes a step of forming, on the main surface in the first and second chip regions, alignment patterns each formed of a material other than a metal material and indicating the scheduled cutting line.

2. The method for manufacturing the SiC semiconductor device according to claim 1, further comprising:
a step of forming, on the main surface, insulating layers partially covering the main surface electrodes respectively and demarcating a dicing street that exposes the scheduled cutting line in a region between the chip regions that are mutually adjacent, prior to the step of forming the modified region; and
wherein the laser light is irradiated to the scheduled cutting line exposed from the dicing street.

3. The method for manufacturing the SiC semiconductor device according to claim 2, wherein the insulating layers each having an inclined surface that demarcates the dicing street are formed.

4. The method for manufacturing the SiC semiconductor device according to claim 3, wherein the insulating layers each have the inclined surface that is recessed in curved shape.

5. The method for manufacturing the SiC semiconductor device according to claim 2, wherein the dicing street has a width of not less than 10% and not more than 50% of a thickness of the SiC wafer.

6. The method for manufacturing the SiC semiconductor device according to claim 2, wherein the insulating layers each include a resin layer.

7. The method for manufacturing the SiC semiconductor device according to claim 2, wherein the dicing street exposes entire regions of the alignment patterns in plan view.

8. The method for manufacturing the SiC semiconductor device according to claim 1, further comprising:
a step of forming an interlayer insulating layer on the main surface after the step of setting the scheduled cutting line and prior to the step of forming the main surface electrode; and
wherein the main surface electrode is formed on the interlayer insulating layer.

9. The method for manufacturing the SiC semiconductor device according to claim 8, wherein
the interlayer insulating layer that covers the scheduled cutting line is formed,
the laser light is irradiated to the SiC wafer via the interlayer insulating layer, and
the SiC wafer is cleaved together with the interlayer insulating layer.

10. The method for manufacturing the SiC semiconductor device according to claim 1, wherein
the scheduled cutting line of lattice shape that extends in an a-axis direction and an m-axis direction of the SiC monocrystal and demarcates the chip regions in a matrix aligned in the a-axis direction and the m-axis direction of the SiC monocrystal is set, and
the SiC wafer is cleaved in the a-axis direction and the m-axis direction of the SiC monocrystal.

11. The method for manufacturing the SiC semiconductor device according to claim 10, wherein the second chip regions opposing each other in the a-axis direction of the SiC monocrystal across one or the first chip regions are included.

12. The method for manufacturing the SiC semiconductor device according to claim 10, wherein the second chip regions opposing each other in the m-axis direction of the SiC monocrystal across one or the first chip regions are included.

13. The method for manufacturing the SiC semiconductor device according to claim 1, wherein the chip regions each have a peripheral edge portion, the alignment patterns are arranged in the peripheral edge portions of the chip regions, and the SiC wafer is cleaved such that the alignment patterns remain in the chip regions.

14. The method for manufacturing the SiC semiconductor device according to claim 1, wherein the scheduled cutting line of lattice shape that demarcates the chip regions in a matrix is set.

15. The method for manufacturing the SiC semiconductor device according to claim 1, wherein the number of the first chip regions is not less than 100 regions and not more than 10000 regions, and the number of the second chip regions is not less than 1 region and not more than 20 regions.

16. The method for manufacturing the SiC semiconductor device according to claim 1, wherein the first chip regions do not have a monitor pattern.

17. The method for manufacturing the SiC semiconductor device according to claim 1, wherein the SiC wafer that includes an SiC substrate and an SiC epitaxial layer and has the main surface constituted of the SiC epitaxial layer is prepared.

18. An SiC semiconductor device comprising:

an SiC chip having a first main surface and a side surface constituted of a cleavage surface;

a modified region formed in the side surface and modified to be of a property differing from an SiC monocrystal;

an alignment pattern as an accessory pattern formed in a peripheral edge portion of the main surface at an interval from the side surface;

a main surface electrode formed on the first main surface at an interval from the alignment pattern; and an insulating layer formed on the first main surface at an interval from the side surface so as to cover the main surface electrode and expose an entire region of the alignment pattern in plan view;

wherein the alignment pattern is formed of a material other than a metal material.

19. The SiC semiconductor device according to claim 18, wherein the alignment pattern includes a trench formed in the first main surface.

20. The SiC semiconductor device according to claim 19, wherein the alignment pattern includes an insulator embedded in the trench.

21. The SiC semiconductor device according to claim 18, further comprising:

an interlayer insulating layer formed on the first main surface and covering the alignment pattern;

wherein the main surface electrode is formed on the interlayer insulating layer, and the insulating layer is formed on the interlayer insulating layer.

22. The method for manufacturing the SiC semiconductor device according to claim 1, wherein the SiC semiconductor device does not have any accessory patterns other than the alignment pattern, and the dummy SiC semiconductor device does not have any accessory patterns other than the alignment pattern.

23. The SiC semiconductor device according to claim 18, wherein the SiC semiconductor device does not have any accessory patterns other than the alignment pattern.

24. The SiC semiconductor device according to claim 18, wherein the insulating layer has a peripheral portion that demarcates a dicing street with the side surface of the SiC chip, and the dicing street exposes the entire region of the alignment pattern in plan view.

* * * * *